United States Patent
Shinozaki et al.

(10) Patent No.: US 10,537,975 B2
(45) Date of Patent: Jan. 21, 2020

(54) SUBSTRATE ADSORPTION METHOD, SUBSTRATE HOLDING APPARATUS, SUBSTRATE POLISHING APPARATUS, ELASTIC FILM, SUBSTRATE ADSORPTION DETERMINATION METHOD FOR SUBSTRATE HOLDING APPARATUS, AND PRESSURE CONTROL METHOD FOR SUBSTRATE HOLDING APPARATUS

(71) Applicant: Ebara Corporation, Tokyo (JP)

(72) Inventors: Hiroyuki Shinozaki, Tokyo (JP);
Makoto Fukushima, Tokyo (JP);
Osamu Nabeya, Tokyo (JP)

(73) Assignee: Ebara Corporation, Tokyo (JP)

( * ) Notice: Subject to any disclaimer, the term of this patent is extended or adjusted under 35 U.S.C. 154(b) by 474 days.

(21) Appl. No.: 15/234,058

(22) Filed: Aug. 11, 2016

(65) Prior Publication Data
US 2017/0050289 A1    Feb. 23, 2017

(30) Foreign Application Priority Data

| Aug. 18, 2015 | (JP) | 2015-161187 |
| May 13, 2016 | (JP) | 2016-097291 |
| Jul. 7, 2016 | (JP) | 2016-134881 |

(51) Int. Cl.
*B24B 49/10* (2006.01)
*B24B 37/30* (2012.01)
(Continued)

(52) U.S. Cl.
CPC ............ *B24B 37/30* (2013.01); *B24B 37/11* (2013.01); *H01L 21/67253* (2013.01);
(Continued)

(58) Field of Classification Search
CPC .......... B24B 49/10; B24B 37/30; B24B 37/11
(Continued)

(56) References Cited

U.S. PATENT DOCUMENTS

| 5,423,716 A | 6/1995 | Strasbaugh |
| 5,957,751 A * | 9/1999 | Govzman .............. B24B 37/30 |
| | | 451/289 |

(Continued)

FOREIGN PATENT DOCUMENTS

| CN | 101616777 A | 12/2009 |
| JP | H10-230450 A | 9/1998 |

(Continued)

OTHER PUBLICATIONS

Japan Patent Office, Notification of Reasons for Refusal in Japanese Patent Application No. 2016-134881 (dated Apr. 26, 2018).
(Continued)

*Primary Examiner* — Robert A Rose
(74) *Attorney, Agent, or Firm* — Leydig, Voit & Mayer, Ltd.

(57) ABSTRACT

A method includes: vacuuming at least one area among a plurality of areas formed concentrically between a top face of the elastic film and the top ring body under a state where a bottom face of the substrate is supported by a support member and a top face of the substrate contacts a bottom face of the elastic film; measuring a flow volume of gas in an area located outside one or more areas to be vacuumed; determining whether the substrate is adsorbed to the top ring based on the flow volume of the gas; and after it is determined that the substrate is adsorbed to the top ring, separating the elastic film to which the substrate is adsorbed from the support member.

22 Claims, 48 Drawing Sheets

(51) Int. Cl.
  *B24B 37/11* (2012.01)
  *H01L 21/683* (2006.01)
  *H01L 21/67* (2006.01)
  *H01L 21/306* (2006.01)

(52) U.S. Cl.
  CPC ...... *H01L 21/6836* (2013.01); *H01L 21/6838* (2013.01); *H01L 21/30625* (2013.01); *H01L 2221/68327* (2013.01)

(58) Field of Classification Search
  USPC .............................. 451/5, 288, 41, 388, 398
  See application file for complete search history.

(56) References Cited

U.S. PATENT DOCUMENTS

| | | | |
|---|---|---|---|
| 5,961,169 | A | 10/1999 | Kalenian et al. |
| 6,110,026 | A | 8/2000 | Arai |
| 6,328,629 | B1 | 12/2001 | Togawa et al. |
| 6,398,621 | B1* | 6/2002 | Zuniga ................ B24B 37/0053 451/288 |
| 6,663,466 | B2* | 12/2003 | Chen ........................ B24B 37/30 257/E21.23 |
| 2001/0034198 | A1 | 10/2001 | Kimura |
| 2002/0098777 | A1 | 7/2002 | Laursen et al. |
| 2002/0132559 | A1 | 9/2002 | Togawa |
| 2003/0045205 | A1 | 3/2003 | Herb et al. |
| 2005/0054266 | A1 | 3/2005 | Togawa |
| 2005/0107015 | A1 | 5/2005 | Togawa et al. |
| 2006/0052037 | A1 | 3/2006 | Izumi et al. |
| 2007/0111637 | A1 | 5/2007 | Togawa et al. |
| 2011/0159783 | A1 | 6/2011 | Fukushima et al. |
| 2014/0004779 | A1 | 1/2014 | Namiki et al. |
| 2014/0065934 | A1 | 3/2014 | Fukushima et al. |
| 2017/0050289 | A1 | 2/2017 | Shinozaki et al. |

FOREIGN PATENT DOCUMENTS

| | | | |
|---|---|---|---|
| JP | 2000-015572 | A | 1/2000 |
| JP | 2000-033558 | A | 2/2000 |
| JP | 2000-317818 | A | 11/2000 |
| JP | 2001-310257 | A | 11/2001 |
| JP | 2002521830 | A | 7/2002 |
| JP | 2002-280337 | A | 9/2002 |
| JP | 2003-133791 | A | 5/2003 |
| JP | 2003-175455 | A | 6/2003 |
| JP | 2004516644 | A | 6/2004 |
| JP | 2004-349340 | A | 12/2004 |
| JP | 2005-081507 | A | 3/2005 |
| JP | 3705670 | B2 | 8/2005 |
| JP | 2006-130625 | A | 5/2006 |
| JP | 2008-137103 | A | 6/2008 |
| JP | 2009-117655 | A | 5/2009 |
| JP | 2010-046756 | A | 3/2010 |
| JP | 4505822 | B2 | 7/2010 |
| JP | 2011258639 | A | 12/2011 |
| JP | 2013-157541 | A | 8/2013 |
| JP | 2014008570 | A | 1/2014 |
| JP | 2014017428 | A | 1/2014 |
| JP | 2014-041903 | A | 3/2014 |
| JP | 2014061587 | A | 4/2014 |
| JP | 2015-082586 | A | 4/2015 |
| JP | 2015-104790 | A | 6/2015 |
| JP | 6353418 | B2 | 7/2018 |
| JP | 64633303 | B2 | 1/2019 |
| WO | WO 2002007931 | A2 | 1/2002 |

OTHER PUBLICATIONS

Japan Patent Office, Notification of Reasons for Refusal in Japanese Patent Application No. 2015-161187 (dated May 1, 2018).
Japan Patent Office, Notification of Reasons for Refusal in Japanese Patent Application No. 2016-134881 (dated Sep. 11, 2018).
The State Intellectual Property Office of People'S Republic of China, First Office Action in Chinese Application No. 201610688808.2 (dated Sep. 20, 2019).
Japan Patent Office, Decision to Grant a Patent in Japanese Application No. 2018-246532 (dated Nov. 12, 2019).

* cited by examiner

| | V1 | V3 | V10 |
|---|---|---|---|
| WHEN OPENING MEMBRANE TO ATMOSPHERE | OPEN (OPEN TO ATMOSPHERE) | OPEN (OPEN TO ATMOSPHERE) | OPEN (OPEN TO ATMOSPHERE) |
| WHEN POLISHING SUBSTRATE (PRESSURIZATION) | OPEN (PRESSURIZATION) | OPEN (PRESSURIZATION) | CLOSED |
| WHEN ADSORBING SUBSTRATE | OPEN (PRESSURIZATION FOR DETERMINING ADSORPTION) | OPEN (DEPRESSURIZATION) | OPEN (OPEN TO ATMOSPHERE) |

SUBSTRATE ADSORPTION METHOD, SUBSTRATE HOLDING APPARATUS, SUBSTRATE POLISHING APPARATUS, ELASTIC FILM, SUBSTRATE ADSORPTION DETERMINATION METHOD FOR SUBSTRATE HOLDING APPARATUS, AND PRESSURE CONTROL METHOD FOR SUBSTRATE HOLDING APPARATUS

CROSS-REFERENCE TO RELATED APPLICATIONS

This application claims the benefit of Japanese Priority Patent Applications JP 2015-161187 filed on Aug. 18, 2015, JP 2016-097291 filed on May 13, 2016, and JP 2016-134881 filed on Jul. 7, 2016, the entire contents of which are incorporated herein by reference.

FIELD

The present disclosure relates to a substrate adsorption method, a substrate holding apparatus, a substrate polishing apparatus, an elastic film, a substrate adsorption determination method for a substrate holding apparatus, and a pressure control method for a substrate holding apparatus.

BACKGROUND AND SUMMARY

A substrate polishing apparatus that polishes a substrate such as a semiconductor wafer polishes a substrate held by a top ring by pressing the substrate to a polishing table. To transfer the substrate from a transport mechanism to the top ring, the substrate supported by the transport mechanism is firstly caused to come into contact with a membrane that is provided on a lower surface of the top ring and concentrically divided into a plurality of areas. Then, the substrate is vacuum drawn from a hole formed in the membrane, so that the substrate is adsorbed to the membrane.

It is desired to provide a substrate adsorption method, a substrate holding apparatus, a substrate polishing apparatus, an elastic film, a substrate adsorption determination method for a substrate holding apparatus, and a pressure control method for a substrate holding apparatus, for appropriately handling a substrate.

According to one embodiment, a method to adsorb a substrate to a top ring comprising a top ring body and an elastic film under the top ring body, the method comprises: vacuuming at least one area among a plurality of areas formed concentrically between a top face of the elastic film and the top ring body under a state where a bottom face of the substrate is supported by a support member and atop face of the substrate contacts a bottom face of the elastic film; measuring a flow volume of gas in an area located outside one or more areas to be vacuumed; determining whether the substrate is adsorbed to the top ring based on the flow volume of the gas; and after it is determined that the substrate is adsorbed to the top ring, separating the elastic film to which the substrate is adsorbed from the support member.

According to another embodiment, a substrate holding apparatus comprises: a top ring body; an elastic film under the top ring body, a plurality of areas being concentrically formed between a top face of the elastic film and the top ring body; a pressure controller configured to vacuum at least one area among the plurality of areas under a state where a top face of a substrate whose bottom face is supported by a support member contacts a bottom face of the elastic film; a flow meter configured to measure a flow volume of gas in an area located outside one or more areas to be vacuumed; and a determiner configured to determine whether the substrate is adsorbed to the top ring based on the flow volume of the gas.

According to another embodiment, a substrate holding apparatus comprising: a top ring body; an elastic film comprising a first face and a second face opposite the first face, a plurality of areas being formed between the first face and the top ring body, the second face being capable of holding a substrate; a first line communicating with a first area among the plurality of areas and capable of pressuring the first area; a second line communicating with the first area and capable of exhausting the first area; a measurement instrument whose measurement value varies based on a flow volume of the first area; a third line communicating with a second area among the plurality of areas and different from the first area, the third line being capable of pressuring or depressurizing the second area.

According to another embodiment, a substrate adsorption determination method for a substrate holding apparatus, the method comprising: depressurizing a second area formed between a top ring body and a first face of an elastic film in the substrate holding apparatus, pressuring a first area formed between the top ring body and the first face of the elastic film different from the second area and making a fluid through a second line communicating with the first area; and determining whether the substrate is adsorbed to a second face of the elastic film opposite the first face based on a measurement value varying according to a flow volume of the first area.

According to another embodiment, a pressure control method for a substrate holding apparatus, the method comprising: pressurizing a first area formed between a top ring body and a first face of an elastic film in the substrate holding apparatus, and making a fluid through a second line communicating with the first area; and controlling a second area formed between the top ring body and the first face of the elastic film different from the first area based on a measurement value varying according to a flow volume of the first area.

According to another embodiment, an elastic film used with a top ring body provided with a first hole at an outside of a first portion and a second hole at an inside of the first portion to configure a substrate holding apparatus, the elastic film comprising: a first face provided with a second portion capable of being engaged with the first portion, a plurality of areas being formed between the first face and the top ring body; and a second face opposite the first face, the second face being capable of holding a substrate.

According to another embodiment, a substrate holding apparatus comprising: a top ring body provided with a first hole at an outside of a first portion and a second hole at an inside of the first portion; an elastic film comprising: a first face provided with a second portion capable of being engaged with the first portion, a plurality of areas being formed between the first face and the top ring body; and a second face opposite the first face, the second face being capable of holding a substrate; a first line being capable of pressuring a first area through the first hole positioned at the first area among the plurality of areas; a second line capable of depressurizing the first are through the second hole positioned at the first area; a measurement instrument whose measurement value varies based on a flow volume of the first area; and a third line communicating with a second area among the plurality of areas and different from the first area, the third line being capable of pressuring or depressurizing the second area.

BRIEF DESCRIPTION OF DRAWINGS

FIG. 17 is a diagram for explaining an operation of each valve in the top ring 1;

DESCRIPTION

Figure 1:
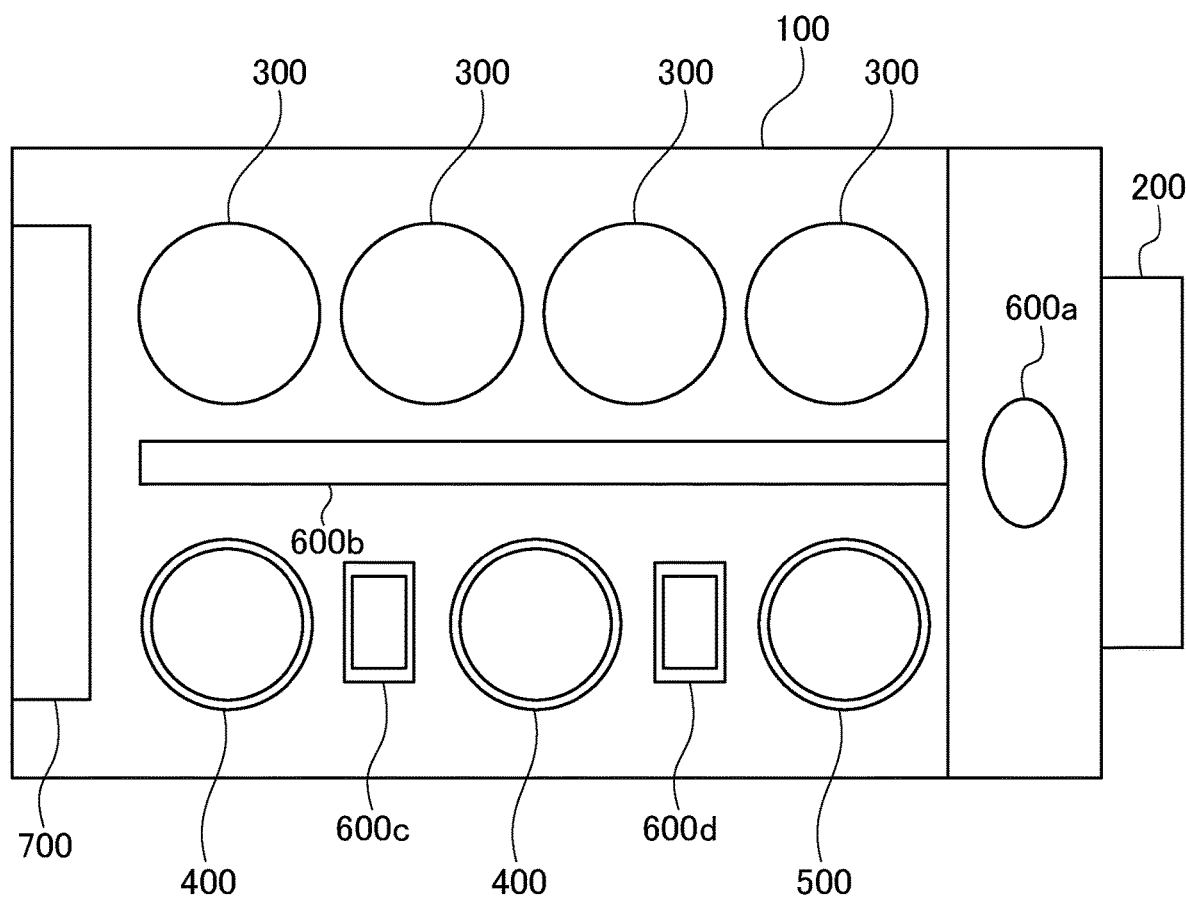
FIG. 1 is a schematic top view of a substrate processing apparatus including a substrate polishing apparatus 300.

According to one embodiment, a method to adsorb a substrate to a top ring comprising a top ring body and an elastic film under the top ring body is provided. The method comprises: vacuuming at least one area among a plurality of areas formed concentrically between a top face of the elastic film and the top ring body under a state where a bottom face of the substrate is supported by a support member and a top face of the substrate contacts a bottom face of the elastic film; measuring a flow volume of gas in an area located outside one or more areas to be vacuumed; determining whether the substrate is adsorbed to the top ring based on the flow volume of the gas; and after it is determined that the substrate is adsorbed to the top ring, separating the elastic film to which the substrate is adsorbed from the support member.

If a certain area is vacuum drawn, when the substrate is adsorbed to the elastic film, a volume of an area located outside the vacuuming target area becomes small. This is detected based on the flow volume of the gas in the area located outside the vacuuming target area. Therefore, it is possible to determine whether the substrate is adsorbed to the elastic film.

It is preferable that the method further comprises measuring pressure of at least one area among the one or more areas to be vacuumed after vacuuming at least one area among the plurality of areas, wherein whether the substrate is absorbed is determined taking into consideration the flow volume of the gas and the pressure of at least one area among the one or more areas to be vacuumed.

The accuracy of the determination is further improved by considering the pressure (the degree of vacuum) in the vacuuming target area.

It is preferable that the method further comprises: pressuring at least one area among the plurality of areas; and contacting the top face of the substrate with the bottom face of the elastic film, wherein vacuuming at least one area among the plurality of areas is performed thereafter.

This is because even when the elastic film and the top ring body are closely attached to each other, this state is released by pressurizing in advance and it is possible to increase the contact area between the elastic film and the substrate.

It is more preferable that upon pressuring at least one area, at least one of the areas to be vacuumed is pressured.

When the vacuuming target area is the center of the elastic film, the center of the elastic film has a downward convex shape, so that it is possible to cause the central portion of the substrate to reliably come into contact with the elastic film.

It is preferable that an area located outside the areas to be vacuumed is not pressured when the top face of the substrate contacts the bottom face of the elastic film.

This is because when an area located outside the vacuuming target area is pressurized, the substrate is curved like a bow and a load is applied to the substrate.

The support member may be a transfer mechanism configured to transfer the substrate to the top ring.

In this case, it is possible to reliably transfer the substrate from the transport mechanism to the top ring.

The support member may be a polishing table configured to polish the substrate holed by the top ring.

In this case, it is possible to cause the substrate to be reliably adsorbed to the top ring from the polishing table after the polishing of the substrate.

According to another embodiment, a substrate holding apparatus is provided. The apparatus comprises: a top ring body; an elastic film under the top ring body, a plurality of areas being concentrically formed between a top face of the elastic film and the top ring body; a pressure controller configured to vacuum at least one area among the plurality of areas under a state where a top face of a substrate whose bottom face is supported by a support member contacts a bottom face of the elastic film; a flow meter configured to measure a flow volume of gas in an area located outside one or more areas to be vacuumed; and a determiner configured to determine whether the substrate is adsorbed to the top ring based on the flow volume of the gas.

By this aspect, it is possible to accurately determine whether the substrate is adsorbed to the elastic film.

It is preferable that a flow path on which the flow meter is provided is connected to the area located outside the one or more areas to be vacuumed, and the flow path is not branched between said area and the flow meter.

By doing so, it is possible for the flow meter to correctly measure the flow volume in the area.

It is preferable that no holes are formed on the elastic film at a position where the plurality of areas are formed.

There is no hole, so that it is possible to prevent powder dust generated inside the top ring from contaminating the substrate and it is possible to prevent gas from leaking from between the elastic film and the adsorbed substrate.

According to another embodiment, a substrate polishing apparatus is provided. The apparatus comprises: the substrate holding apparatus according to claim 8; a transfer mechanism configured to transfer the substrate to the substrate holding apparatus; and a polishing table configured to polish the substrate held by the substrate holding apparatus.

According to another embodiment, a substrate holding apparatus is provided. The apparatus comprises: a top ring body; an elastic film comprising a first face and a second face opposite the first face, a plurality of areas being formed between the first face and the top ring body, the second face being capable of holding a substrate; a first line communicating with a first area among the plurality of areas and capable of pressuring the first area; a second line communicating with the first area and capable of exhausting the first area; a measurement instrument whose measurement value varies based on a flow volume of the first area; a third line communicating with a second area among the plurality of areas and different from the first area, the third line being capable of pressuring or depressurizing the second area.

It is possible to appropriately handle the substrate by using the flow volume measured by the flow meter.

The measurement instrument may be a flow meter capable of measuring a flow volume of the second line. The measurement instrument may be a pressure gauge capable of measuring a pressure of the first line of the second line.

It is preferable that the apparatus further comprises a determiner configured to determine whether the substrate is adsorbed to the second face based on the measurement value.

The flow volume measured by the flow meter corresponds to a gap between the top ring body and the first surface of the elastic film. When the substrate is adsorbed, the gap becomes small and the flow volume decreases, so that it is possible to accurately determine whether the substrate is adsorbed.

It is preferable that the apparatus further comprises a controller configured to, when the substrate is adsorbed to the second face, depressurize the second area through the third line and pressure the first area through the first line and make a fluid through the second line; wherein the determiner determines whether the substrate is adsorbed to the second face based on the measurement value when the substrate is adsorbed to the second face.

The flow volume is measured in a state in which the first area is opened to the atmosphere, so that it is possible to prevent the elastic film from applying stress to the substrate.

It is preferable that the determiner determines whether the substrate is adsorbed to the second face based on the measurement value measured by the measurement instrument after a first time from a start of depressurizing the second area.

Thereby, it is possible to perform accurate determination.

It is preferable that the apparatus further comprises a controller configured to control a pressure of the second area through the third line based on the measurement value.

The flow volume measured by the flow meter corresponds to the gap between the top ring body and the first surface of the elastic film. The gap corresponds to a swell of the elastic film. Therefore, it is possible to control the swell of the elastic film by monitoring the flow volume.

It is preferable that the controller controls the pressure of the second area so that the measurement value falls within a first range.

Thereby, it is possible to maintain the swell of the elastic film within a predetermined range.

It is preferable that the controller, when the substrate held by the second face is released, pressures the first area through the first line and make a fluid into the first area through the second line, and controls the second area through the third line based on the measurement value.

It is preferable that the controller controls the pressure of the second area so that a fluid is injected to a first position from a release nozzle.

It is more preferable that the first position is between the second face and the hold substrate.

Thereby, it is possible to continue jetting fluid from the release nozzle into between the second surface of the elastic film and the substrate, so that the substrate can be effectively released.

It is preferable that no holes are formed on the elastic film.

It is preferable that the second area is not adjacent to the first area.

Thereby, when the substrate is not adsorbed to the second area, the gap between the first area and the first surface is maintained.

It is preferable that the apparatus comprises a retainer ring at an outer circumference of the elastic film.

The retainer ring may comprise an inner ring and an outer ring outside the inner ring.

According to another embodiment, a substrate polishing apparatus is provided. The apparatus comprises: the substrate holding apparatus according to claim 12; and a polishing table configured to polish the substrate held by the substrate holding apparatus.

According to another embodiment, a substrate adsorption determination method for a substrate holding apparatus is provided. The method comprises: depressurizing a second area formed between a top ring body and a first face of an elastic film in the substrate holding apparatus, pressurizing a first area formed between the top ring body and the first face of the elastic film different from the second area and making a fluid through a second line communicating with the first area; and determining whether the substrate is adsorbed to a second face of the elastic film opposite the first face based on a measurement value varying according to a flow volume of the first area.

According to another embodiment, a pressure control method for a substrate holding apparatus is provided. The method comprises: pressurizing a first area formed between a top ring body and a first face of an elastic film in the substrate holding apparatus, and making a fluid through a second line communicating with the first area; and controlling a second area formed between the top ring body and the first face of the elastic film different from the first area based on a measurement value varying according to a flow volume of the first area.

According to another embodiment, an elastic film used with a top ring body provided with a first hole at an outside of a first portion and a second hole at an inside of the first portion to configure a substrate holding apparatus is provided. The elastic film comprises: a first face provided with a second portion capable of being engaged with the first portion, a plurality of areas being formed between the first face and the top ring body; and a second face opposite the first face, the second face being capable of holding a substrate.

The first portion and the second portion engage with each other, so that a difference between a case in which the substrate is held and a case in which the substrate is not held becomes large. Therefore, it is possible to accurately perform the substrate adsorption determination.

The first portion may be a concave portion and the second portion may be a convex portion, or the first portion may be a convex portion and the second portion may be a concave portion.

According to another embodiment, a substrate holding apparatus is provided. The apparatus comprises: a top ring body provided with a first hole at an outside of a first portion and a second hole at an inside of the first portion; an elastic film comprising: a first face provided with a second portion capable of being engaged with the first portion, a plurality of areas being formed between the first face and the top ring body; and a second face opposite the first face, the second face being capable of holding a substrate; a first line being capable of pressuring a first area through the first hole positioned at the first area among the plurality of areas; a second line capable of depressurizing the first are through the second hole positioned at the first area; a measurement instrument whose measurement value varies based on a flow volume of the first area; and a third line communicating with a second area among the plurality of areas and different from the first area, the third line being capable of pressuring or depressurizing the second area.

It is preferable that a radially spreading groove is provided at a portion of the top ring body corresponding to the first area.

It is preferable that the substrate holding apparatus further comprising: a bypass line configured to connect the first line with the second line; and a valve provided on the bypass line.

It is possible to pressurize the first area from both the first line and the second line by opening the valve on the bypass line. Thereby, it is possible to quickly pressurize the entire first area by the same pressure even when the second portion engages with the first portion when pressurizing the first area.

Hereinafter, embodiments will be specifically described with reference to the drawings.

(First Embodiment)

As described in BACKGROUND AND SUMMARY, the substrate is vacuum drawn from a hole formed in the membrane, so that the substrate is adsorbed to the membrane. If the hole formed in the membrane is large, powder dust generated inside the top ring may go through the hole and contaminate the substrate, or gas may leak from between the membrane and the vacuum-adsorbed substrate. Therefore, in recent years, the hole formed in the membrane tends to be small as much as possible. Further, the substrate may be adsorbed by deforming the surface shape of the membrane by vacuuming without using the hole.

When the hole is small or no hole is made, a force of adsorbing the substrate becomes small. If the top ring is moved before the substrate is sufficiently adsorbed to the top ring, the substrate may fall. Therefore, it is necessary to detect that the substrate is adsorbed to the top ring and the transfer from the transport mechanism is completed. Normally, the vacuum pressure of the area that is vacuum drawn is measured, and it is determined that the transfer of the substrate is completed when the vacuum pressure reaches a predetermined threshold value.

However, even when the determination is performed based on the vacuum pressure of the area that is vacuum drawn, a sufficient adhesive force is not necessarily generated between the substrate and the membrane. Therefore, for safety's sake, it is required to set a severe threshold value or move the top ring after waiting a predetermined time when the threshold value is reached. Doing so makes the transfer time of the substrate longer than the time originally required, so that there is a problem that the throughput decreases.

The first and the second embodiments have been made in view of the above problem and an object of the first and the second embodiments are to provide a substrate adsorption method that can cause the substrate to be reliably adsorbed to the top ring, a substrate holding apparatus that reliably adsorbs the substrate, and a substrate polishing apparatus including such a substrate holding apparatus.

FIG. 1 is a schematic top view of a substrate processing apparatus including a substrate polishing apparatus 300. The substrate processing apparatus processes various substrates in a manufacturing process and the like of a semiconductor wafer having a diameter of 300 mm or 450 mm, a flat panel, an image sensor of a CMOS (Complementary Metal Oxide Semiconductor), a CCD (Charge Coupled Device), and the like, and a magnetic film in MRAM (Magnetoresistive Random Access Memory).

The substrate processing apparatus includes a substantially rectangular housing 100, a load port 200 on which a substrate cassette that stocks many substrates is mounted, one or a plurality of (four in the aspect shown in FIG. 1) substrate polishing apparatuses 300, one or a plurality of (two in the aspect shown in FIG. 1) substrate cleaning apparatuses 400, a substrate drying apparatus 500, transport mechanisms 600a to 600d, and a controller 700.

The load port 200 is arranged adjacent to the housing 100. It is possible to mount an open cassette, an SMIF (Standard Mechanical Interface) pod, or a FOUP (Front Opening Unified Pod) on the load port 200. The SMIF pod or the FOUP is a closed container that can maintain an environment independent from the external space by housing the substrate cassette inside thereof and covering the substrate cassette with a confining wall.

The substrate polishing apparatuses 300 that polish a substrate, the substrate cleaning apparatuses 400 that clean the substrate that has been polished, and the substrate drying apparatus 500 that dries the substrate that has been cleaned are housed in the housing 100. The substrate polishing apparatuses 300 are arranged along a longitudinal direction of the substrate processing apparatus. The substrate cleaning apparatuses 400 and the substrate drying apparatus 500 are also arranged along the longitudinal direction of the substrate processing apparatus.

The transport mechanism 600a is arranged in an area surrounded by the load port 200, the substrate polishing apparatus 300 located facing the load port 200, and the substrate drying apparatus 500. The transport mechanism 600b is arranged in parallel with the substrate polishing apparatuses 300 and also in parallel with the substrate cleaning apparatuses 400 and the substrate drying apparatus 500.

The transport mechanism 600a receives a substrate before being polished from the load port 200 and transfers the substrate to the transport mechanism 600b, and also receives a substrate that has been dried from the substrate drying apparatus 500.

The transport mechanism 600b is, for example, a linear transporter and transfers the substrate before being polished which is received from the transport mechanism 600a to the substrate polishing apparatuses 300. As described later, the top ring (not shown in FIG. 1) in the substrate polishing apparatus 300 receives the substrate from the transport mechanism 600b by vacuum adsorption. The substrate polishing apparatus 300 releases the substrate that has been polished to the transport mechanism 600b and the substrate is transferred to the substrate cleaning apparatus 400.

Further, the transport mechanism 600c that performs transfer of the substrate between the two substrate cleaning apparatuses 400 is arranged between these substrate cleaning apparatuses 400. Further, the transport mechanism 600d that performs transfer of the substrate between these substrate cleaning apparatuses 400 and the substrate drying apparatus 500 is arranged between these substrate cleaning apparatuses 400 and the substrate drying apparatus 500.

The controller 700 controls operation of each device in the substrate processing apparatus. The controller 700 may be arranged inside the housing 100, may be arranged outside the housing 100, or may be provided for each of the substrate polishing apparatuses 300, the substrate cleaning apparatuses 400, and the substrate drying apparatus 500.

Figure 2A:
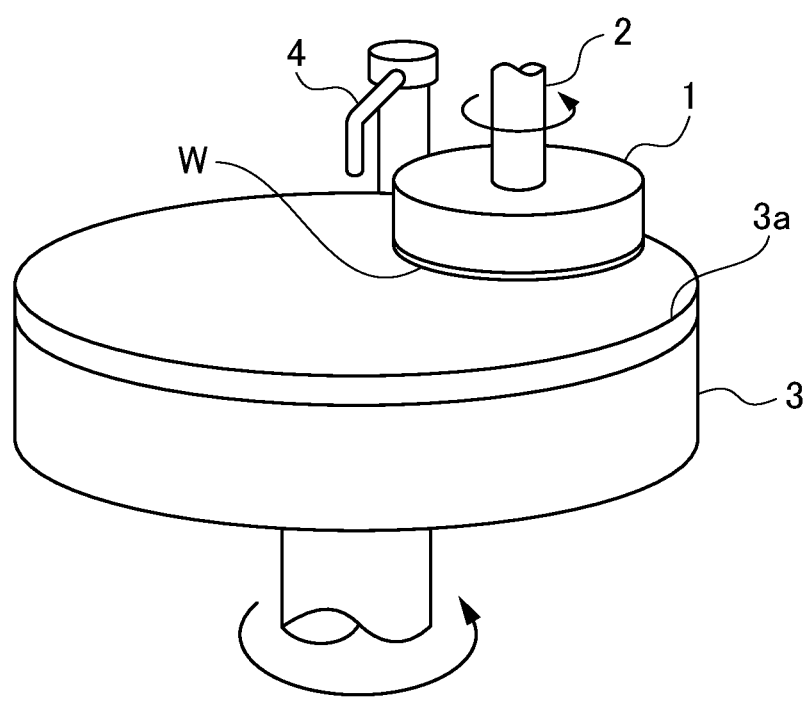
FIG. 2A is a schematic perspective view of the substrate polishing apparatus 300.
Figure 2B:
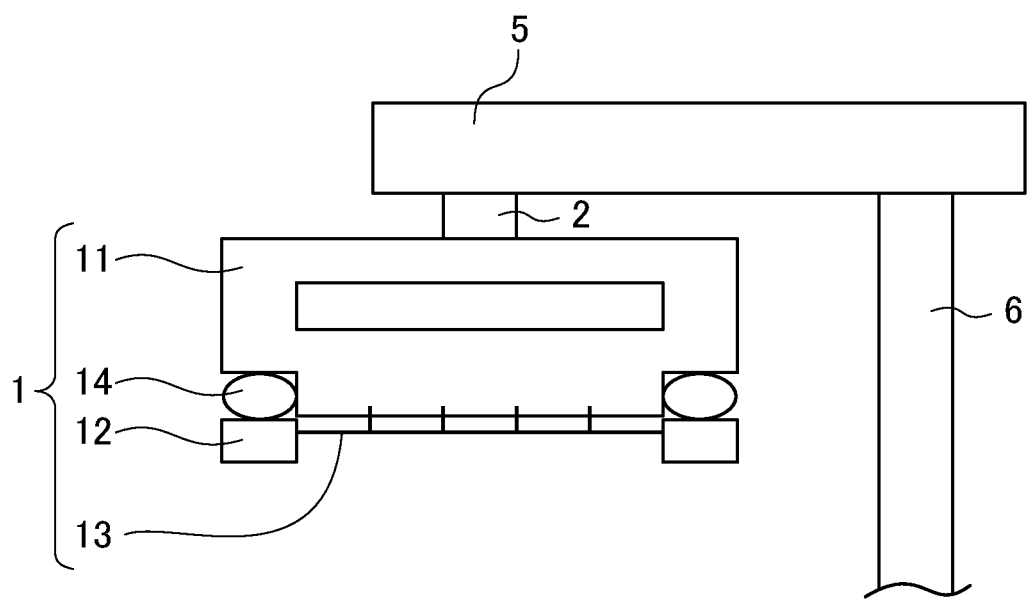
FIG. 2B is a cross-sectional view of the substrate polishing apparatus 300.

FIGS. 2A and 2B are a schematic perspective view and a cross-sectional view, respectively, of the substrate polishing apparatus 300. The substrate polishing apparatus 300 includes a top ring 1, a top ring shaft 2 where the top ring 1 is connected to a lower part of the top ring shaft 2, a polishing table 3 having a polishing surface 3a, a nozzle 4 that supplies polishing liquid on the polishing table 3, a top ring head 5, and a support shaft 6.

The top ring 1 holds a substrate W and presses the lower surface of the substrate W onto the polishing surface 3a. As shown in FIG. 2B, the top ring 1 includes a top ring body (a carrier) 11, a ring-shaped retainer ring 12, a flexible membrane 13 (an elastic film) that is provided below the top ring body 11 and inside the retainer ring 12, and an air bag 14 provided between the top ring body 11 and the retainer ring 12. The upper surface of the substrate W is held by the top ring 1 by depressurizing a space between the top ring body 11 and the membrane 13. The circumferential edge of the substrate W is surrounded by the retainer ring 12, so that the substrate W does not run away from the top ring 1 during polishing.

The top ring shaft 2 is connected to the center of the upper surface of the top ring 1. An elevating mechanism not shown in the drawings moves up and down the top ring shaft 2, so that the lower surface of the substrate W held by the top ring 1 is attached to and detached from the polishing surface 3a. Further, a motor not shown in the drawings rotates the top ring shaft 2, so that the top ring 1 rotates and the substrate W held by the top ring 1 also rotates.

The polishing surface 3a is provided on the upper surface of the polishing table 3. The lower surface of the polishing table 3 is connected to a rotating shaft, so that the polishing table 3 is rotatable. The polishing liquid is supplied from the nozzle 4, and the substrate W and the polishing table 3 rotate in a state in which the lower surface of the substrate W is in contact with the polishing surface 3a, so that the substrate W is polished.

The top ring shaft 2 is connected to one end of the top ring head 5 and the support shaft 6 is connected to the other end of the top ring head 5. When a motor not shown in the drawings rotates the support shaft 6, the top ring head 5 swings, so that the top ring 1 moves back and forth between a position on the polishing surface 3a and a substrate transfer position (not shown in the drawings).

The substrate polishing apparatus 300 operates as described below. First, the top ring head 5 swings, so that the top ring 1 moves to the substrate transfer position and the substrate W is transferred from a transport mechanism (not shown in the drawings) to the top ring 1. Thereby, the upper surface of the substrate W is held by the top ring 1. Details of this point will be described later.

Subsequently, the top ring head 5 swings in the opposite direction, so that the top ring 1 moves to a position on the polishing surface 3a. Further, the top ring shaft 2 comes down to cause to the lower surface of the substrate W to come into contact with the polishing surface 3a. Then, the top ring 1 and the polishing table 3 rotate while the polishing liquid is being supplied from the nozzle 4 to the polishing surface 3a, so that the substrate W is polished. After the polishing, the top ring 1 holds the substrate W again and the top ring head 5 swings, so that the top ring 1 moves to the substrate transfer position.

Subsequently, the transfer of the substrate from the transport mechanism 600b to the top ring 1 at the substrate transfer position will be described.

Figure 3A:
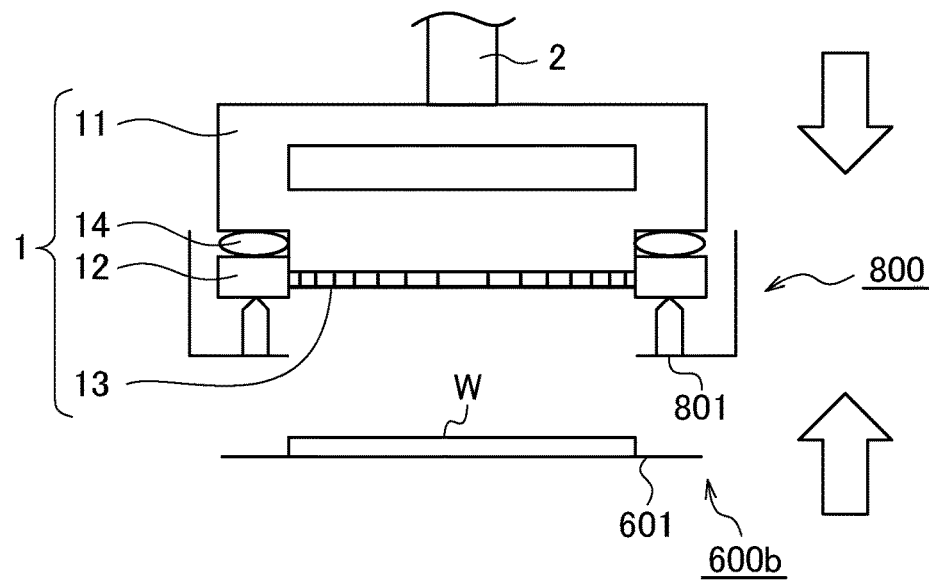
FIG. 3A is a diagram for explaining transfer of a substrate from a transport mechanism 600b to a top ring 1.
Figure 3B:
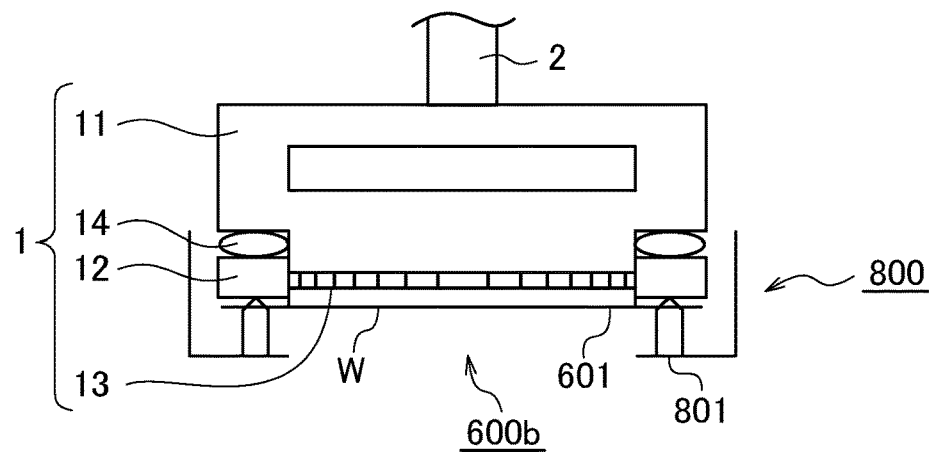
FIG. 3B is a diagram for explaining transfer of the substrate from the transport mechanism 600b to the top ring 1.
Figure 3C:
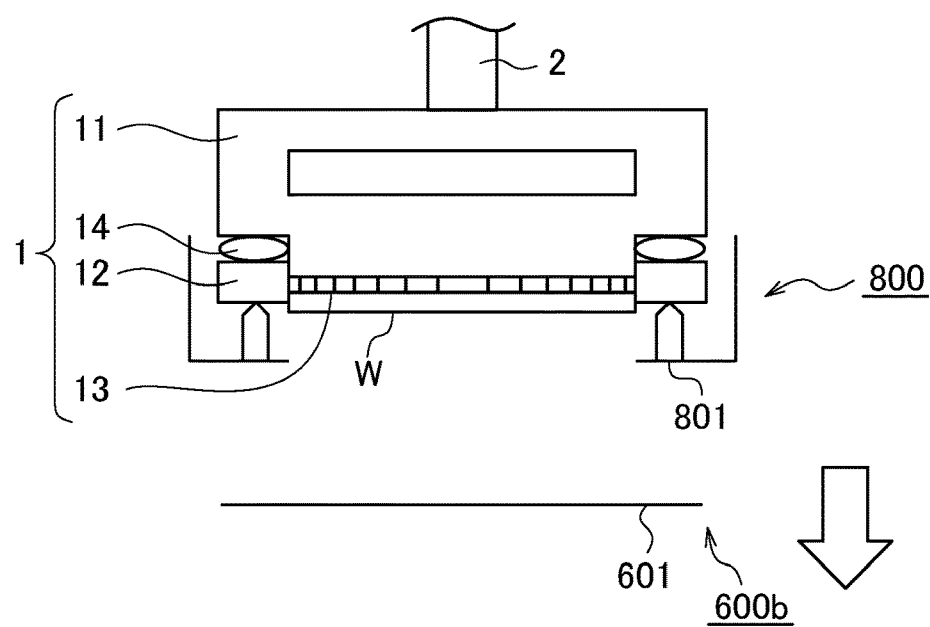
FIG. 3C is a diagram for explaining transfer of the substrate from the transport mechanism 600b to the top ring 1.
Figure 4:
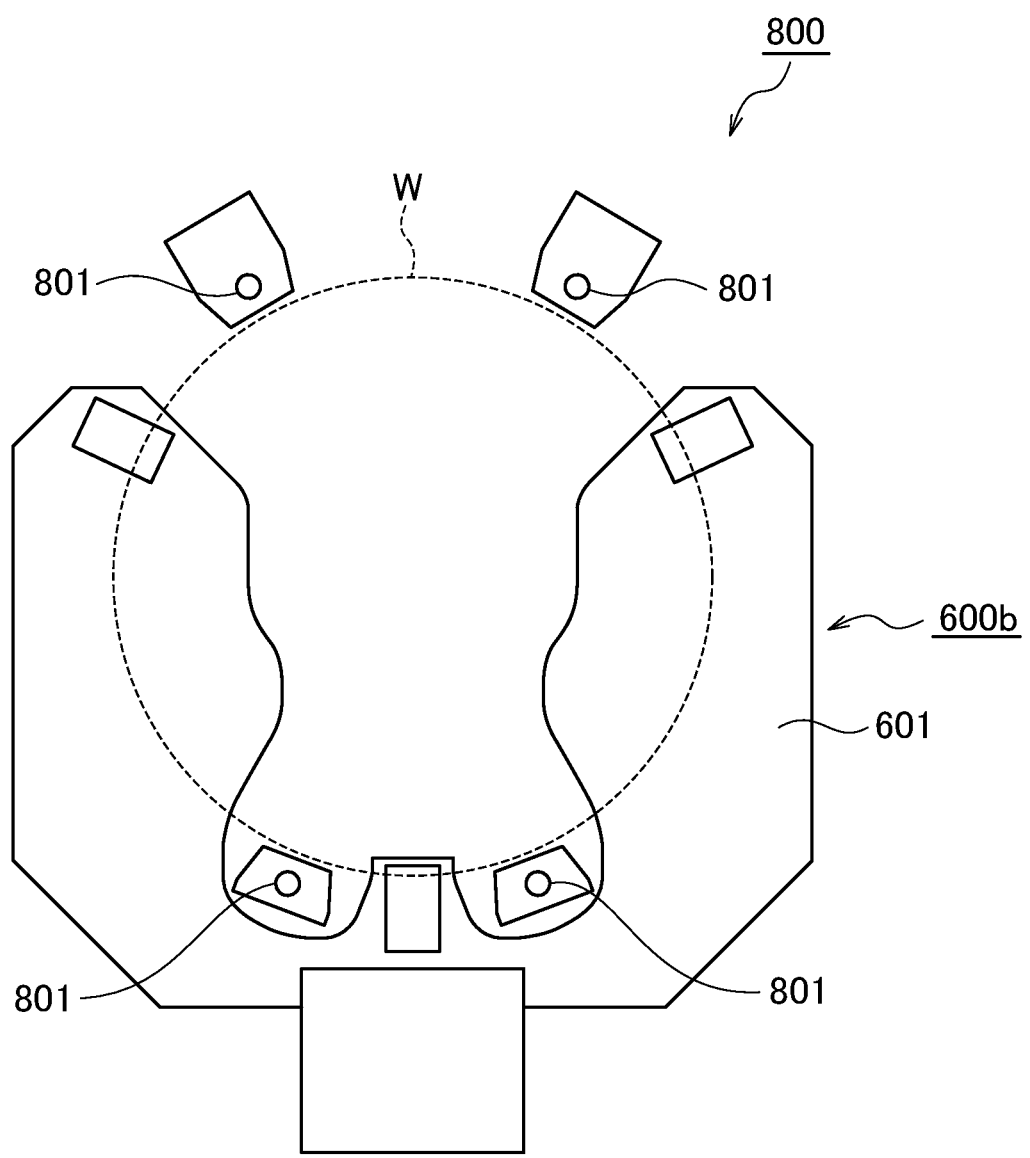
FIG. 4 is a diagram for explaining transfer of the substrate from the transport mechanism 600b to the top ring 1.

FIGS. 3A to 3C and 4 are diagrams for explaining the transfer of the substrate from the transport mechanism 600b to the top ring 1. FIGS. 3A to 3C are diagrams of the transport mechanism 600b and the top ring 1 as seen from side and FIG. 4 is a diagram of these as seen from above.

As shown in FIGS. 3A to 3C, the substrate W is mounted on the transport mechanism 600b (more specifically, on a hand 601 of the transport mechanism 600b). As shown in FIG. 4, the hand 601 supports parts of outer circumference of the lower surface of the substrate W. The transport mechanism 600b is moved upward and downward by an elevating mechanism not shown in the drawings.

A retainer ring station 800 is used for the transfer of the substrate W. As shown in FIG. 3A, the retainer ring station 800 has a push-up pin 801 that pushes up the retainer ring 12 of the top ring 1. Although the retainer ring station 800 may have a release nozzle, the release nozzle is not shown in the drawings. As shown in FIG. 4, the push-up pin 801 and the hand 601 are arranged not to be in contact with each other.

The transport mechanism 600b and the top ring 1 operate as described below and the substrate W is transferred from the transport mechanism 600b to the top ring 1. First, as shown in FIG. 3A, the top ring 1 moves downward and the transport mechanism 600b moves upward. The top ring 1 moves downward, so that the push-up pin 801 pushes up the retainer ring 12. Further, the substrate W comes close to the membrane 13.

When the transport mechanism 600b moves further upward, as shown in FIG. 3B, the upper surface of the substrate W comes into contact with the lower surface of the membrane 13. In this state, the substrate W is adsorbed to the membrane 13 in a manner as described below. At this time, a determination is made whether the substrate W is reliably adsorbed to the membrane 13, in other words, a determination is made whether the transfer of the substrate W has been completed. When it is determined that the transfer of the substrate W has been completed, as shown in FIG. 3C, the top ring 1 moves upward and the transport mechanism 600b moves downward.

Next, the adsorption of the substrate W and the determination of the completion of the adsorption of the substrate W will be described.

Figure 5:
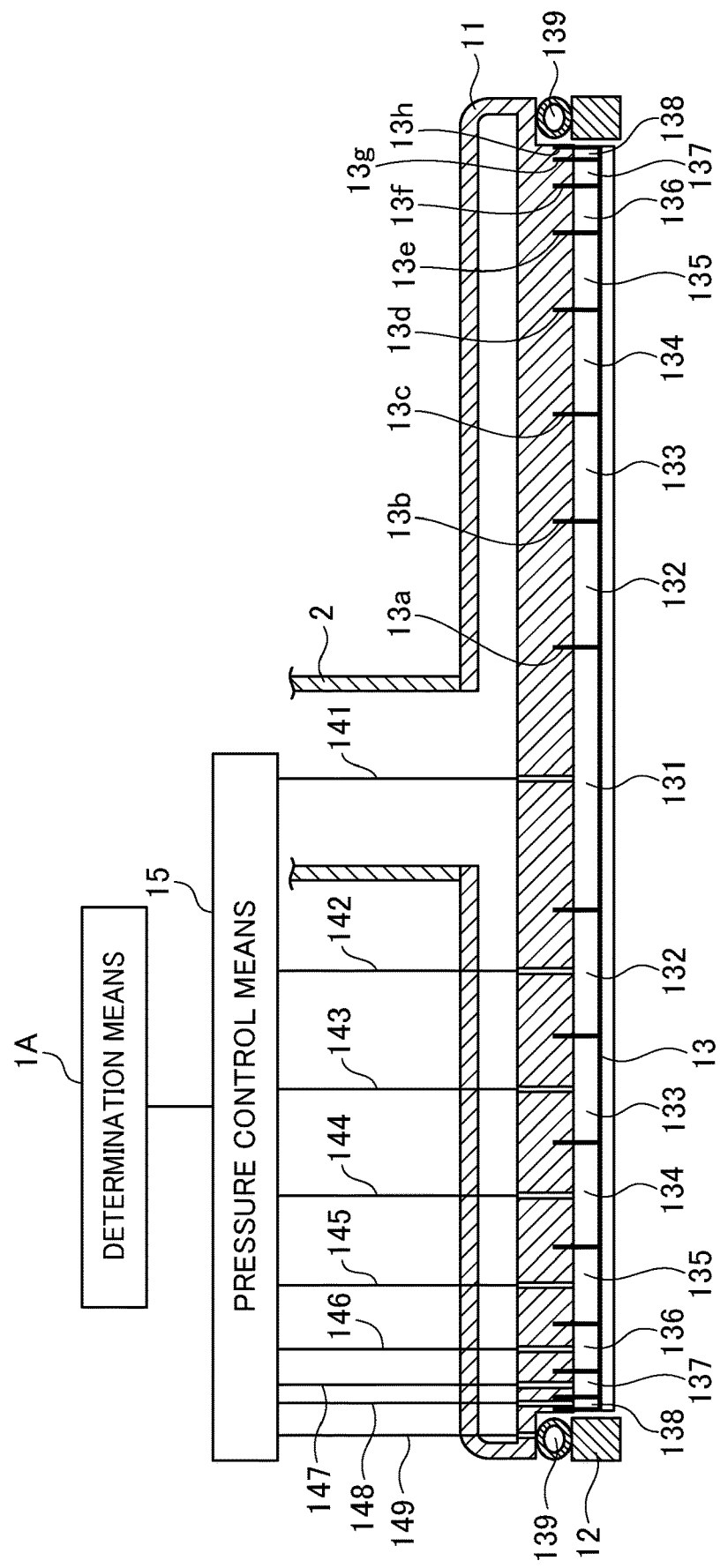
FIG. 5 is a cross-sectional view schematically showing a structure of the top ring 1.

FIG. 5 is a cross-sectional view schematically showing a structure of the top ring 1. Circumferential walls 13a to 13h extending upward toward the top ring body 11 are formed on the membrane 13. By these circumferential walls 13a to 13h, concentric areas 131 to 138, which are divided by the circumferential walls 13a to 13h, are formed between the upper surface of the membrane 13 and the lower surface of the top ring body 11.

A hole may be formed at positions where the areas 131 to 138 in the membrane 13 are formed. However, it is desirable that the hole is as small as possible. It is further desirable that no hole is formed in the membrane 13. In the present embodiment, even in such a case in which the adsorption force is not strong, it is possible to prevent the substrate W from falling by accurately determining that the substrate W is adsorbed to the top ring 1.

Flow paths 141 to 148 that penetrate the top ring body 11 and communicate with the areas 131 to 138, respectively, are formed. A retainer chamber 139 made of an elastic film is provided directly on the retainer ring 12 and a flow path 149 that connects to the retainer chamber 139 is formed in the same manner. The flow paths 141 to 149 are connected to a pressure control means 15, and the pressures in the areas 131 to 138 and the retainer chamber 139 are controlled.

In the present embodiment, as a specific example, it is assumed that the areas 131 to 134, which are located near the center, can be pressurized and can be vacuum drawn through the flow paths 141 to 144, respectively, and the areas 135 to 138 and the retainer chamber 139, which are located outer, can be opened to the atmosphere through the flow paths 145 to 149, respectively.

Figure 6:
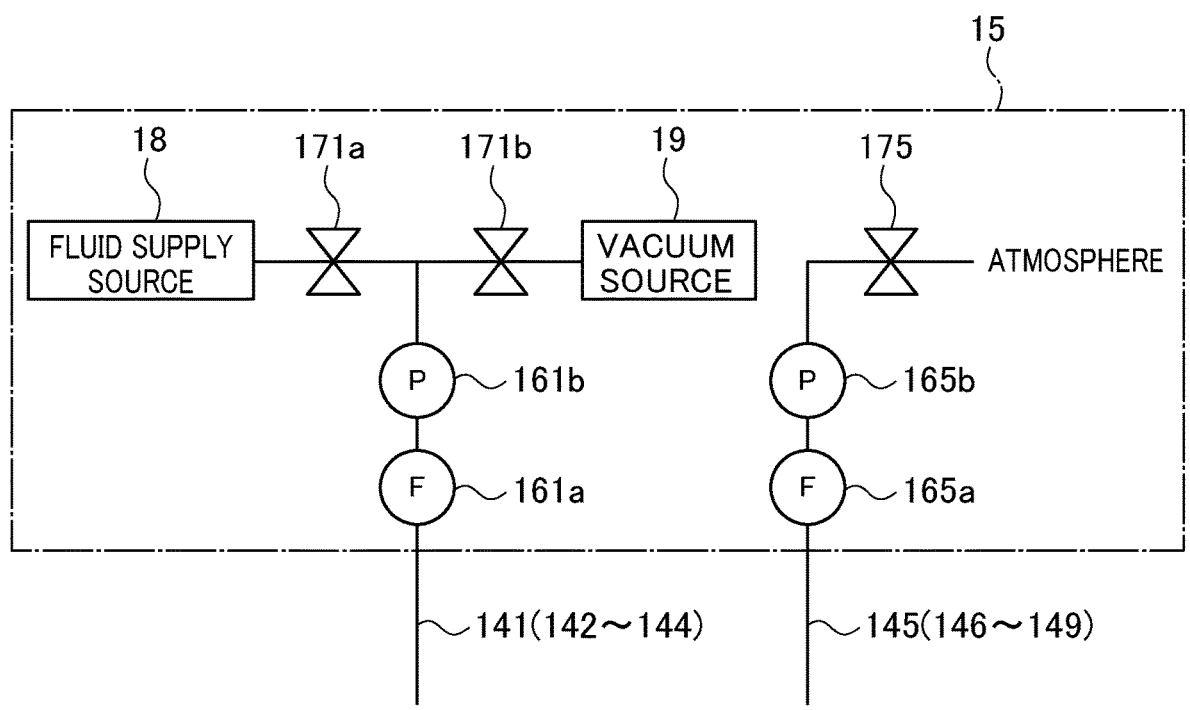
FIG. 6 is a diagram showing an example of an internal configuration of a pressure control means 15.

FIG. 6 is a diagram showing an example of an internal configuration of the pressure control means 15. The configurations related to the flow paths 141 to 144 are the same, so that only the flow path 141 is shown in FIG. 6. In the same manner, the configurations related to the flow paths 145 to 149 are the same, so that only the flow path 145 is shown in FIG. 6.

The flow path 141 is provided with a flow meter 161a and the flow meter 161a measures a flow volume of gas flowing into the area 131 (or flowing out from the area 131). The flow path 141 is provided with a pressure gauge 161b and the pressure gauge 161b measures the pressure in the area 131.

The flow path 141 branches at a position beyond the flow meter 161a and the pressure gauge 161b, and one branch is connected to a fluid supply source 18 through a valve 171a and the other branch is connected to a vacuum source 19 through a valve 171b. The area 131 can be pressurized by opening the valve 171a and supplying gas such as nitrogen from the fluid supply source 18. The area 131 can be vacuum drawn (depressurized) by opening the valve 171b and performing vacuuming by the vacuum source 19.

Here, it is desirable that the path between the area 131, the flow meter 161a, and the pressure gauge 161b is a single pipe and does not branch. This is because almost all of the gas that goes out of the area 131/enters the area 131 passes through the flow meter 161a and the pressure gauge 161b, so that the flow meter 161a and the pressure gauge 161b can measure the gas flow volume and the pressure of the area 131, respectively, regardless of an open or closed state of the valves 171a and 171b.

Of course, when there is no leak or when it is possible to divide the flow path of the gas by providing a valve at an appropriate position, there may be a branch between the area 131, the flow meter 161a, and the pressure gauge 161b.

Although not shown in the drawings, the flow meters and the pressure gauges provided in the flow paths 142 to 144 are referred to as flow meters 162a to 164a and pressure gauges 162b to 164b, respectively.

On the other hand, the flow path 145 is provided with the flow meter 165a and the pressure gauge 165b. Beyond the flow meter 165a and the pressure gauge 165b, the flow path 145 communicates with atmosphere through a valve 175. It is possible to open the area 135 to the atmosphere by opening the valve 175. Although not shown in the drawings, the flow meters and the pressure gauges provided in the flow paths 146 to 149 are referred to as flow meters 166a to 169a and pressure gauges 166b to 169b, respectively.

FIG. 6 is just an example, and various modifications are possible. For example, the flow paths 145 to 149 may be connected to the fluid supply source 18 and/or the vacuum source 19 through a valve by providing a branch or may be caused to have an atmospheric pressure by supplying fluid instead of communicating with the atmosphere. The flow paths 141 to 144 may be communicated with the atmosphere through a valve by further providing a branch. In either case, it is preferable that there is no branch between the flow meter, the pressure gauge, and an area.

Referring back to FIG. 5, the top ring 1 includes a determination means 1A that is connected to the pressure control means 15. As described later, the determination means 1A determines whether the substrate W is adsorbed to the membrane 13 of the top ring 1, in other words, whether the transfer of the substrate W from the transport mechanism 600b to the top ring 1 has been completed, based on necessary measurement results of the flow meters 161a to 169a and the pressure gauges 161b to 169b.

Figure 7A:
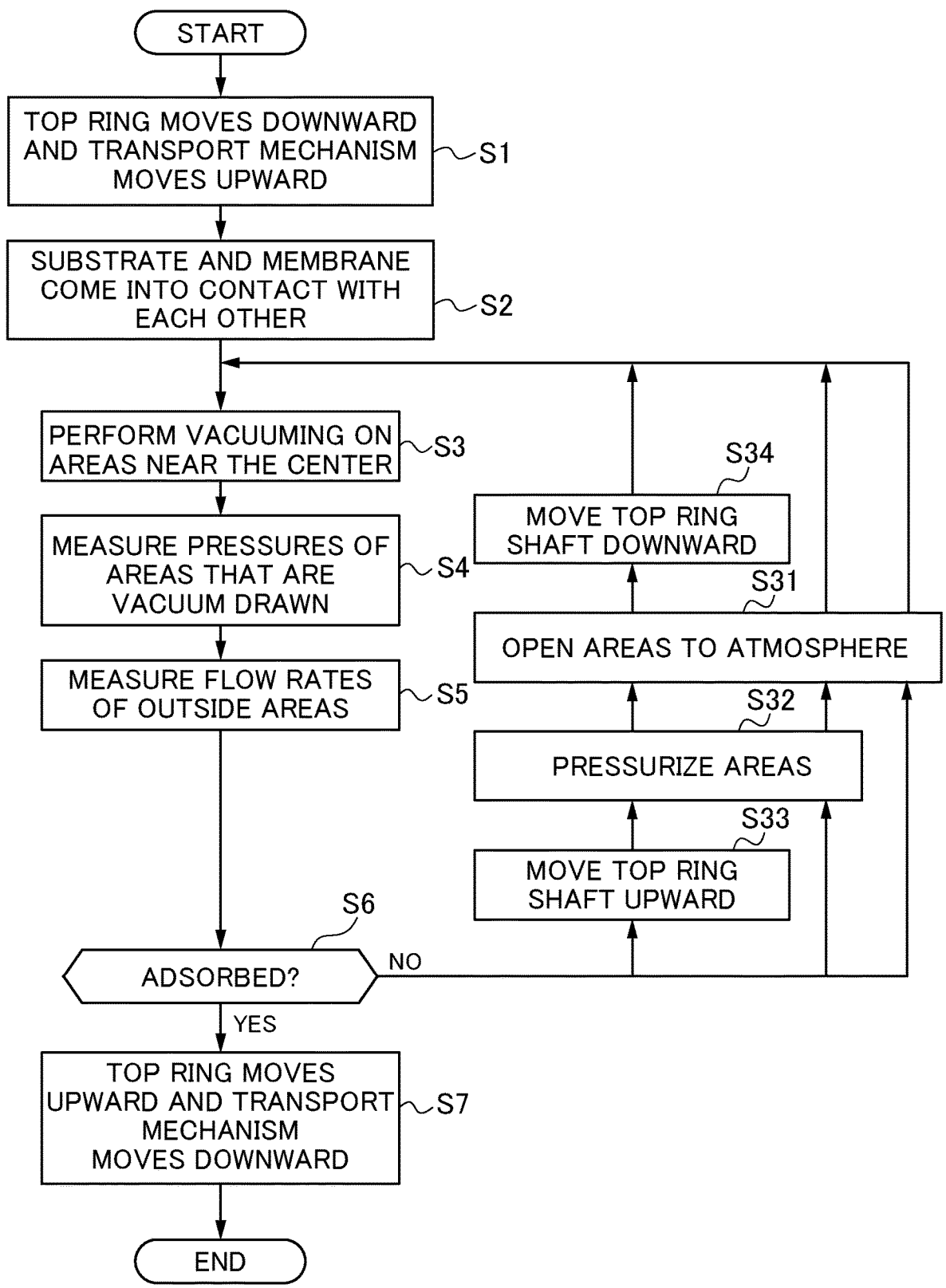
FIG. 7A is a flowchart showing a transfer procedure of a substrate W including an adsorption completion determination of the substrate W.

FIG. 7A is a flowchart showing a transfer procedure of the substrate W including an adsorption completion determination of the substrate W.

First, the upper surface of the substrate W and the lower surface of the membrane 13 are caused to come into contact with each other by using the transport mechanism 600b as a support member. Specifically, as described by using FIGS. 3A to 3C, the transport mechanism 600b that supports the lower surface of the substrate W moves upward and the top ring 1 moves downward (step S1), so that the upper surface of the substrate W and the lower surface of the membrane 13 come into contact with each other (step S2).

Subsequently, the pressure control means 15 perform vacuuming on areas near the center among the areas 131 to 138 formed between the top ring body 11 and the membrane 13 (step S3).

By concerning that the greater the number of areas to be vacuum drawn is, the higher the adsorption force is, the appropriate number of areas should be vacuum drawn. For example, when a high adsorption force is not required, only the area 131 should be vacuum drawn, and when a high adsorption force is required, the areas 131 to 134 should be vacuum drawn. Hereinafter, it is assumed that the areas 131 to 134 are vacuum drawn. In this case, the vacuum source 19 should be operated in a state in which only the valves 171b to 174b are opened. In the membrane 13 in the area 134, a plurality of small holes described above may be evenly arranged in a predetermined concentric fashion.

Figure 8A:
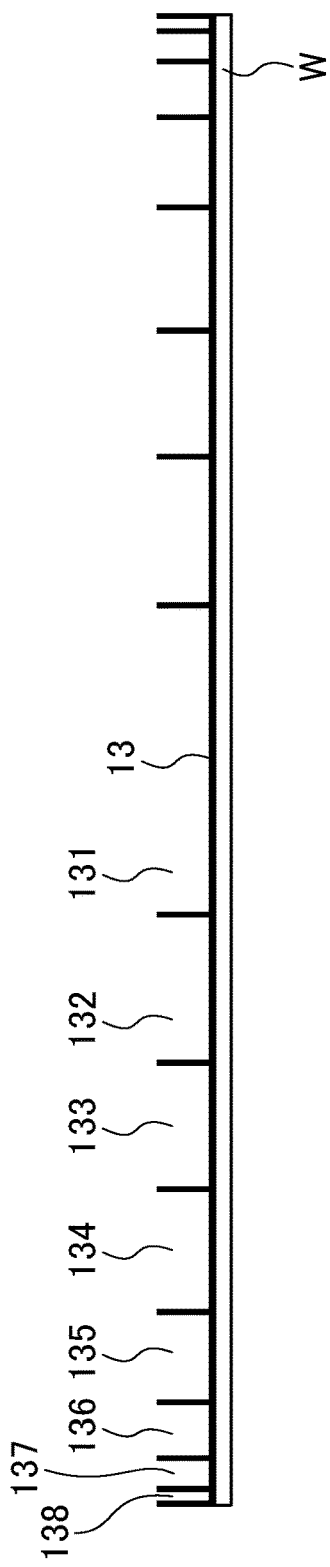
FIG. 8A is a view of a membrane 13 and the substrate W before being vacuum drawn as seen from side.
Figure 8B:
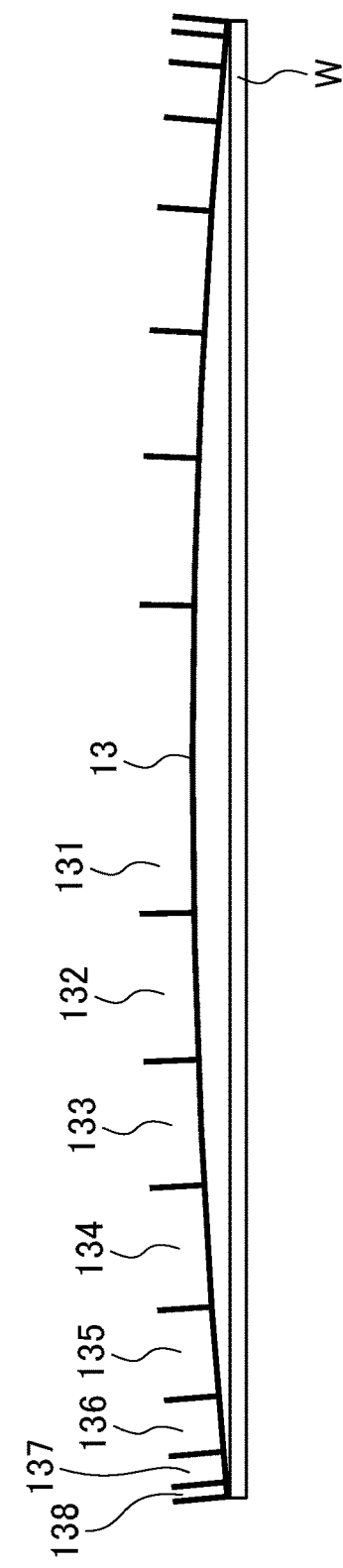
FIG. 8B is a view of the membrane 13 and the substrate W after being vacuum drawn as seen from side.

FIGS. 8A and 8B are views of the membrane 13 and the substrate W before and after being vacuum drawn, respectively, as seen from side. As shown in FIG. 8A, before being vacuum drawn, the membrane 13 is substantially flat and the pressure in the areas 131 to 138 is the atmospheric pressure. When the areas 131 to 134 are vacuum drawn, as shown in FIG. 8B, the membrane 13 is slightly deformed, a central portion of the substrate W is adsorbed to the membrane 13 by a sucker effect, and the outer circumferential portion of the substrate W and the outer circumferential portion of the membrane 13 are closely attached to each other to generate a sealing effect, so that the substrate W is strongly adsorbed to the membrane 13.

At this time, the pressure in the areas 131 to 134 that are vacuum drawn decreases and becomes close to vacuum. The membrane 13 is drawn toward the top ring body 11, so that the volumes of the areas 135 to 138 (in particular, the area 135) decrease. Therefore, the gases in the areas 135 to 138 flow out from the flow paths 145 to 148.

It is possible to detect that the substrate W is adsorbed to the membrane 13 from a fact that the volumes of the areas 135 to 138 decrease. The fact that the volumes of the areas 135 to 138 decrease can be detected from the flow volumes of the flow meters 165a to 168a.

It is desirable that the valves 175 to 178 for the areas 135 to 138 that are not vacuum drawn are opened and the pressure in the areas 135 to 138 is set to the atmospheric pressure without being pressurized. This is because although the areas 135 to 138 may be pressurized, doing so makes the membrane 13 bend largely in an arch shape and accordingly the substrate W is also bent and a load is applied to the substrate W.

Referring back to FIG. 7A. When the vacuuming of the areas 131 to 134 is started, the pressure gauges 161b to 164b provided to the corresponding flow paths 141 to 144 measure the pressure of the areas 131 to 134, respectively (step S4), and the results of the measurements are transmitted to the determination means 1A.

When the vacuuming of the areas 131 to 134 is started, the flow meters 165a to 168a provided to the flow paths 145 to 148 corresponding to the areas 135 to 138 located outside the areas 131 to 134 measure the flow volumes, respectively (step S5), and the results of the measurements are transmitted to the determination means 1A. As described above, the flow meters 165a to 168a measure the amount of gas flowing out of the areas 135 to 138.

The determination means 1A determines whether the substrate W is adsorbed to the top ring 1 based on at least the measurement result of the flow meter 165a by considering the measurement results of the pressure gauges 161b to 164b and, as needed, the flow meters 166a to 168a (step S6).

Figure 9:
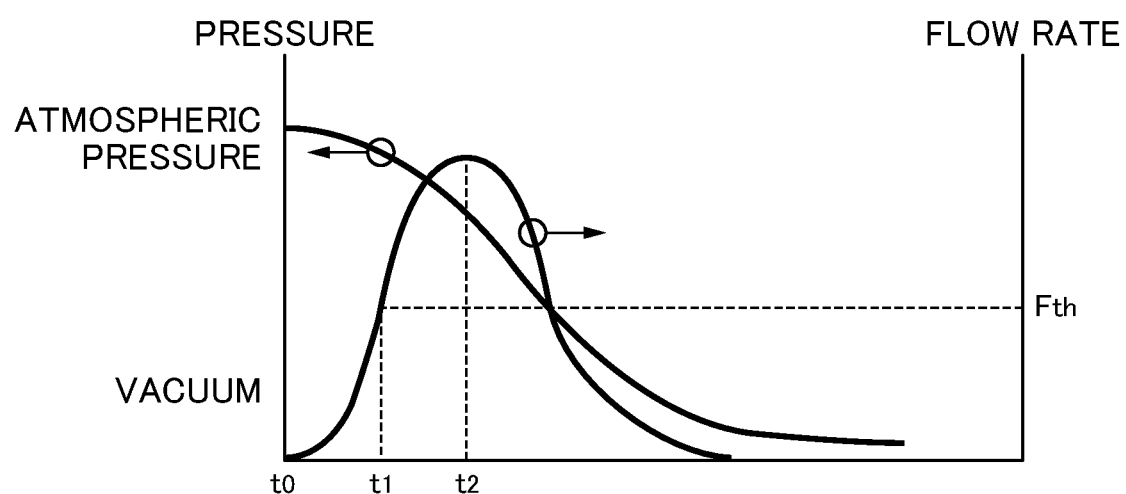
FIG. 9 is a diagram schematically showing measurement results of a pressure gauge 164b and a flow meter 165a after starting vacuuming.

FIG. 9 is a diagram schematically showing the measurement results of the pressure gauge 164b and the flow meter 165a after starting the vacuuming. The vertical axis on the left side indicates the pressure and the vertical axis on the right side indicates the flow volume (the direction flowing out from the area 135 is defined as positive). When the vacuuming is started at a time point t0, the pressure in the area 134 decreases and becomes close to vacuum from the atmospheric pressure. On the other hand, when the vacuuming is started, the volume of the area 135 decreases, and accordingly, gas outflow from the area 135 occurs.

The determination means 1A can determine whether the substrate W is fully adsorbed to the membrane 13, in other words, whether the transfer of the substrate W has been completed, based on an amount of gas flowing out of the area 135. As a specific example, the determination means 1A may determine that the transfer has been completed at a time point (time t1) when the amount of outflowing gas reaches a predetermined threshold value Fth or at a time point (time t2) when the amount of outflowing gas becomes local maximum, that is, when the amount of outflowing gas changes from increase to decrease. Alternatively, the determination means 1A may determine that the transfer has been completed at a time point when a total amount of outflowing gas, that is, a time integration value of the amount of outflowing gas, reaches a predetermined threshold value. Further, the determination means 1A may determine by using a derivative value or a difference value of the amount of outflowing gas.

A largest gas outflow occurs in the area 135 near the areas 131 to 134 that are vacuum drawn. Therefore, although it is desirable that the determination means 1A performs the determination based on the amount of gas flowing out of the area 135, the determination means 1A may perform the determination based on the amount of gas flowing out of the areas 136 to 138 instead of or in addition to the amount of gas flowing out of the area 135.

To perform the determination more accurately, the determination means 1A may determine whether the transfer of the substrate W has been completed by considering also the pressure of the area 134. For example, when the above conditions related to the amount of outflowing gas are satisfied and further the pressure of the area 134 reaches a predetermined threshold value, it may be determined that the transfer has been completed. The determination may be performed based on the pressures of the areas 131 to 133 instead of or in addition to the pressure of the area 134.

The determination means 1A of the present embodiment performs the determination by using the flow volume of the gas in an area which is not vacuum drawn. To detect a volume change of the area shown in FIG. 8B, it can be considered to use the pressure of the area and to use the flow volume of the gas, and the latter is preferable. This is because when the pressure gauge is installed at a position away from the area, it may not be possible to measure the pressure of the area quickly and accurately.

Referring back to FIG. 7A. When the determination means 1A determines that the substrate W is adsorbed to the top ring 1 (YES in step S6), the top ring 1 moves upward and the transport mechanism 600*b* moves downward (step S7). In other words, the membrane 13 to which the substrate W is adsorbed and the transport mechanism 600*b* are separated from each other. The top ring 1 and the transport mechanism 600*b* are separated from each other after the determination means 1A performs the determination based on the flow volume, it is possible to prevent the substrate W from falling due to insufficient adsorption of the substrate W.

On the other hand, When the determination means 1A determines that the substrate W is not adsorbed to the top ring 1 (NO in step S6), the process moves to a retry mode.

As an example of the retry mode, the areas 131 to 138 are opened to the atmosphere (step S31), and the process may return to step S3 to retry the vacuuming.

As another example of the retry mode, the areas 131 to 138 are pressurized at a low pressure (for example, 50 hPa) (step S32), thereafter, the areas 131 to 138 are opened to the atmosphere (step S31), and the process may return to step S3 to retry the vacuuming. Thereby, it is possible to more reliably restore the volumes of the areas 131 to 138 and then perform vacuuming again.

As further another example of the retry mode, the top ring shaft 2 (see FIGS. 2A and 2B) is slightly (for example, 1 to 2 mm) moved upward (step S33), thereafter, the areas 131 to 138 are pressurized at a low pressure as needed (step S32), thereafter, the areas 131 to 138 are opened to the atmosphere (step S31), thereafter, the top ring shaft 2 is moved downward to the original position (step S34), and then the process may return to step S3 to retry the vacuuming. Thereby, it is possible to further reliably restore the volumes of the areas 131 to 138 and then perform vacuuming again.

Figure 7B:
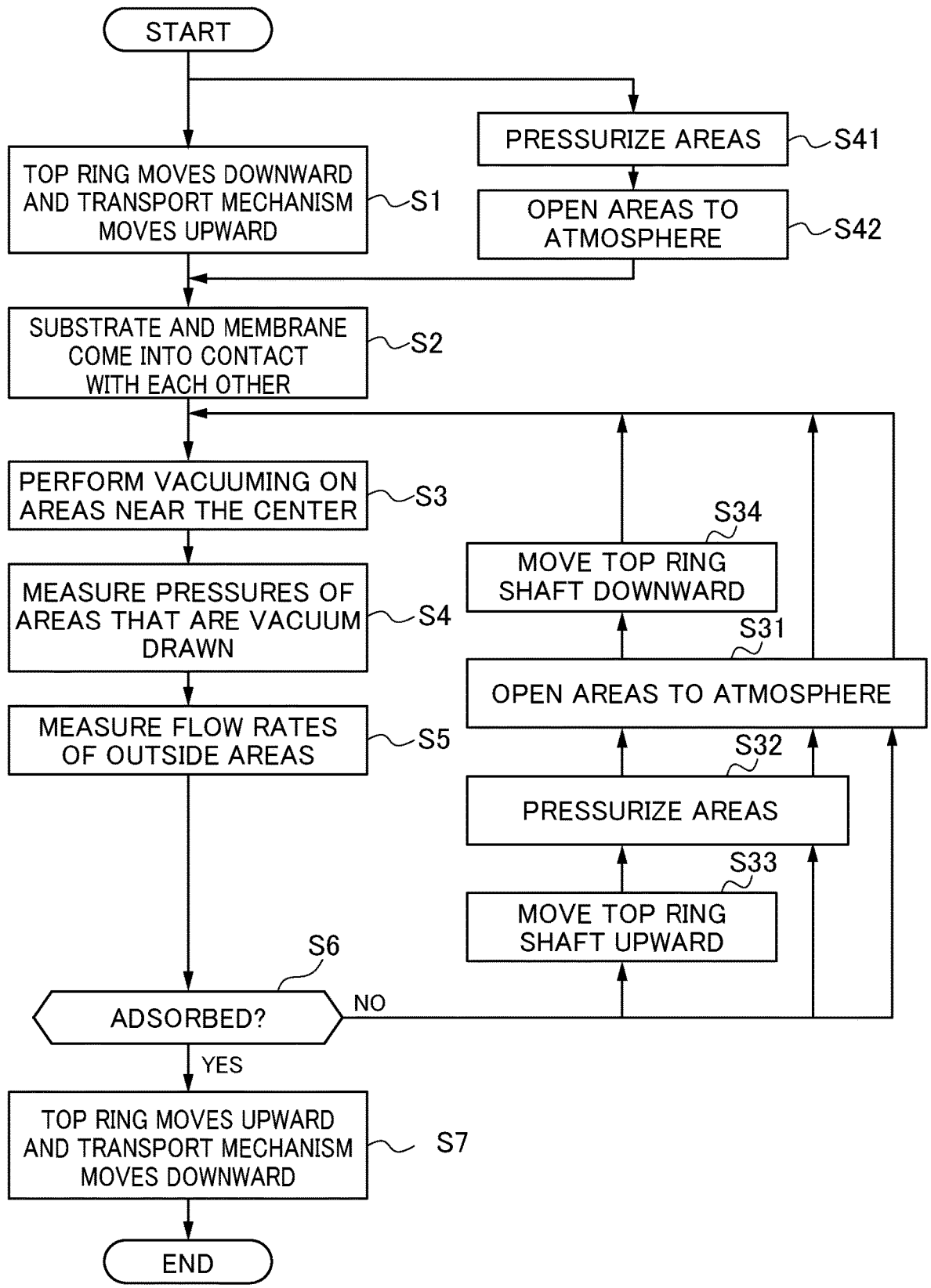
FIG. 7B is a flowchart showing a transfer procedure of the substrate W including the adsorption completion determination of the substrate W.

As shown in FIG. 7B, before the substrate W and the membrane 13 come into contact with each other (step S2), that is, for example, while or before the top ring 1 moves downward and the transport mechanism 600*b* moves upward (step S1) or before the movements, the pressure control means 15 pressurizes at least one of the areas 131 to 138, preferably the area that is vacuum drawn in step S3 (step S41). Further, after the pressurization, the area that is vacuum drawn may be set to an atmospheric pressure state by the pressure control means 15 or the area may be set to an atmospheric pressure state by providing a third valve (not shown in the drawings), which is branched in the same manner as the arrangement of the valves 171 (the valves 171*a* and 171*b*) and can communicate with the atmosphere, in addition to the valves 171, and opening only the third valve (step S42).

Thereby, even if the upper surface of the membrane 13 and the lower surface of the top ring body 11 are in a state of being closely in contact with each other, the state is cancelled by pressurization and the lower surface of the membrane 13 becomes a flat or downward convex shape with respect to the substrate W. As a result, it is possible to increase the area where the substrate W and the membrane 13 are in contact with each other. In particular, when the membrane 13 has a downward convex shape, it is possible to cause a central portion of the substrate W to be reliably in contact with the membrane 13. The substrate W is reliably adsorbed by vacuuming the central area in this state. Further, by performing such pressurization in advance before the substrate W and the membrane 13 come into contact with each other, it is possible to avoid degradation of throughput.

As described above, in the first embodiment, when the substrate W is transferred from the transport mechanism 600*b* to the top ring 1, it is determined whether the substrate W is adsorbed to the top ring 1 based on the flow volume of the gas flowing out of an area located outside the area that is vacuum drawn. Therefore, it is possible to accurately detect the completion of the transfer. Further, the completion of the transfer can be accurately detected even when there is an individual difference in the surfaces of the substrate W and the membrane 13, so that the transfer time of the substrate W can be optimized and the throughput improves.

The pressure control means 15 described in FIG. 6 is only an example and various modifications are possible.

Figure 10:
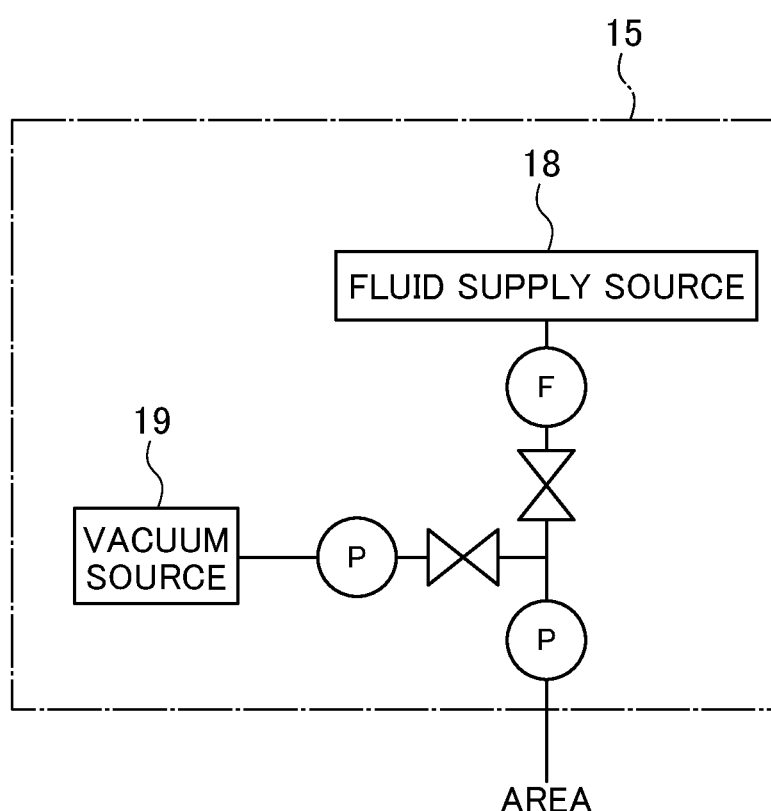
FIG. 10 is a diagram showing another example of the internal configuration of the pressure control means 15.

For example, as shown in FIG. 10, a pipe is branched into a fork and a pressure gauge P may be arranged between an arbitrary area and the branch point. The fluid supply source 18 may be arranged at a tip of one branch, and a valve and a flow meter F may be arranged between the branch point and the fluid supply source 18. The vacuum source 19 may be arranged at a tip of the other branch, and a valve and a pressure gauge P may be arranged between the branch point and the vacuum source 19. When the fluid supply source 18 is, for example, an electropneumatic regulator, a state equivalent to open to the atmosphere is obtained by setting a pressure command to the atmospheric pressure (zero pressure).

Figure 11:
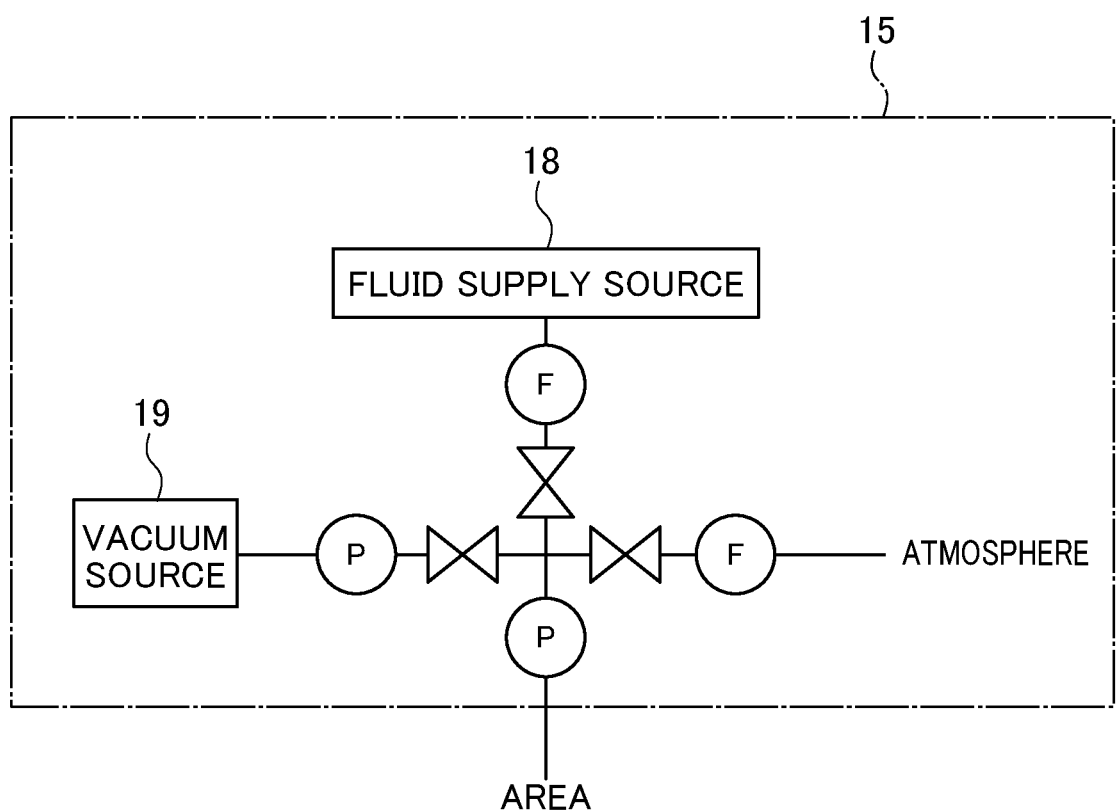
FIG. 11 is a diagram showing further another example of the internal configuration of the pressure control means 15.

As shown in FIG. 11, a pipe is branched into three and a pressure gauge P may be arranged between an arbitrary area and the branch point. The fluid supply source 18 may be arranged at a tip of one branch, and a valve and a flow meter F may be arranged between the branch point and the fluid supply source 18. The vacuum source 19 may be arranged at a tip of another branch, and a valve and a pressure gauge P may be arranged between the branch point and the vacuum source 19. Further, a tip of the other branch may be opened to the atmosphere, and a valve and a flow meter F may be arranged between the tip and the branch point.

(Second Embodiment)

The first embodiment described above is related to an operation in which the substrate W is transferred from the transport mechanism 600b to the top ring 1. On the other hand, in a second embodiment described below is related to an operation in which the substrate W is adsorbed to the top ring 1 when the top ring 1 is detached from the polishing table 3 after the polishing of the substrate W has been completed. Hereinafter, differences from the first embodiment will be mainly described.

Figure 12:
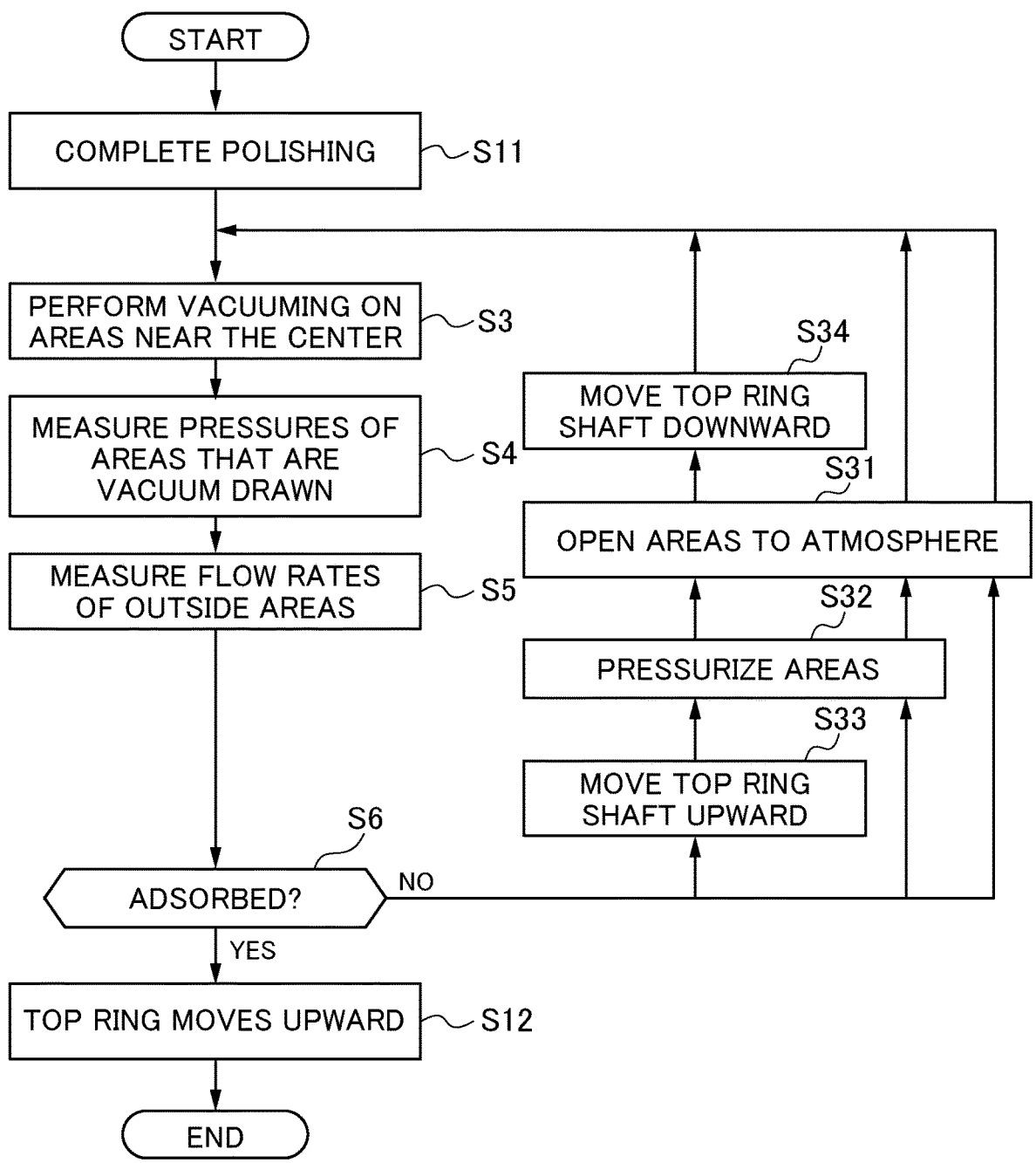
FIG. 12 is a flowchart showing an adsorption procedure of the substrate W including the adsorption completion determination of the substrate W.

FIG. 12 is a flowchart showing an adsorption procedure of the substrate W including an adsorption completion determination of the substrate W. The same processes as those in FIG. 7A are denoted by the same reference symbols.

The polishing of the substrate W held by the top ring 1 is completed in the manner as described with reference to FIGS. 2A and 2B (step S11). In this state, the upper surface of the substrate W is in contact with the lower surface of the membrane 13 by using the polishing table 3 as a support member. When polishing the substrate W, any of the areas 131 to 138 may be pressurized to press the substrate W against the polishing table 3 in order to efficiently perform the polishing. Therefore, when the substrate W is moved from the polishing table 3 after the completion of the polishing, it is necessary to cause the substrate W to be adsorbed to the top ring 1 again.

Therefore, the operation of steps S3 to S6 is performed in the same manner as in FIG. 7A. Specifically, first, the pressure control means 15 performs vacuuming of the central area (step S3). Here, there is the polishing liquid supplied from the nozzle 4 between the polishing surface 3a and the substrate W. Therefore, a somewhat high adsorption force is required to cause the substrate W to be separated from the polishing surface 3a and to be adsorbed to the top ring 1. Therefore, even in a case in which only the central area 131 has to be vacuum drawn when the substrate is transferred from the transport mechanism 600b to the top ring 1 as described in the first embodiment, the areas 131 to 134 may be required to be vacuum drawn in the present embodiment.

Thereafter, each pressure gauge measures the pressure of an area that is vacuum drawn (step S4) and each flow meter measures the flow volume of an area outside the areas that are vacuum drawn (step S5). Then, the determination means 1A determines whether the substrate W is adsorbed to the top ring 1 (more specifically, the lower surface of the membrane 13 of the top ring 1) (step S6). When the adsorption is confirmed, the top ring 1 moves upward (step S12), so that the membrane 13 to which the substrate W is adsorbed is separated from the polishing table 3.

As described above, in the second embodiment, when the substrate W is adsorbed to the top ring 1 after the polishing of the substrate W, it is determined whether the substrate W is adsorbed to the top ring 1 based on the flow volume of the gas flowing out of areas located outside the areas that are vacuum drawn. Therefore, it is possible to accurately detect the completion of the adsorption in the same manner as in the first embodiment. Further, the completion of the transfer can be accurately detected even when there is an individual difference in the surfaces of the substrate W and the membrane 13, so that the adsorption time of the substrate W can be optimized and the throughput improves.

(Third Embodiment)

As described in BACKGROUND AND SUMMARY, the substrate is vacuum drawn from a hole formed in the membrane, so that the substrate is adsorbed to the membrane. However, there is a case in which liquid such as water enters an area that includes the hole and thereby the pressure applied to the substrate becomes unstable. Therefore, in recent years, the hole formed in the membrane tends to be small as much as possible. Further, the substrate may be adsorbed by deforming the surface shape of the membrane by vacuuming without using the hole.

When the hole is small or no hole is made, a force of adsorbing the substrate becomes small. If the top ring is moved before the substrate is sufficiently adsorbed to the top ring, the substrate may fall. Therefore, it is necessary to detect that the substrate is adsorbed to the top ring and the transfer from the transport mechanism is completed. Normally, the vacuum pressure of the area that is vacuum drawn is measured, and it is determined that the transfer of the substrate is completed when the vacuum pressure reaches a predetermined threshold value.

However, even when the determination is performed based on the vacuum pressure of the area that is vacuum drawn, a sufficient adhesive force is not necessarily generated between the substrate and the membrane. Therefore, for safety's sake, it is required to set a severe threshold value or move the top ring after waiting a predetermined time when the threshold value is reached. Doing so makes the transfer time of the substrate longer than the time originally required, so that there is a problem that the throughput decreases.

Further, even after the substrate is once adsorbed, there may be a case in which the adsorption force decreases when the top ring transports the substrate and the substrate falls.

The third to the sixth embodiments have been made in view of the above problems and an object of the third to the sixth embodiments are to provide an elastic film and a substrate holding apparatus that can appropriately handle a substrate, a substrate polishing apparatus including such substrate holding apparatus, and a substrate adsorption determination method and a pressure control method for such substrate holding apparatus.

Figure 13:
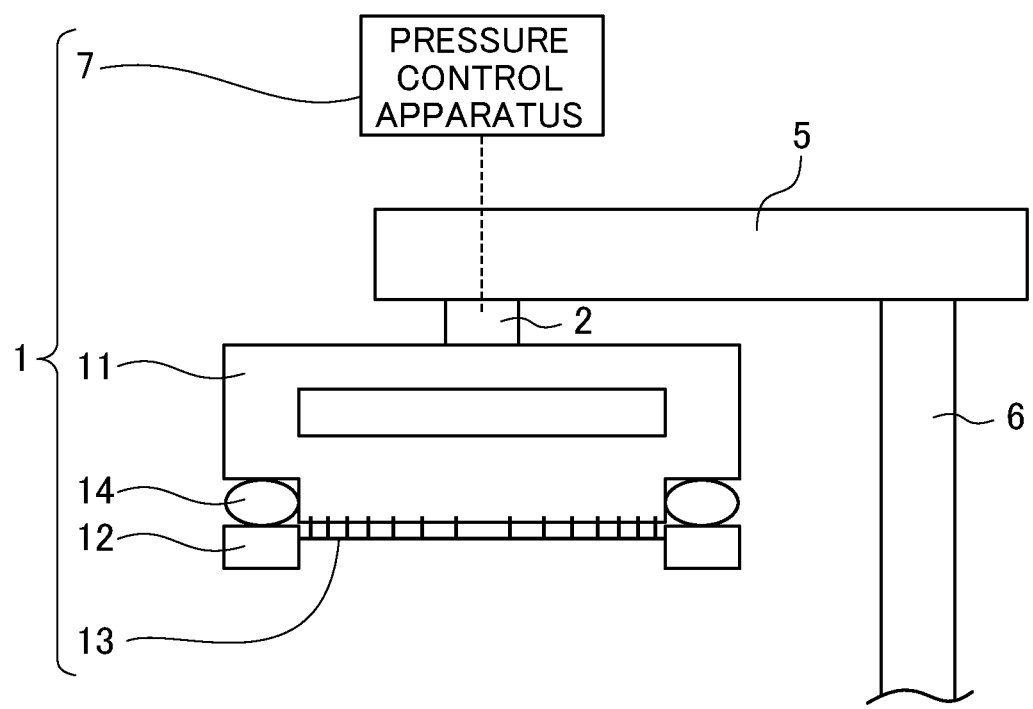
FIG. 13 is a schematic cross-sectional view of the substrate polishing apparatus 300.

FIG. 13 is a schematic cross-sectional view of the substrate polishing apparatus 300 according to the present embodiment. FIG. 13 corresponds to FIG. 2B. Hereinafter, the present embodiment will be described with reference to FIGS. 2A and 13. The substrate polishing apparatus 300 includes a top ring 1, a top ring shaft 2 where the top ring 1 is connected to a lower part of the top ring shaft 2, a polishing table 3 having a polishing pad 3a, a nozzle 4 that supplies polishing liquid on the polishing table 3, a top ring head 5, and a support shaft 6.

The top ring 1 holds the substrate W, and as shown in FIG. 13, the top ring 1 includes a top ring body 11 (a carrier), a ring-shaped retainer ring 12, a flexible membrane 13 (an elastic film) that is provided below the top ring body 11 and inside the retainer ring 12, an air bag 14 provided between the top ring body 11 and the retainer ring 12, and a pressure control apparatus 7.

The retainer ring 12 is provided on the outer circumference portion of the top ring body 11. The circumferential edge of the held substrate W is surrounded by the retainer ring 12, so that the substrate W does not run away from the top ring 1 during polishing. The retainer ring 12 may be a single member or may have a double ring structure including an inner ring and an outer ring provided outside the inner ring. In the latter case, it is possible that the outer ring is fixed to the top ring body 11 and an air bag 14 is provided between the inner ring and the top ring body 11.

The membrane 13 is provided facing the top ring body 11. The upper surface of the membrane 13 forms a plurality of concentric areas between the membrane 13 and the top ring body 11. By depressing one or a plurality of areas, the lower surface of the membrane 13 can hold the upper surface of the substrate W.

The air bag 14 is provided between the top ring body 11 and the retainer ring 12. The retainer ring 12 can relatively move in the vertical direction with respect to the top ring body 11 by the air bag 14.

The pressure control apparatus 7 supplies fluid to areas between the top ring body 11 and the membrane 13, performs vacuuming of the areas, and opens the areas to the atmosphere, so that the pressure control apparatus 7 individually adjusts the pressure of each area formed between the top ring body 11 and the membrane 13. Further, the pressure control apparatus 7 determines whether the substrate W is adsorbed to the membrane 13. The configuration of the pressure control apparatus 7 will be described later in detail.

In FIG. 2A, the lower end of the top ring shaft 2 is connected to the center of the upper surface of the top ring 1. An elevating mechanism not shown in the drawings moves up and down the top ring shaft 2, so that the lower surface of the substrate W held by the top ring 1 is attached to and detached from the polishing pad 3a. Further, a motor not shown in the drawings rotates the top ring shaft 2, so that the top ring 1 rotates and the substrate W held by the top ring 1 also rotates.

The polishing pad 3a is provided on the upper surface of the polishing table 3. The lower surface of the polishing table 3 is connected to a rotating shaft, so that the polishing table 3 is rotatable. The polishing liquid is supplied from the nozzle 4, and the substrate W and the polishing table 3 rotate in a state in which the lower surface of the substrate W is in contact with the polishing pad 3a, so that the substrate W is polished.

The top ring shaft 2 is connected to one end of the top ring head 5 in FIG. 13 and the support shaft 6 is connected to the other end of the top ring head 5. When a motor not shown in the drawings rotates the support shaft 6, the top ring head 5 swings, so that the top ring 1 moves back and forth between a position on the polishing pad 3a and a substrate transfer position (not shown in the drawings).

Next, an operation to transfer the substrate from the transport mechanism 600b in FIG. 1 to the top ring 1 in FIGS. 2A and 13 will be described with reference to FIGS. 3A to 3C and 4.

As shown in FIG. 3A, the substrate W is mounted on the hand 601 of the transport mechanism 600b. The retainer ring station 800 is used for the transfer of the substrate W. The retainer ring station 800 has a push-up pin 801 that pushes up the retainer ring 12 of the top ring 1. Although the retainer ring station 800 may have a release nozzle, the release nozzle is not shown in the drawings.

As shown in FIG. 4, the hand 601 supports parts of outer circumference of the lower surface of the substrate W. The push-up pin 801 and the hand 601 are arranged not to be in contact with each other.

In a state shown in FIG. 3A, the top ring 1 moves downward and the transport mechanism 600b moves upward. The top ring 1 moves downward, so that the push-up pin 801 pushes up the retainer ring 12 and the substrate W approaches the membrane 13. When the transport mechanism 600b moves further upward, the upper surface of the substrate W comes into contact with the lower surface of the membrane 13 (FIG. 3B).

In this state, an area formed between the membrane 13 and the top ring body 11 is depressurized, so that the substrate W is adsorbed to the lower surface of the membrane 13 of the top ring 1. However, depending on circumstances, there may be a case in which the substrate W is not adsorbed to the lower surface of the membrane 13, or the substrate W falls after once being adsorbed. Therefore, in the present embodiment, a determination of whether the substrate W is adsorbed to the membrane 13 (a substrate adsorption determination) is performed as described later.

Thereafter, the transport mechanism 600b moves downward (FIG. 3C).

Next, the top ring 1 will be described.

Figure 14A:
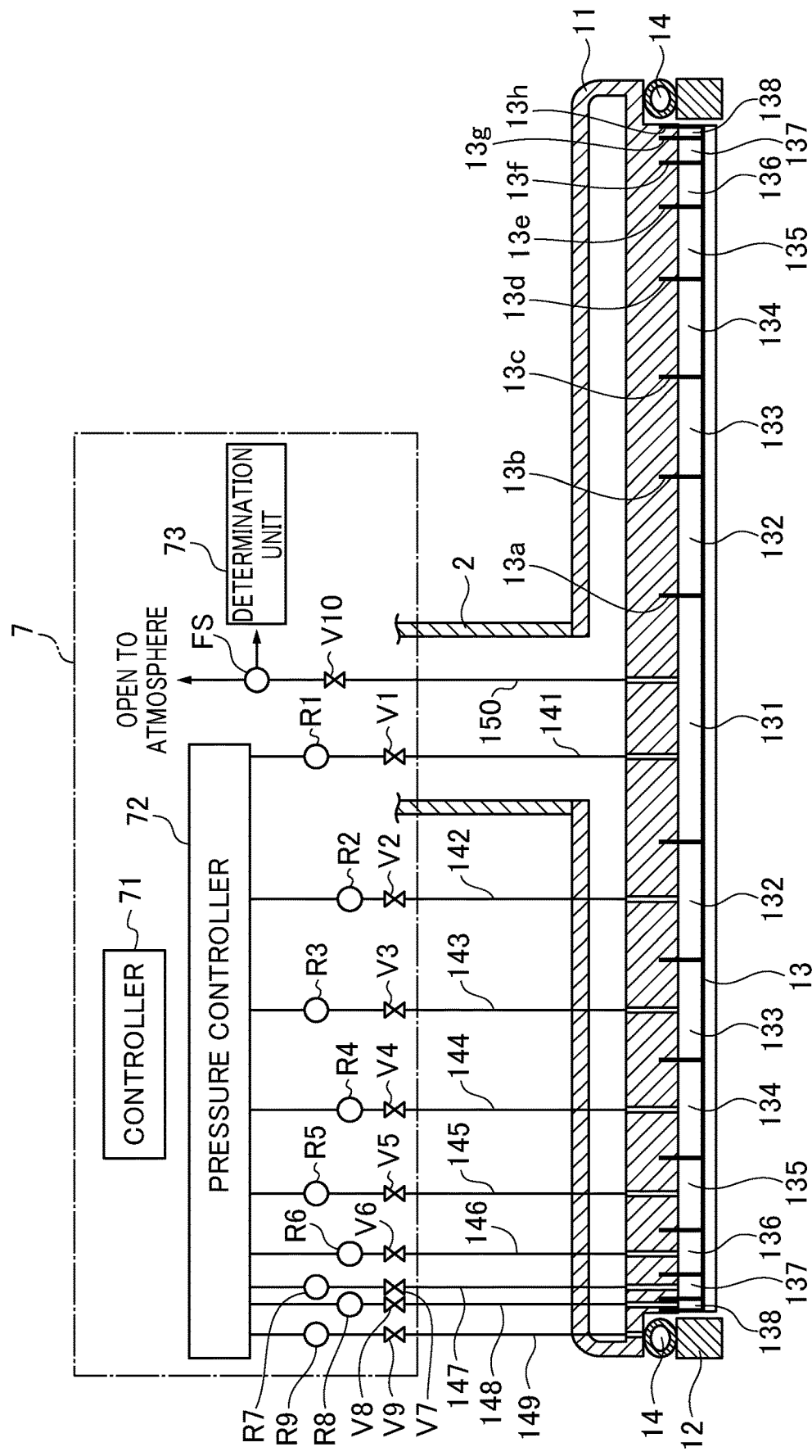
FIG. 14A is a cross-sectional view schematically showing a structure of the top ring 1 in a third embodiment.

FIG. 14A is a cross-sectional view schematically showing a structure of the top ring 1 in the third embodiment. Circumferential walls 13a to 13h extending upward toward the top ring body 11 are formed on the membrane 13. By these circumferential walls 13a to 13h, concentric areas 131 to 138, which are divided by the circumferential walls 13a to 13h, are formed between the upper surface of the membrane 13 and the lower surface of the top ring body 11. It is desirable that no hole is formed in the lower surface of the membrane 13.

Flow paths 141 to 148 which penetrate the top ring body 11 and whose one ends communicate with the areas 131 to 138, respectively, are formed. An air bag 14 made of an elastic film is provided directly on the retainer ring 12 and a flow path 149 whose one end communicates with the air bag 14 is formed in the same manner. The other ends of the flow paths 141 to 149 are connected to the pressure control apparatus 7. Pressure sensors and flow volume sensors may be provided on the flow paths 141 to 149.

Further, for the substrate adsorption determination, a flow path 150 which penetrates the top ring body 11 and whose one end communicates with the area 131 is formed. The other end of the flow path 150 is opened to the atmosphere.

The pressure control apparatus 7 includes valves V1 to V9 and pressure regulators R1 to R9 which are respectively provided to the flow paths 141 to 149, a controller 71, and a pressure adjustor 72. Further, for the substrate adsorption determination, the pressure control apparatus 7 includes a valve V10 and a flow meter FS which are provided on the flow path 150 and a determination unit 73. When the valve V10 is closed, no flow occurs, so that an arrangement order of the valve V10 and the flow meter FS does not matter.

The controller 71 controls the valves V1 to V10, the pressure regulators R1 to R9, and the pressure adjustor 72.

The pressure adjustor 72 is connected to one ends of the flow paths 141 to 149 and performs pressure adjustment of the areas 131 to 138 and the air bag 14 according to control of the controller 71. Specifically, the pressure adjustor 72 pressurizes the areas 131 to 138 and the airbag 14 by supplying a fluid such as air through the flow paths 141 to 149, depressurizes the areas 131 to 138 and the air bag 14 by performing vacuuming, and opens the areas 131 to 138 and the air bag 14 to the atmosphere.

Figure 14B:
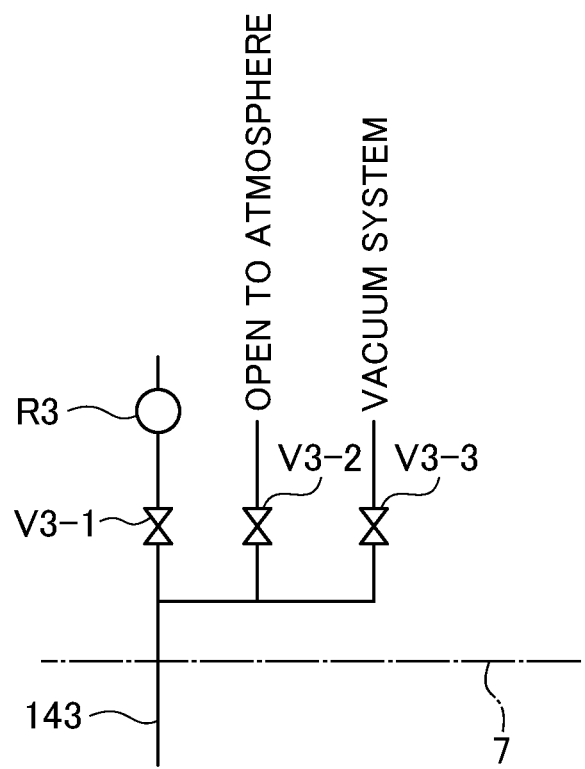
FIG. 14B is a modified example of FIG. 14A.

In the case of FIG. 14A, an example is shown in which the valves V1 to V9 are connected to the flow paths 141 to 149, respectively. FIG. 14B is a modified example of FIG. 14A and a plurality of valves may be connected to each of the flow paths 141 to 149. As an example, FIG. 14B shows a case in which three valves V3-1, V3-2, and V3-3 are connected to the flow path 143. The valve V3-1 is connected to a pressure regulator R3, the valve V3-2 is connected to an atmosphere open source, and the valve V3-3 is connected to a vacuum source. When pressurizing the area 133, the valves V3-2 and V3-3 are closed, the valve V3-1 is opened, and the pressure regulator R3 is activated. When causing the area 133 to be in an atmosphere open state, the valves V3-1 and V3-3 are closed and the valve V3-2 is opened. When causing the area 133 to be in a vacuum state, the valves V3-1 and V3-2 are closed and the valve V3-3 is opened.

In FIG. 14A, for example, to pressurize the area 135, the controller 71 opens the valve V5 and controls the pressure adjustor 72 so that air is supplied to the area 135. This is simply represented as the controller 71 pressurizes the area 135" or the like.

The flow meter FS measures a flow volume of fluid flowing in the flow path 150, in other words, a flow volume of fluid flowing to the area 131, and notifies the determination unit 73 of a measurement result. Unless otherwise noted, the flow volume is a volume of fluid (in particular, air) flowing per unit time. The arrangement position of the flow meter FS is not limited as long as the flow meter FS can measure the flow volume of the flow path 150. The flow path 141 and the flow path 150 are connected to each other, so that the flow meter FS may be arranged, for example, in the flow path 141.

The determination unit 73 performs the substrate adsorption determination based on the flow volume measured by the flow meter FS.

Figure 15:
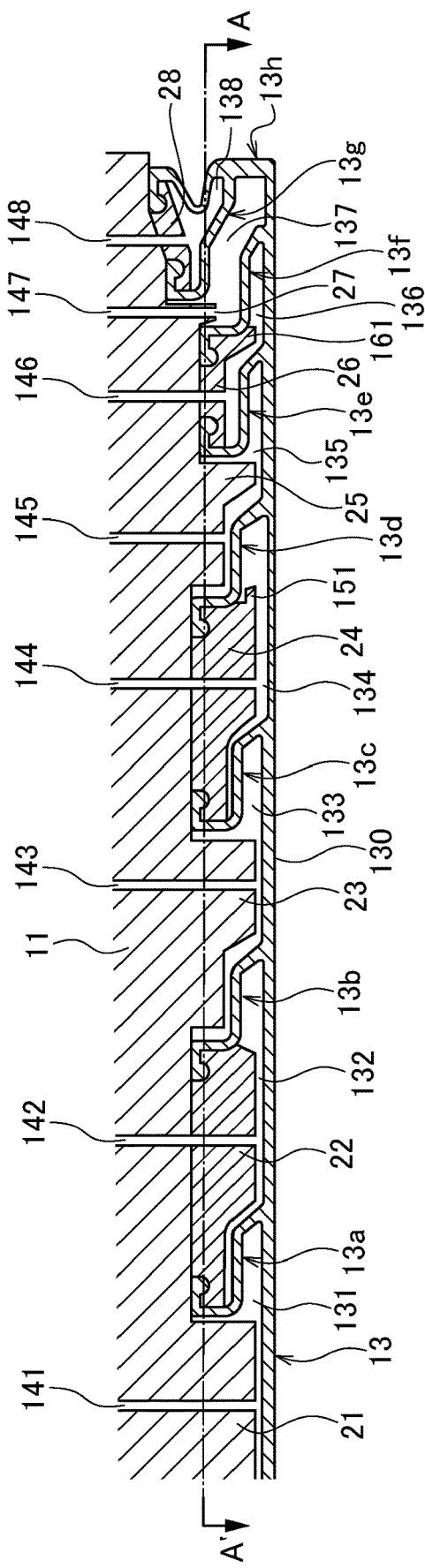
FIG. 15 is a cross-sectional view showing details of a top ring body 11 and a membrane 13 in the top ring 1.

FIG. 15 is a cross-sectional view showing details of the top ring body 11 and the membrane 13 in the top ring 1. As shown in FIG. 15, the membrane 13 includes a circular contact portion 130 that comes into contact with the substrate W and eight circumferential walls 13a to 13h that are directly or indirectly connected to the contact portion 130. The contact portion 130 holds the substrate W by coming into contact with the rear surface of the substrate W, that is, a surface opposite to the surface to be polished. The contact portion 130 presses the substrate W against the polishing pad 3a during polishing. The circumferential walls 13a to 13h are concentrically arranged ring-shaped circumferential walls.

The upper ends of the circumferential walls 13a to 13h are sandwiched by holding rings 22, 24, 26, and 28 and the lower surface of the top ring body 11, and are attached to the top ring body 11. The holding rings 22, 24, 26, and 28 are detachably fixed to the top ring body 11 by a holding means (not shown in the drawings). Therefore, when the holding means is unlocked, the holding rings 22, 24, 26, and 28 are detached from the top ring body 11, so that the membrane 13 can be removed from the top ring body 11. A screw and the like may be used as the holding means.

The holding rings 22, 24, 26, and 28 are located inside the areas 132, 134, 136, and 138, respectively. The flow paths 142, 144, 146, and 148 penetrate the top ring body 11 and the holding rings 22, 24, 26, and 28, respectively. The top ring body 11 has protrusion portions 21, 23, 25, and 27 that protrude downward toward the areas 131, 133, 135, and 137, respectively. The flow paths 141, 143, 145, and 147 penetrate the protrusion portions 21, 23, 25, and 27, respectively. Although not shown in the drawings, the flow path 150 penetrates the protrusion portion 21.

It is desirable that the lower surfaces of the holding rings 22, 24, 26, and 28 and those of the protrusion portions 21, 23, 25, and 27 are on the same plane. This is because these lower surfaces form a reference surface when the substrate W is adsorbed and held.

There is a gap g (shown later in FIG. 19 and the like), through which air can flow from the flow path 141 to the flow path 150, between these lower surfaces and the membrane 13. When the substrate W is adsorbed to the lower surface of the membrane 13, the membrane 13 is drawn up toward the top ring body 11, so that the gap g almost disappears. If the gap g is too small, a difference of change of the gap g is small between when the substrate W is adsorbed and when the substrate W is not adsorbed, as a result, a margin of determination becomes small. On the other hand, if the gap g is too large, it is necessary to largely contract the circumferential walls 13a to 13h of the membrane 13 when adsorbing the substrate. As a result, a downward repulsive force from the circumferential walls 13a to 13h to the substrate W becomes large, so that the adsorption force decreases or the substrate may be damaged.

It is necessary to appropriately set the width of the gap g by considering the above. Specifically, the width of the gap g is desirable to be about 0.1 to 2 mm, and is more desirable to be about 0.5 mm.

Figure 16:
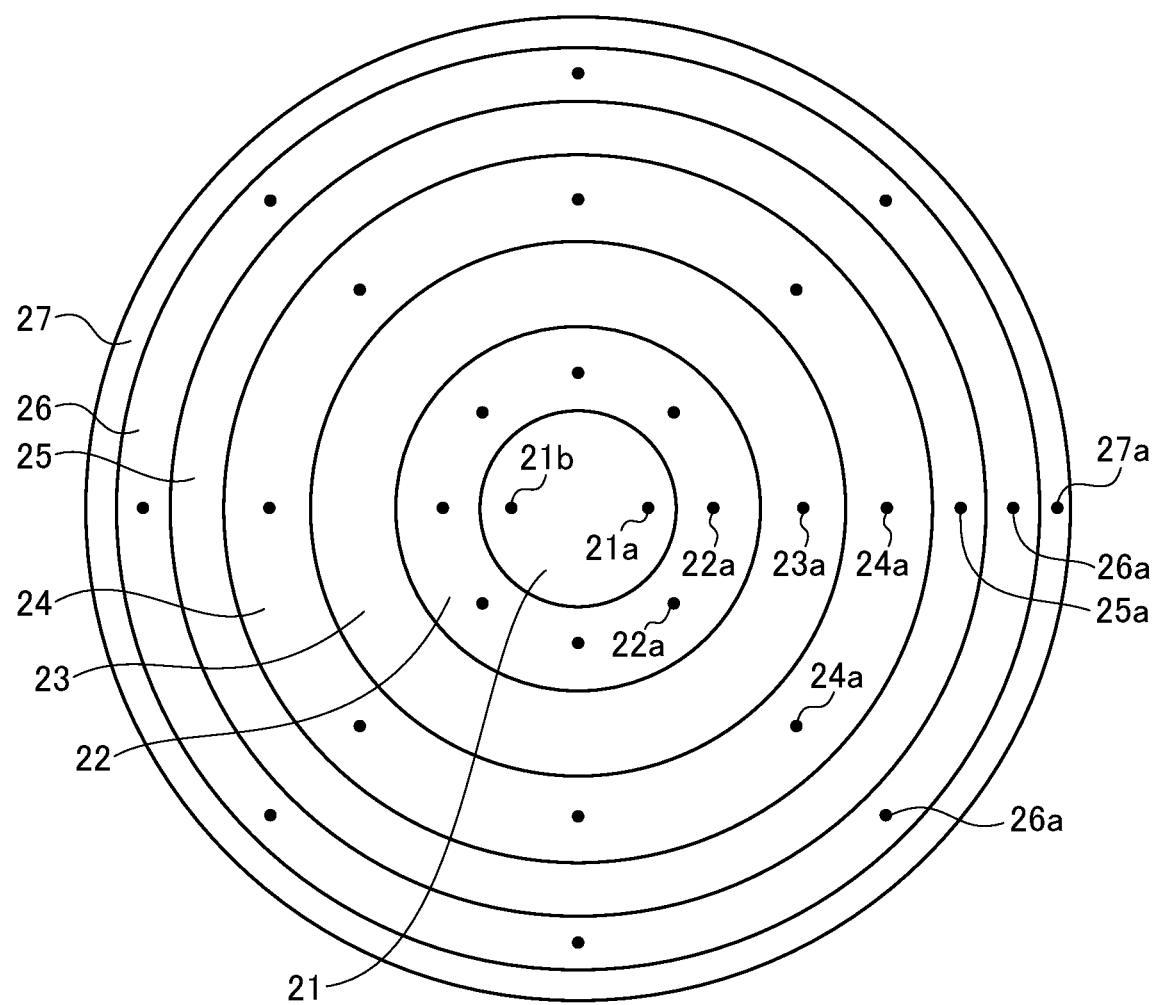
FIG. 16 is a cross-sectional view taken along line A-A' in FIG. 15.

FIG. 16 is a cross-sectional view taken along line A-A' in FIG. 15. As shown in FIG. 16, a hole 21a that communicates with the flow path 141 (FIG. 14A) and a hole 21b that communicates with the flow path 150 are formed in the protrusion portion 21. Holes 23a, 25a, and 27a that communicate with the flow paths 143, 145, and 147, respectively, are formed in the protrusion portions 23, 25, and 27, respectively. Holes 22a, 24a, and 26a that communicate with the flow paths 142, 144, and 146, respectively, are formed in the holding rings 22, 24, and 26, respectively. The number of the holes and the arrangement of the holes are not particularly limited.

FIG. 17 is a diagram for explaining an operation of each valve in the top ring 1. When adsorbing or polishing the substrate W, the pressures of any one or more of the areas 132 to 137 should be adjusted. Hereinafter, a case in which the pressure of the area 133 is adjusted will be described, and the pressures of the other areas 132 and 134 to 137 can be arbitrarily adjusted.

When opening the membrane 13 during idling or the like, the controller 71 opens the valves V1, V3, and V10 and opens the areas 131 and 133 to the atmosphere.

When polishing the substrate W, the controller 71 opens the valves V1 and V3 to pressurize the areas 131 and 133 and closes the valve V10 in order to pressurize the membrane 13 to press the substrate W against the polishing pad 3a.

When the substrate W is transferred from the transport mechanism 600b to the top ring 1 to be adsorbed by the membrane 13, the controller 71 opens the valve V3 to depressurize the area 133. Further, to perform the substrate adsorption determination, the controller 71 opens the valve V10 to open the area 131 to the atmosphere while opening the valve V1 to somewhat pressurize the area 131. Then, based on a value measured by the flow meter FS, the determination unit 73 determines whether the substrate is adsorbed to the membrane 13 as described below.

Figure 18:
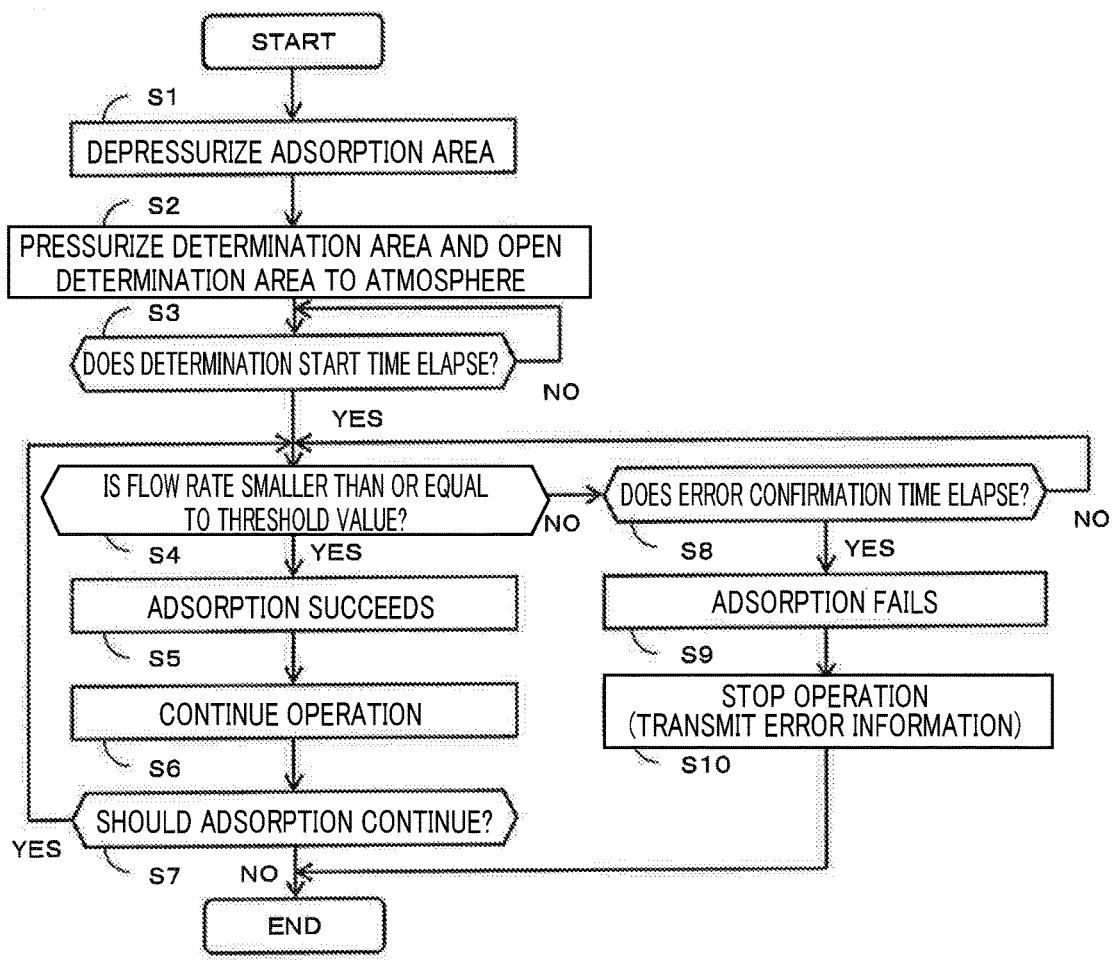
FIG. 18 is a flowchart showing a procedure of substrate adsorption determination.

FIG. 18 is a flowchart showing a procedure of the substrate adsorption determination. Hereinafter, the area 131 where the flow meter FS is provided is referred to as a "determination area" and the area 133 which is depressurized for adsorption is referred to as an "adsorption area".

First, the controller 71 depressurizes the adsorption area 133 (step S1). Then, the controller 71 opens the valve V1 to pressurize the determination area 131 and opens the valve V10 to open the determination area 131 to the atmosphere (step S2). In other words, while the controller 71 pressurizes the determination area 131 through the flow path 141, the controller 71 opens the determination area 131 to the atmosphere through the flow path 150.

In step S1, the controller 71 depressurizes the adsorption area 133 to about −500 hPa. On the other hand, in step S2, the controller 71 pressurizes the adsorption area 131 to about 200 hPa or less and desirably to about 50 hPa. This is because when the determination area 131 is too pressurized, a force applied downward to the substrate W increases and the force impedes adsorption of the substrate.

Subsequently, the determination unit 73 waits until a predetermined determination start time T0 elapses (step S3). When the determination start time T0 elapses, the determination unit 73 compares a flow volume measured by the flow meter FS and a predetermined threshold value and determines whether the substrate W is adsorbed to the membrane 13 (step S4).

Figure 19:
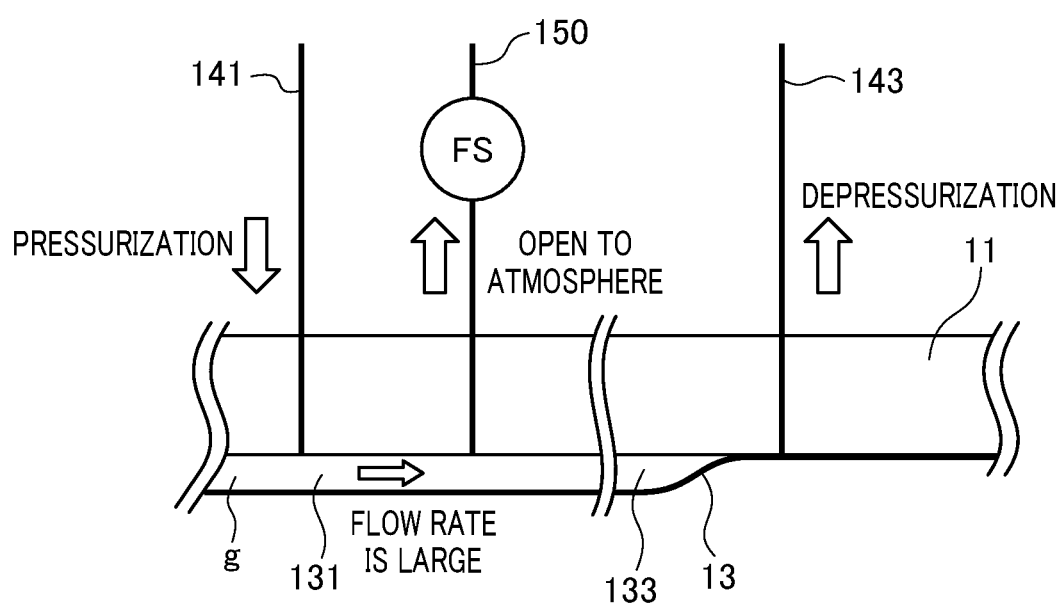
FIG. 19 is a diagram schematically showing cross sections of the membrane 13 and the top ring body 11 when adsorption fails.

FIG. 19 is a diagram schematically showing cross sections of the membrane 13 and the top ring body 11 when the adsorption fails. The membrane 13 has flexibility, so that when the substrate W is not adsorbed, although a part of the membrane 13 corresponding to the adsorption area 133 is drawn up to the top ring body 11, a part of the membrane 13 corresponding to the determination area 131 is not drawn up and a gap g remains between the part and the top ring body 11. Therefore, the flow volume measured by the flow meter FS becomes large.

Figure 20:
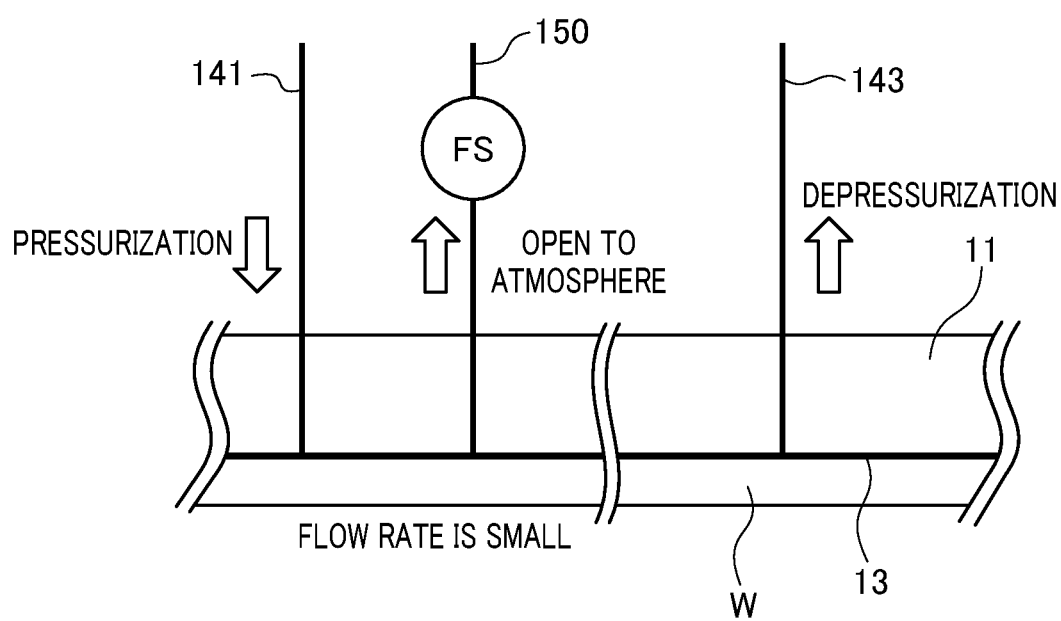
FIG. 20 is a diagram schematically showing cross sections of the substrate W, the membrane 13, and the top ring body 11 when adsorption succeeds.

FIG. 20 is a diagram schematically showing cross sections of the substrate W, the membrane 13, and the top ring body 11 when the adsorption succeeds. When the substrate W is adsorbed, the entire membrane 13 including the area corresponding to the determination area 131 is drawn up and the membrane 13 is closely attached to the top ring body 11. Therefore, the gap g almost disappears and the flow volume measured by the flow meter FS becomes small.

As known from the above, the flow volume of fluid flowing in the determination area 131 corresponds to the size of the gap g, and the greater the gap g is, the greater the flow volume is.

Therefore, when the flow volume is smaller than or equal to the threshold value (that is, when the gap g is small), the determination unit 73 determines that the adsorption of the substrate W succeeds (or the substrate W is adsorbed) (YES in step S4 in FIG. 18, S5, and FIG. 20). The substrate processing apparatus continues an operation such as transport of the substrate W by the top ring 1 (step S6). Thereafter, when the adsorption of the substrate W should continue (YES in step S7), the determination of step S4 is repeatedly performed.

On the other hand, when the flow volume is greater than the threshold value (that is, when the gap g is large) even after a predetermined error confirmation time elapses, the determination unit 73 determines that the adsorption of the substrate W fails (or the substrate W is not adsorbed) (NO in S4, YES in S8, S9, and FIG. 19). The substrate processing apparatus stops operation and transmits error information as needed (step S10).

In the present embodiment, even after it is confirmed that the substrate W is adsorbed to the membrane 13, the determination is continuously performed (YES in step S7, and S4). Therefore, when the substrate W falls while the substrate W is being transported and so on, the flow volume becomes greater than the threshold value, so that it is possible to detect that the substrate W is not present (step S9).

Figure 21:
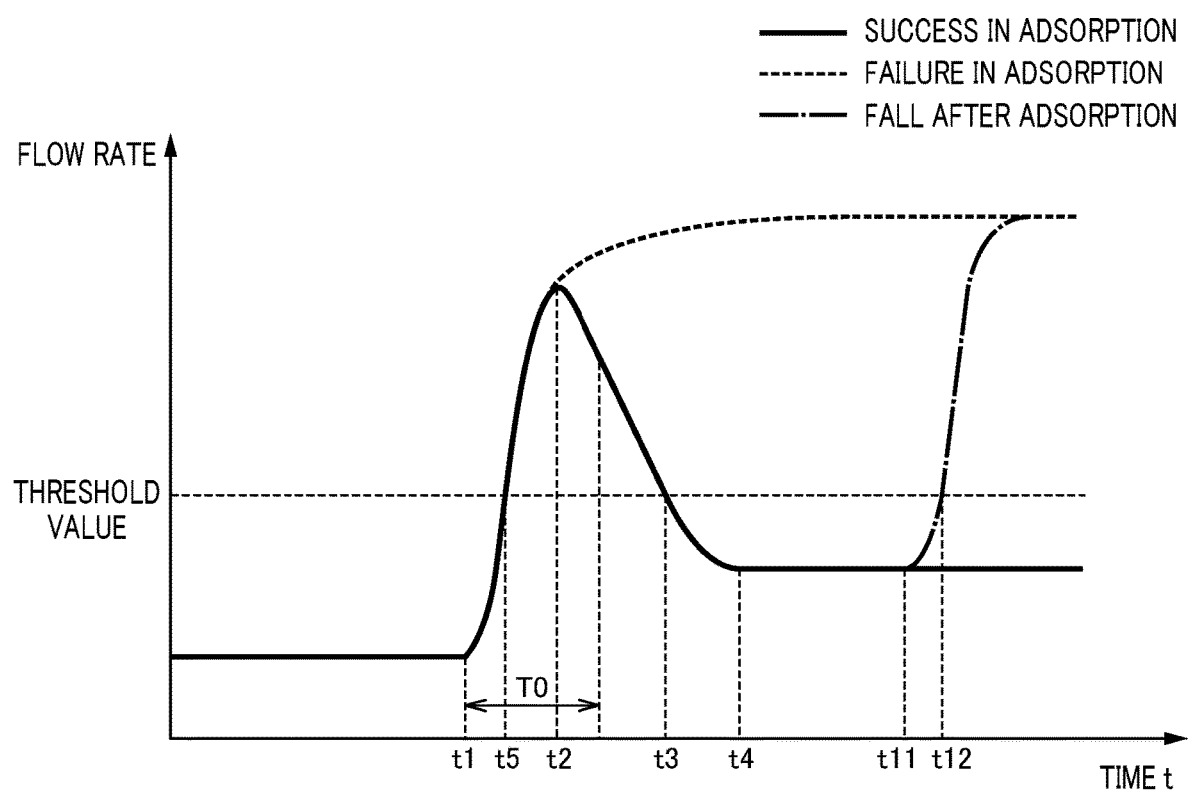
FIG. 21 is a diagram schematically showing flow volumes measured by a flow meter FS after starting adsorption.

FIG. 21 is a diagram schematically showing flow volumes measured by the flow meter FS after starting the adsorption. The solid line indicates a flow volume measured by the flow meter FS in a case in which the adsorption succeeds. The dashed line indicates a flow volume measured by the flow meter FS in a case in which the adsorption fails. The dashed-dotted line indicates a flow volume measured by the flow meter FS in a case in which the adsorption once succeeds but the substrate W falls after that. The horizontal axis indicates time.

As shown in FIG. 21, when the adsorption is started at a time point t1 (step S1 in FIG. 18), the flow volume increases. This is because, regardless of success or failure of the adsorption, at the time point when the adsorption is started, there is a gap g between the upper surface of the membrane 13 and the lower surface of the top ring body 11, so that air flows.

When the adsorption succeeds (the solid line in FIG. 21), the substrate W is adsorbed to the membrane 13, so that the gap g between the membrane 13 and the top ring body 11 becomes small. Therefore, after a certain time point t2, the flow volume begins to decrease. At a time point t3 at which the flow volume becomes smaller than the threshold value, it is determined that the adsorption succeeds (step S5 in FIG. 18). Thereafter, when the substrate W is completely adsorbed to the membrane 13 at a time point t4 in FIG. 21, the gap g between the membrane 13 and the top ring body 11 almost disappears, so that the flow volume becomes substantially constant.

If the substrate W falls from the top ring 1 at a time point t11, the flow volume increases again (the dashed-dotted line in FIG. 21). This is because the substrate W is separated from the membrane 13 and therefore the gap g is generated again between the membrane 13 and the top ring body 11. In this case, after a predetermined error confirmation time elapses from a time point t12 at which the flow volume becomes greater than the threshold value (step S8), it is determined that the adsorption fails (step S9 in FIG. 18).

On the other hand, when the adsorption fails (the dashed line in FIG. 21), the flow volume continues to increase also after the time point t2 and becomes constant before long. Therefore, the flow volume is still greater than the threshold value even after the error confirmation time elapses, so that it is determined that the adsorption fails (step S9 in FIG. 18).

The reason why the determination start time T0 is set is to prevent the substrate from being determined to be adsorbed to the membrane before the substrate is fully adsorbed to the membrane (before a time point t5 in FIG. 21). The error confirmation time is required also in the case described below. This is because when the substrate W adsorbed to the top ring 1 is drawn up from the polishing pad 3a after the polishing, the flow volume may temporarily increase and exceed the threshold value due to an adsorption force between the polishing pad 3a and the substrate W.

As described above, in the third embodiment, the determination area 131 is pressurized and opened to the atmosphere, and the flow volume of the area 131 is measured. The flow volume corresponds to the size of the gap g between the membrane 13 and the top ring body 11. Therefore, it is possible to accurately determine whether the adsorption of the substrate W succeeds by monitoring the flow volume, so that it is possible to appropriately handle the substrate W. Further, it is possible to continue the determination after the substrate W is adsorbed, so that even when the substrate W falls after the adsorption once succeeds, it is possible to detect that the substrate W falls.

In the present embodiment, the flow path 150 is opened to the atmosphere. However, for example, the flow volume may be adjusted in a flow volume range appropriate to detect the adsorption of the substrate by using the valve V10 as a flow volume adjustment valve, or the flow volume may be adjusted or air may be exhausted by connecting a pressure regulator instead of opening the flow path to the atmosphere. When connecting a pressure regulator to the flow path 150, for example, R1 is set to 100 hPa pressure and the added pressure regulator is set to 50 hPa pressure, and thereby air is flown through the flow path 150.

It is possible to apply the substrate adsorption determination of the present embodiment to the membrane 13 where no hole is formed. Further, the valve V10 is opened when the substrate adsorption determination is performed, so that the determination area 131 is not closed and the pressure of the determination area 131 does not become so high. Therefore, the determination area 131 in the membrane 13 rarely applies stress to the substrate W.

In the present embodiment, the central area 131 is used as the determination area and the area 133 is used as the adsorption area. However, other areas may be used as the determination area and the adsorption area. In other words, it is possible to form the determination area by providing a configuration corresponding to the valve V10, the flow path 150, and the flow meter FS in at least one area, and it is possible to define the other areas as the adsorption areas.

It is desirable that the determination area is not adjacent to the adsorption area and there are one or more areas between these areas. If the determination area is adjacent to the adsorption area, even if the adsorption of the substrate W fails, a part of the membrane 13 corresponding to the adsorption area is drawn up, and accordingly a part corresponding to the determination area may also be drawn up. In this case, the flow volume of fluid flowing through the determination area decreases and erroneous determination may occur.

(Fourth Embodiment)

In the third embodiment described above, the flow volume of fluid flowing through the determination area 131 is directly measured by the flow meter FS. However, another physical amount may be measured by using a measuring instrument whose measurement value varies according to the flow volume. Therefore, in a fourth embodiment described below, an example in which a pressure gauge is used instead of the flow meter FS will be described.

Figure 22:
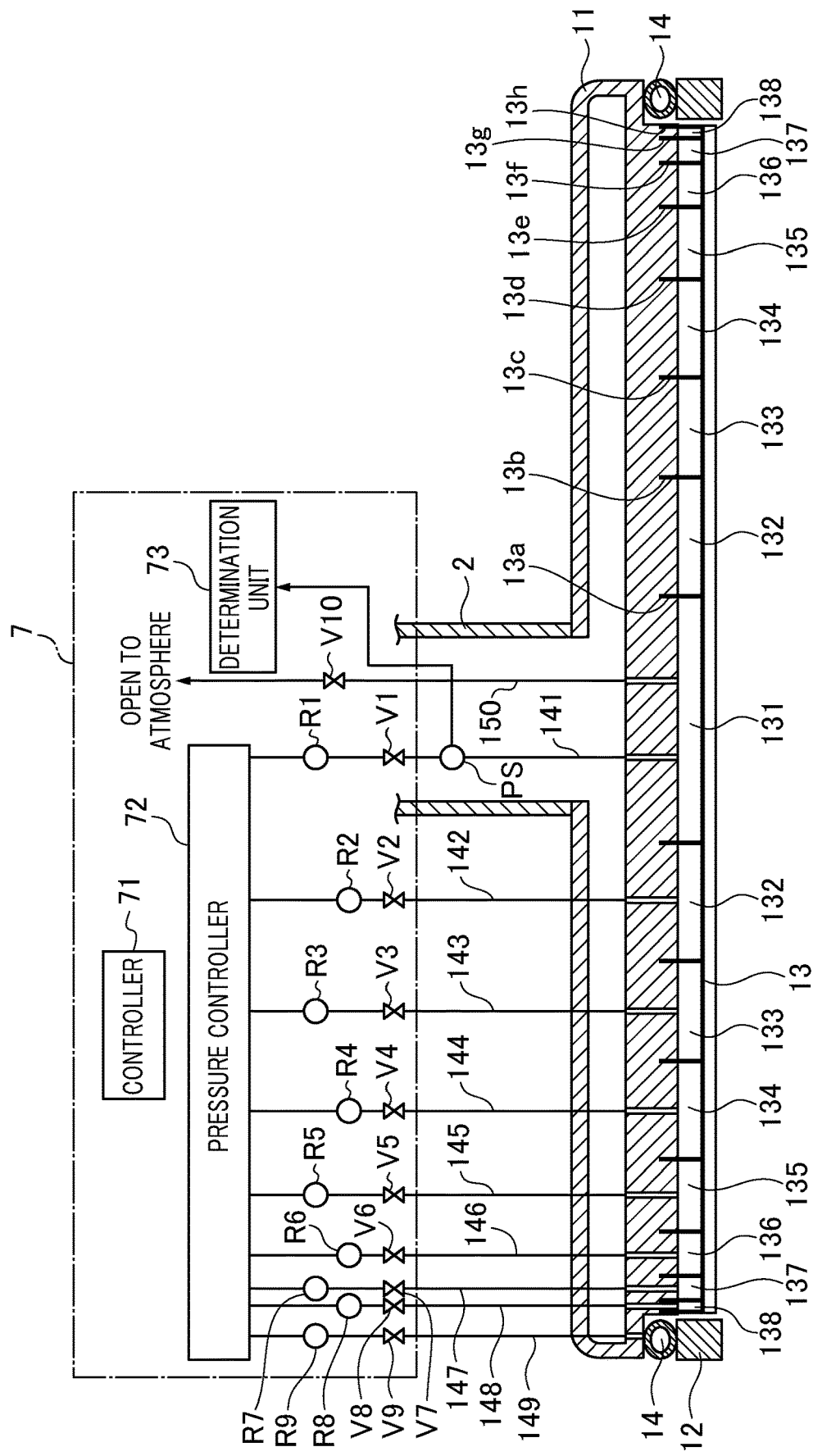
FIG. 22 is a cross-sectional view schematically showing a structure of the top ring 1 in a fourth embodiment.

FIG. 22 is a cross-sectional view schematically showing a structure of the top ring 1 in the fourth embodiment. Different from FIG. 14A, a pressure gauge PS is provided in the flow path 141 that communicates with the determination area 131. The pressure gauge PS measures the pressure of the flow path 141 and notifies the determination unit 73 of the measurement result. The pressure measured by the pressure gauge PS corresponds to the flow volume of fluid flowing through the determination area 131.

Figure 23:
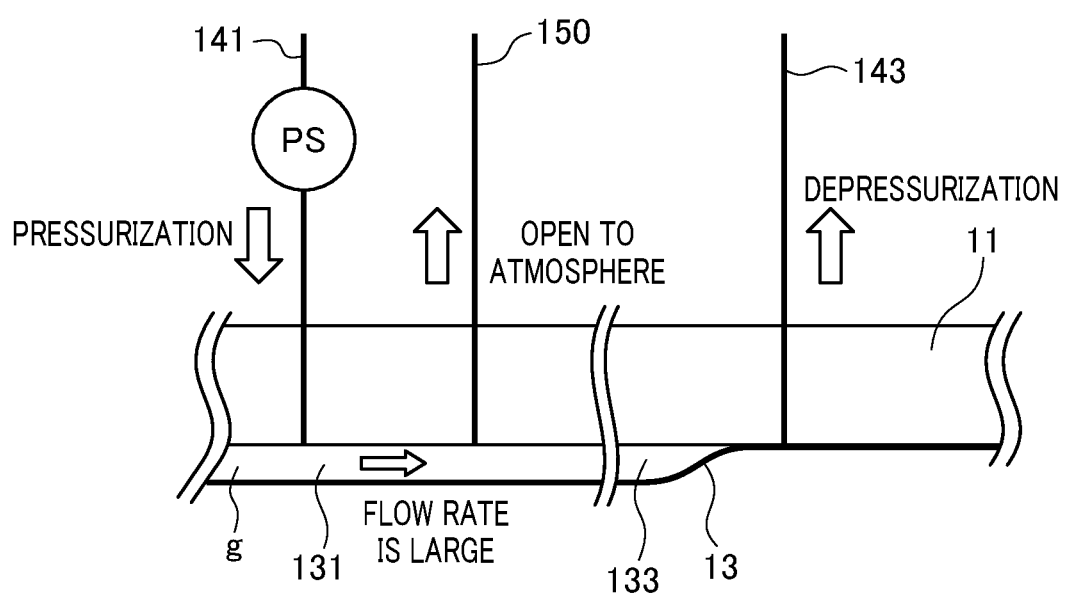
FIG. 23 is a diagram schematically showing cross sections of the membrane 13 and the top ring body 11 when adsorption fails.

FIG. 23 is a diagram schematically showing cross sections of the membrane 13 and the top ring body 11 when the adsorption fails. FIG. 23 corresponds to FIG. 19. As shown in FIG. 23, there is a gap g between the determination area 131 and the membrane 13. The flow volume of the determination area 131 is large. In this case, gas can easily flow from the flow path 141 to the determination area 131, so that the pressure in the flow path 141 is low. As a result, the measurement result of the pressure gauge PS is low.

Figure 24:
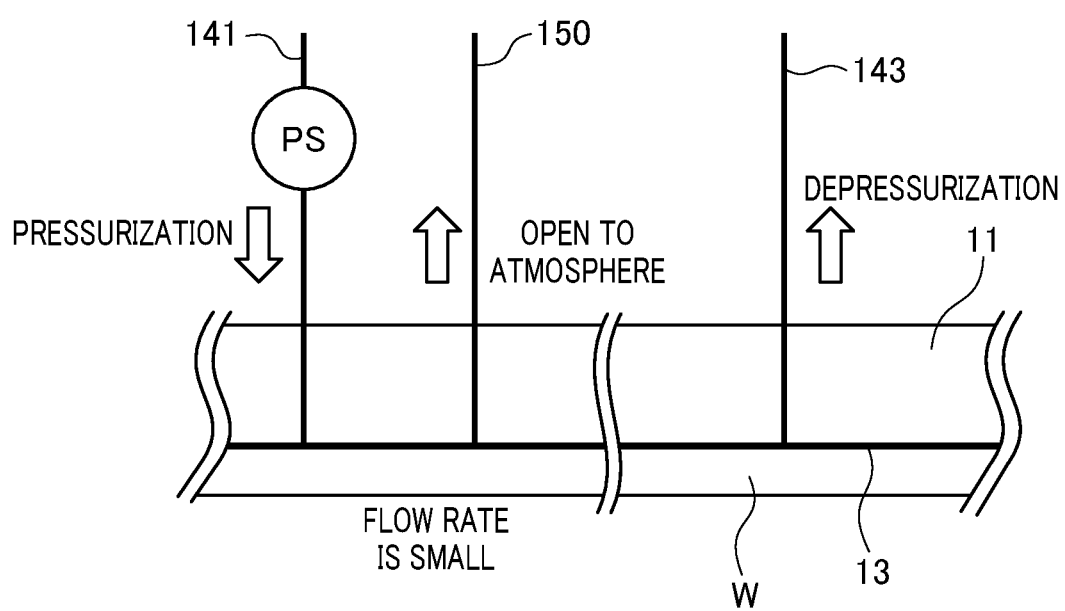
FIG. 24 is a diagram schematically showing cross sections of the substrate W, the membrane 13, and the top ring body 11 when adsorption succeeds.

FIG. 24 is a diagram schematically showing cross sections of the substrate W, the membrane 13, and the top ring body 11 when the adsorption succeeds. FIG. 24 corresponds to FIG. 20. As shown in FIG. 24, there is rarely a gap g between the determination area 131 and the membrane 13. The flow volume of the determination area 131 is small. In this case, gas cannot easily flow from the flow path 141 to the determination area 131, so that the pressure in the flow path 141 is high. As a result, the measurement result of the pressure gauge PS is high.

In this way, the pressure gauge PS corresponds to the flow volume. Therefore, it should be determined whether the pressure exceeds a threshold value instead of step S4 in FIG. 18 (whether the flow volume is smaller than or equal to the threshold value).

Figure 25:
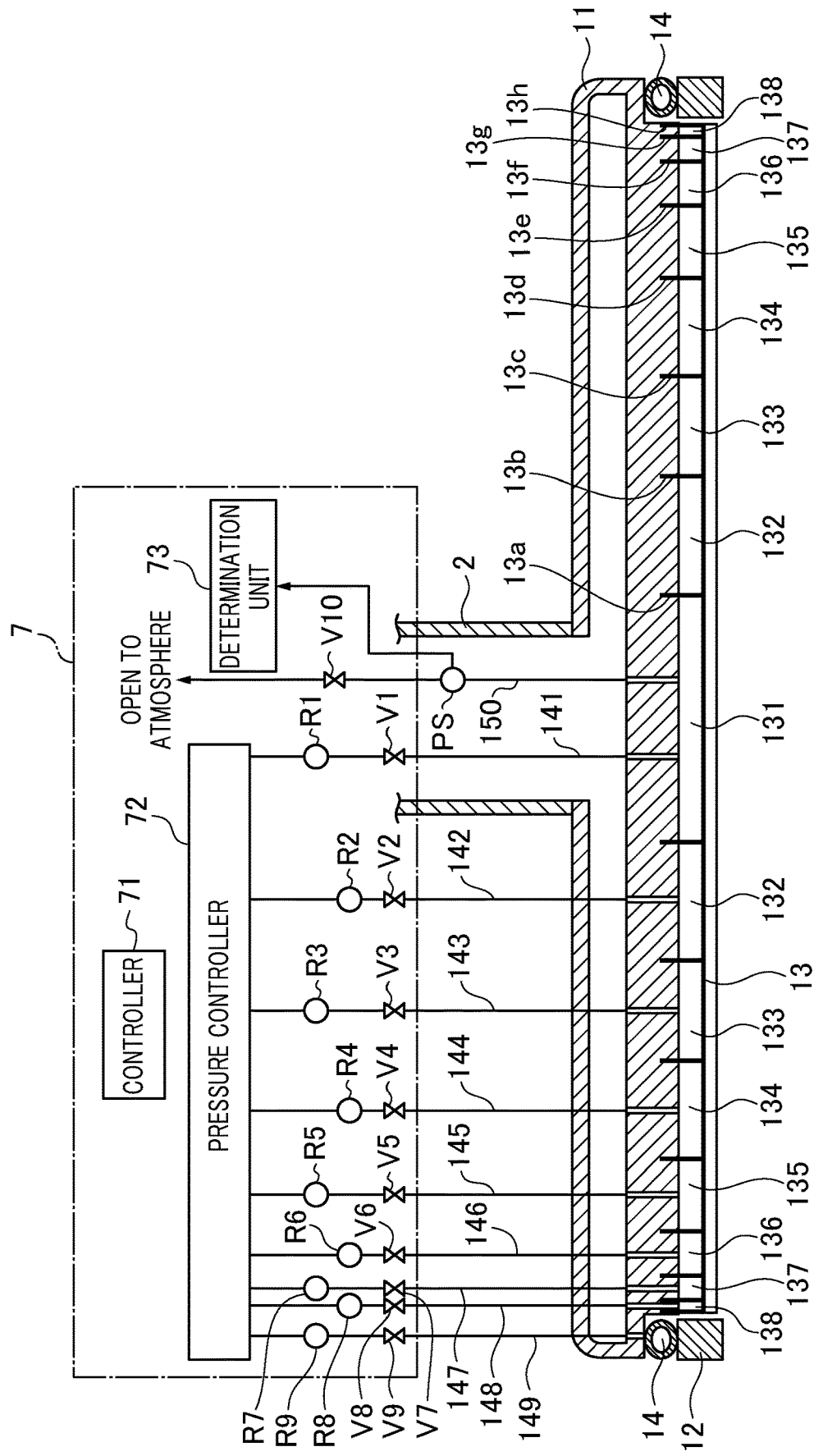
FIG. 25 is a cross-sectional view schematically showing a structure of the top ring 1 which is a modified example of FIG. 22.

FIG. 25 is a cross-sectional view schematically showing a structure of the top ring 1 which is a modified example of FIG. 22. Different from FIG. 22, the pressure gauge PS is provided in the flow path 150 that communicates with the determination area 131. The pressure gauge PS measures the pressure of the flow path 150 and notifies the determination unit 73 of the measurement result. The pressure measured by the pressure gauge PS corresponds to the flow volume of fluid flowing through the determination area 131.

Figure 26:
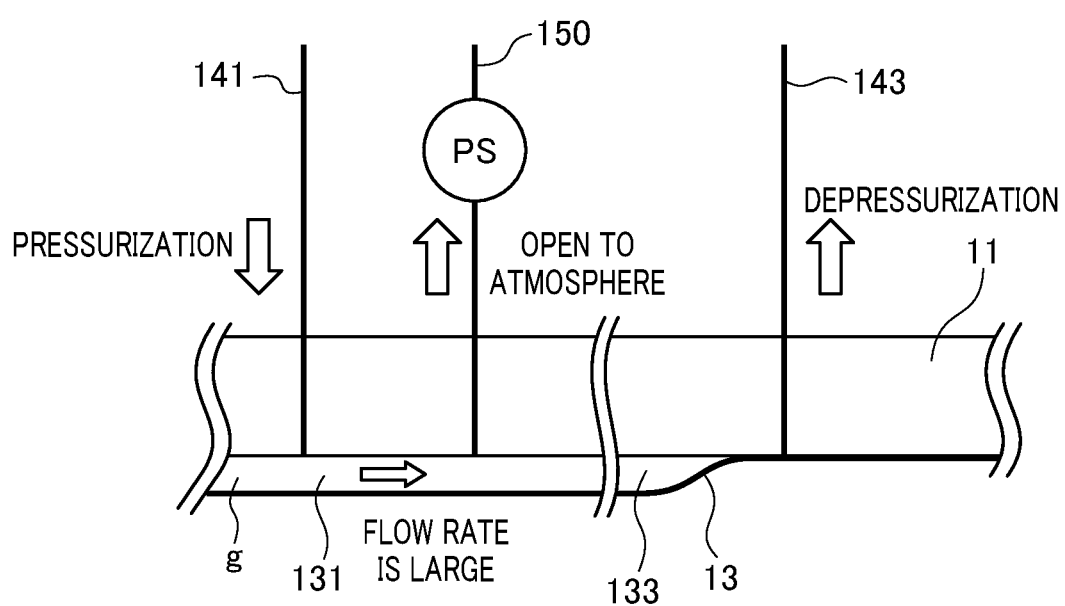
FIG. 26 is a diagram schematically showing cross sections of the membrane 13 and the top ring body 11 when adsorption fails.

FIG. 26 is a diagram schematically showing cross sections of the membrane 13 and the top ring body 11 when the adsorption fails. FIG. 26 corresponds to FIG. 19. As shown in FIG. 26, there is a gap g between the determination area 131 and the membrane 13. The flow volume of the determination area 131 is large. In this case, gas can easily flow from the determination area 131 to the flow path 150, so that the pressure in the flow path 150 is high. As a result, the measurement result of the pressure gauge PS is high.

Figure 27:
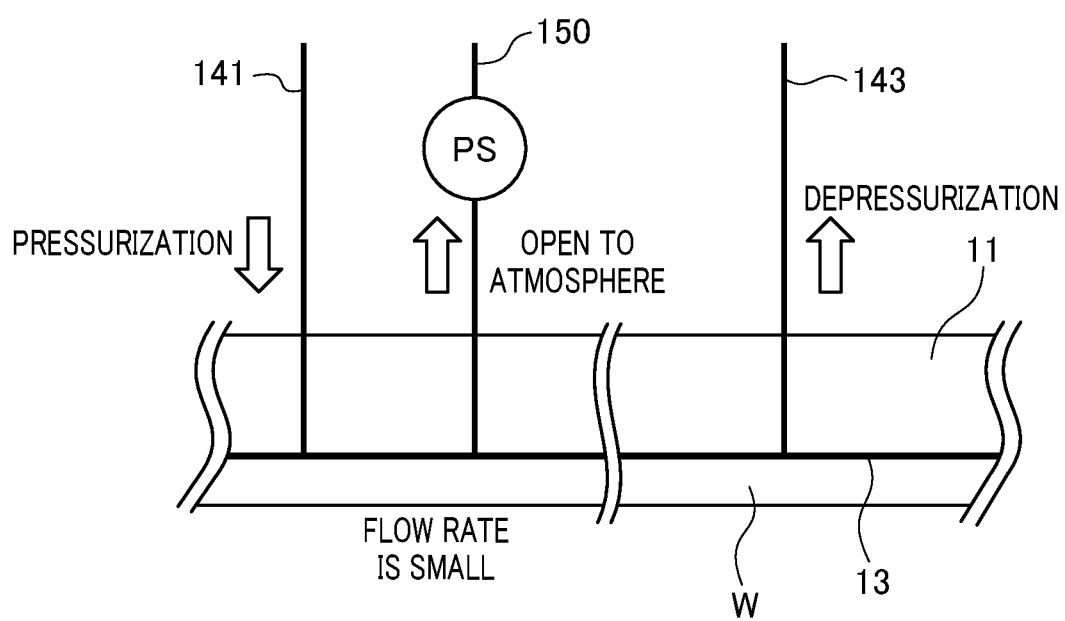
FIG. 27 is a diagram schematically showing cross sections of the substrate W, the membrane 13, and the top ring body 11 when adsorption succeeds.

FIG. 27 is a diagram schematically showing cross sections of the substrate W, the membrane 13, and the top ring body 11 when the adsorption succeeds. FIG. 27 corresponds to FIG. 20. As shown in FIG. 27, there is rarely a gap g between the determination area 131 and the membrane 13. The flow volume of the determination area 131 is small. In this case, gas cannot easily flow from the determination area 131 to the flow path 150, so that the pressure in the flow path 150 is low. As a result, the measurement result of the pressure gauge PS is low.

In this way, the pressure gauge PS corresponds to the flow volume. Therefore, it should be determined whether the pressure is greater than or equal to a threshold value instead of step S4 in FIG. 18 (whether the flow volume is smaller than or equal to the threshold value).

As described above, in the fourth embodiment, it is possible to accurately determine whether the adsorption of the substrate W succeeds by measuring the pressure that varies according to the flow volume.

(Fifth Embodiment)

A main object of a fifth embodiment is to reliably release the substrate adsorbed to the top ring. Hereinafter, differences from the third embodiment will be mainly described.

Figure 28A:
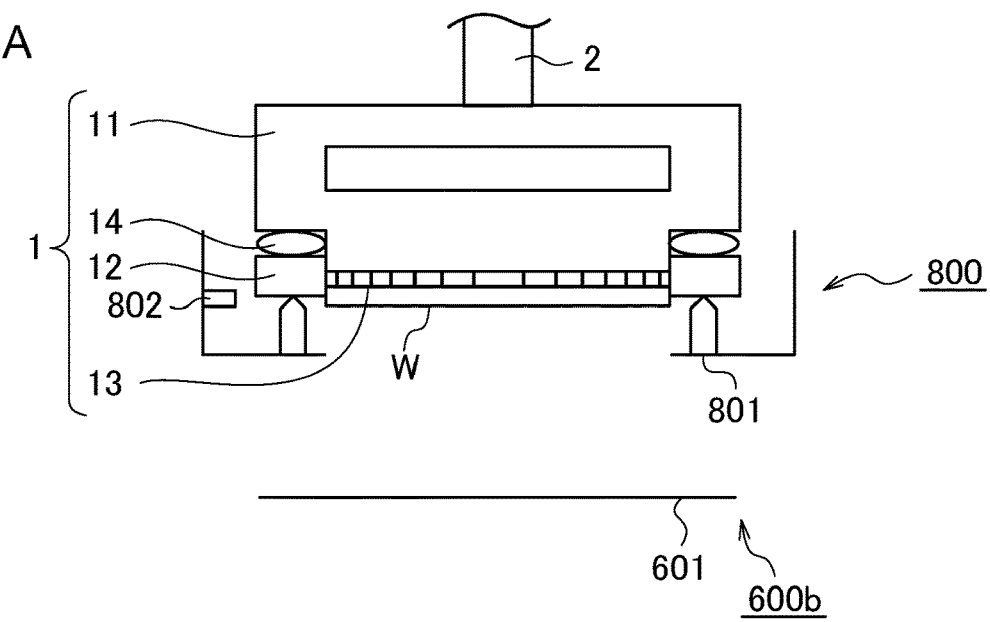
FIG. 28A is a diagram for explaining in detail transfer of a substrate from the top ring 1 to the transport mechanism 600b.
Figure 28B:
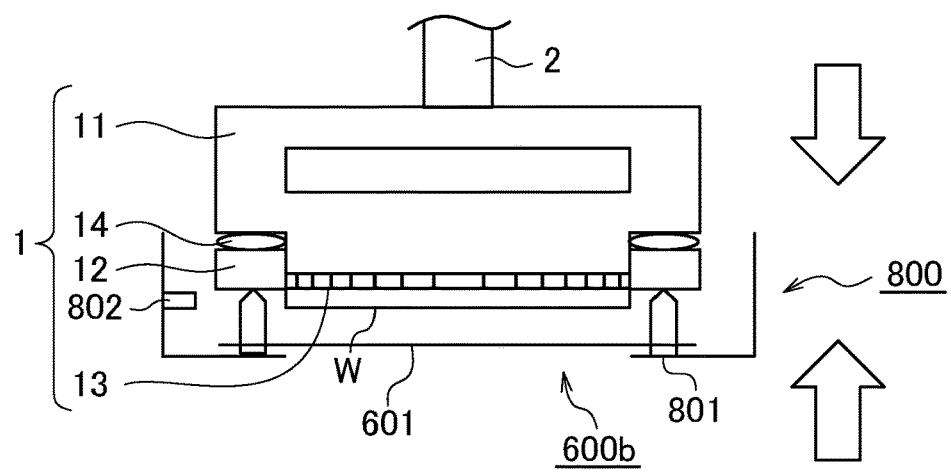
FIG. 28B is a diagram for explaining in detail transfer of the substrate from the top ring 1 to the transport mechanism 600b.
Figure 28C:
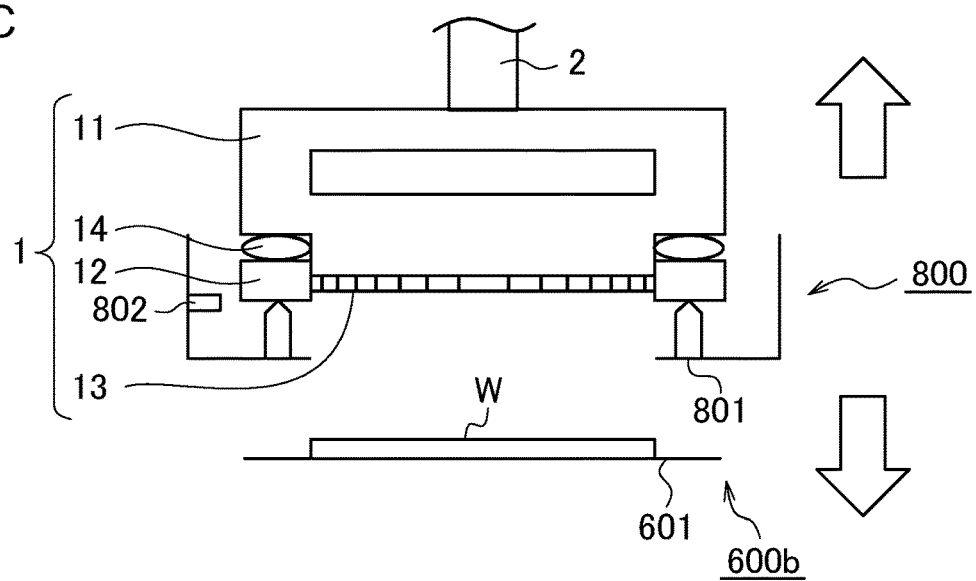
FIG. 28C is a diagram for explaining in detail transfer of the substrate from the top ring 1 to the transport mechanism 600b.
Figure 29:
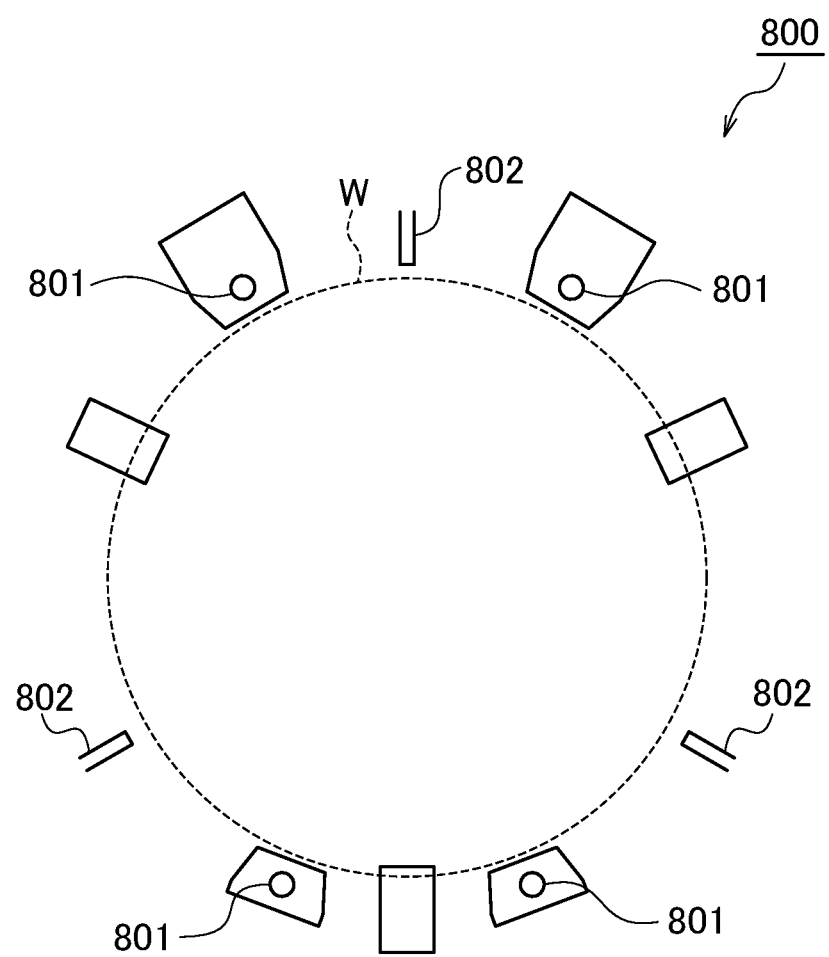
FIG. 29 is a diagram for explaining in detail transfer of the substrate from the top ring 1 to the transport mechanism 600b.

FIGS. 28A to 28C and 29 are diagrams for explaining in detail the transfer of the substrate from the top ring 1 to the transport mechanism 600b. FIGS. 28A to 28C are diagrams of the transport mechanism 600b and the top ring 1 as seen from side and FIG. 29 is a diagram of the top ring 1 and the retainer ring station 800 as seen from above (the transport mechanism 600b in FIG. 28 is omitted). As shown in these figures, the retainer ring station 800 has, for example, three release nozzles 802 facing inside (facing the substrate W).

FIG. 28A shows a state in which the substrate W is adsorbed to the membrane 13. At this time, fluid (release shower) is not jetted from the release nozzles 802.

As shown in FIG. 28B, the top ring 1 moves downward and the transport mechanism 600b moves upward. Thereby, the hand 601 of the transport mechanism 600b approaches the lower surface of the substrate W. However, the hand 601 does not come into contact with the lower surface. Further, the push-up pin 801 pushes up the retainer ring 12.

In this state, an area (hereinafter assumed as the area 133) between the membrane 13 and the top ring body 11 is pressurized. Further, a fluid such as air is jetted from the release nozzles 802. Thereby, the substrate W is released from the membrane 13 and is mounted on the hand 601. Details of this point will be described later.

Thereafter, as shown in FIG. 28C, the hand 601 on which the substrate W is mounted moves downward and the top ring 1 moves upward.

The release in FIG. 28B will be described in detail.

Figure 30:
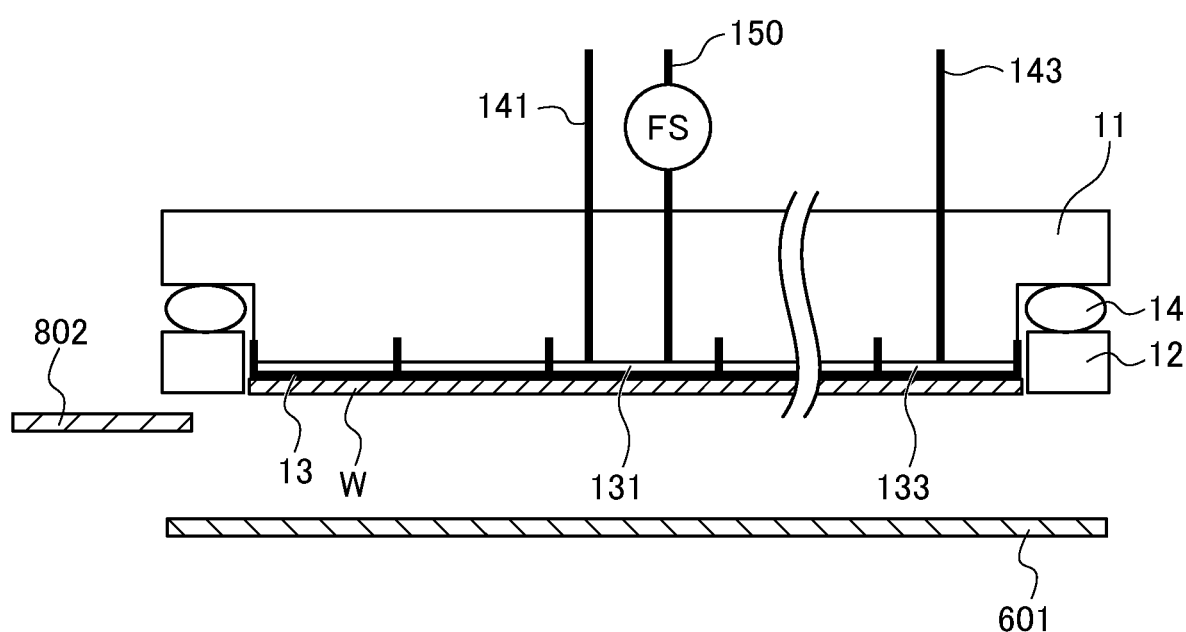
FIG. 30 is a diagram schematically showing a state before starting release.

FIG. 30 is a diagram schematically showing a state before starting the release. Before starting the pressurization of the area 133, the substrate W is adsorbed to the membrane 13, so that there is hardly a gap g between the upper surface of the membrane 13 and the lower surface of the top ring body 11. Before starting the pressurization, no fluid is jetted from the release nozzles 802.

Figure 31:
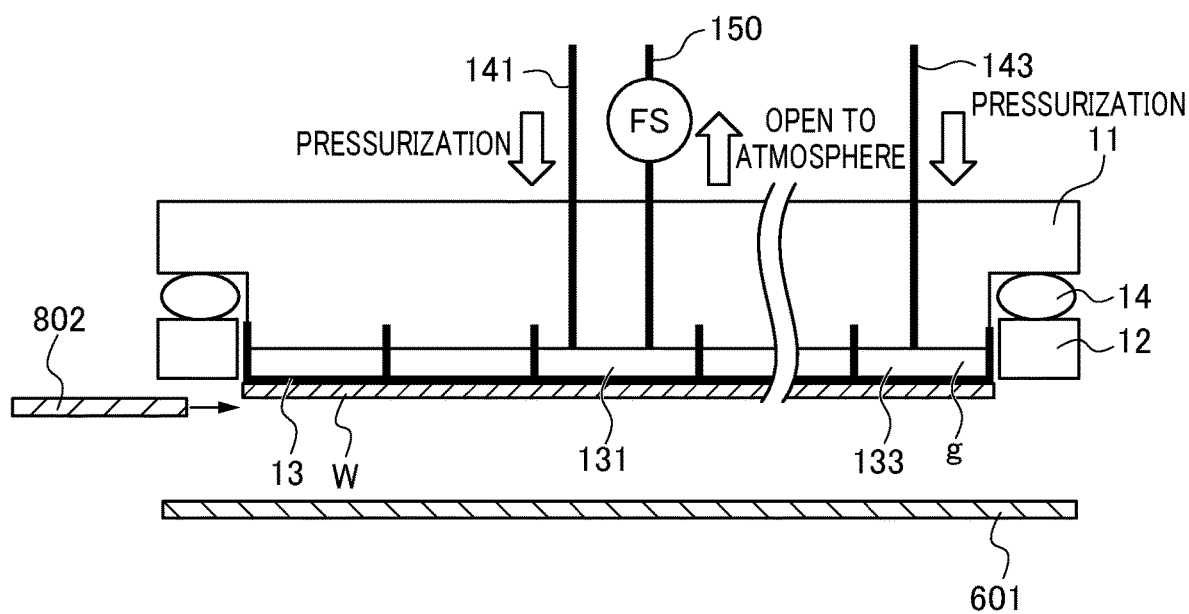
FIG. 31 is a diagram schematically showing a state after starting release.

FIG. 31 is a diagram schematically showing a state after starting the release. When starting the pressurization of the area 133, the membrane 13 swells and the gap g between the upper surface of the membrane 13 and the top ring body 11 gradually increases. In other words, the membrane 13 moves downward. In this state, a fluid is jetted from the release nozzles 802. However, the fluid hits the lower side of the substrate W and rarely hits the membrane 13. That is to say, FIG. 31 shows a state in which the swell of the membrane 13 is insufficient, in other words, a state in which the gap g between the membrane 13 and the top ring body 11 is too small.

Figure 32:
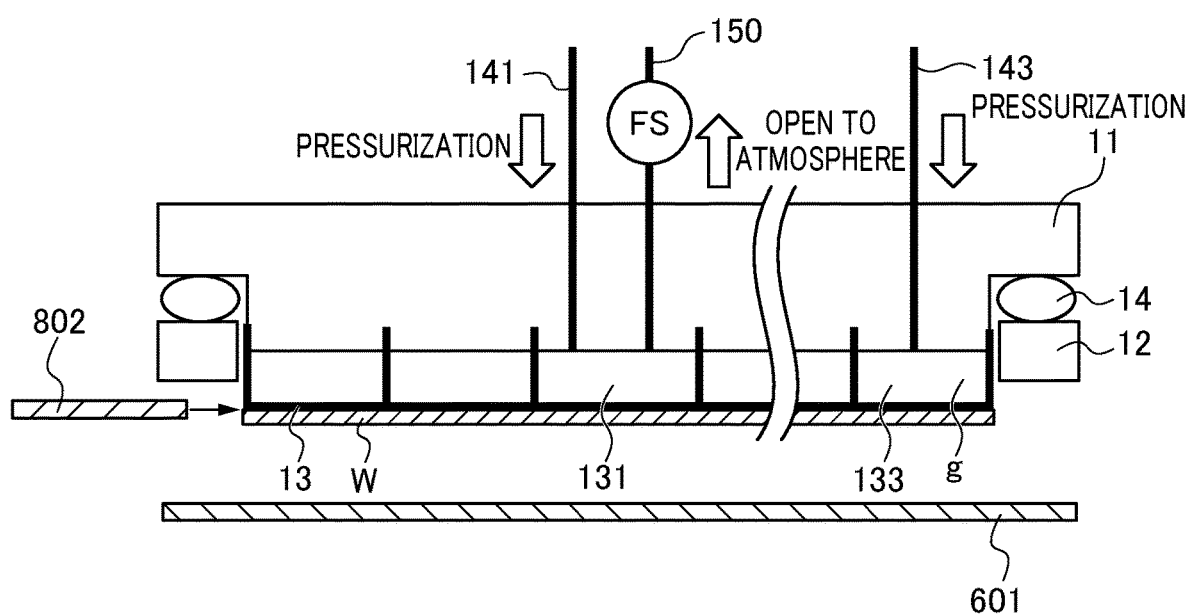
FIG. 32 is a diagram schematically showing a state after starting release following FIG. 33.
Figure 33:
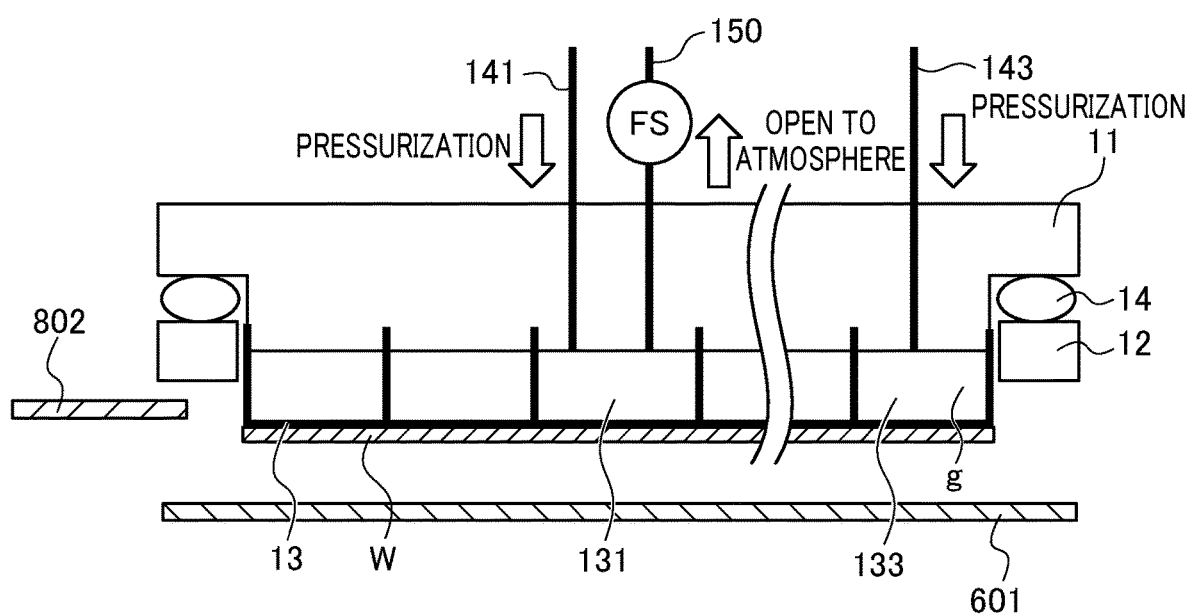
FIG. 33 is a diagram schematically showing a state after starting release following FIG. 32.

FIG. 32 is a diagram schematically showing a state after starting the release following FIG. 33. When further pressurizing the area 133, the membrane 13 further swells and the gap g between the upper surface of the membrane 13 and the top ring body 11 further increases. In other words, the membrane 13 moves further downward. In this state, the fluid jetted from the release nozzles 802 hits near the boundary between the substrate W and the membrane 13. Therefore, the fluid flows into between the substrate W and the membrane 13.

As described above, a state continues in which the fluid is jetted from side into between the membrane 13 that swells to some extent and the substrate W, so that it is possible to effectively release the substrate W from the membrane 13. That is to say, FIG. 32 shows a state in which the swell of the membrane 13 is appropriate, in other words, a state in which the gap g between the membrane 13 and the top ring body 11 is appropriate.

However, it is not necessarily possible to continue the state of FIG. 32.

FIG. 33 is a diagram schematically showing a state after starting the release following FIG. 32. When further pressurizing the area 133, the membrane 13 further swells and the gap g between the upper surface of the membrane 13 and the top ring body 11 further increases. In other words, the membrane 13 moves further downward. In this state, the fluid jetted from the release nozzles 802 hits the membrane 13, but hardly hits the substrate W. That is to say, FIG. 33 shows a state in which the swell of the membrane 13 is too large, in other words, a state in which the gap g between the membrane 13 and the top ring body 11 is too large.

As described above, to reliably release the substrate W, it is necessary to control the swell of the membrane 13 (in other words, the gap g between the membrane 13 and the top ring body 11). Therefore, in the present embodiment, to maintain a state in which the swell of the membrane 13 is appropriate as shown in FIG. 32, the pressure control of the area 133 is performed as described below.

Figure 34:
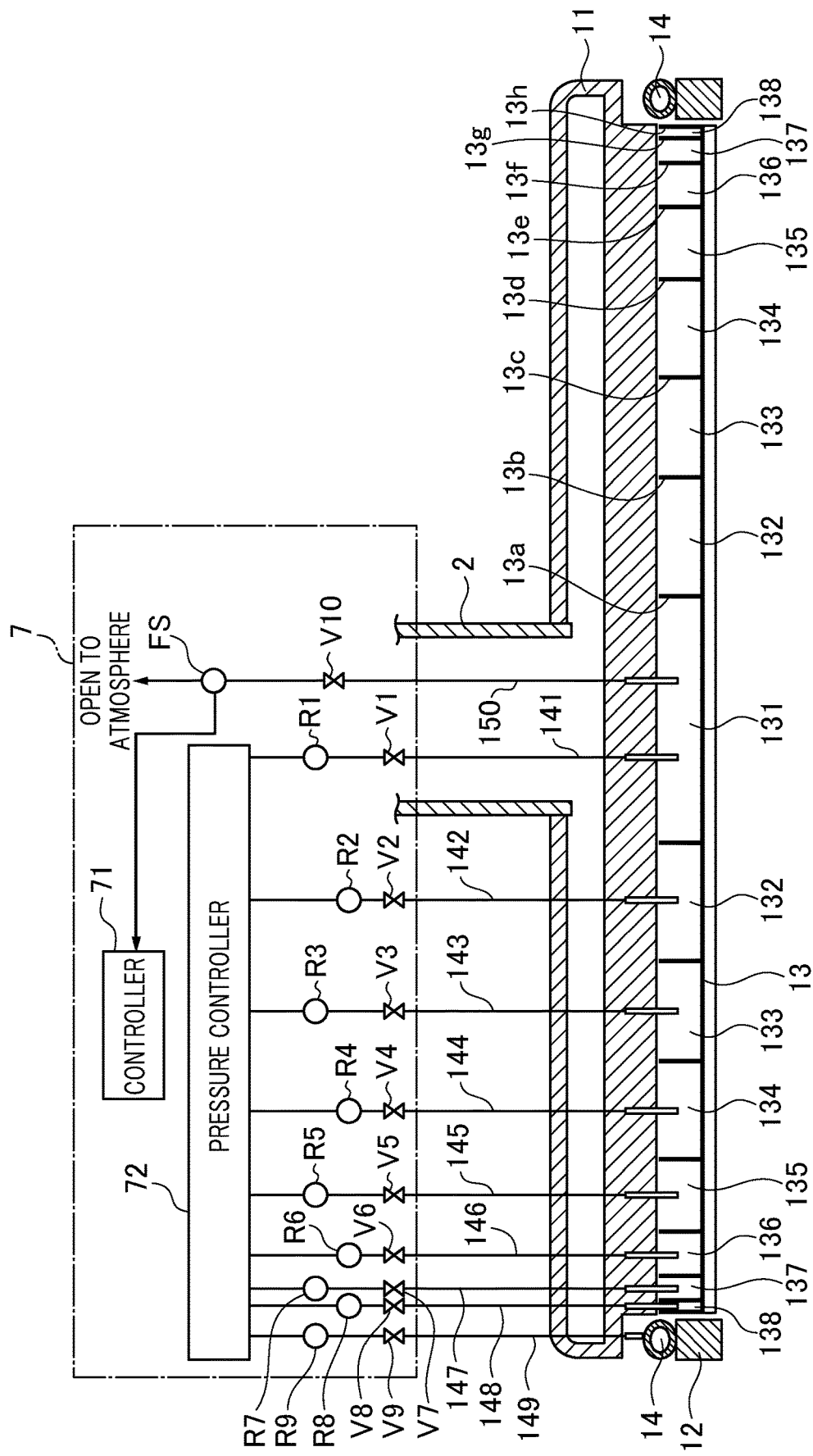
FIG. 34 is a cross-sectional view schematically showing a structure of the top ring 1 in a fifth embodiment.

FIG. 34 is a cross-sectional view schematically showing a structure of the top ring 1 in the fifth embodiment. Different from FIG. 33, a measurement value of the flow meter FS is inputted into the controller 71. Then, the controller 71 controls the pressure adjustor 72, the valves V1 to V9, and the pressure regulators R1 to R9 based on the measurement value of the flow meter FS.

When releasing, the controller 71 opens the valve V10 to open the area 131 to the atmosphere while opening the valve V1 to somewhat pressurize the area 131. As described in the third embodiment, the flow volume measured by the flow meter FS corresponds to the size of the gap g between the membrane 13 and the top ring body 11. The size of the gap g corresponds to the swell of the membrane 13. Therefore, the controller 71 appropriately controls the pressure of the area 133 by monitoring the flow volume.

Figure 35:
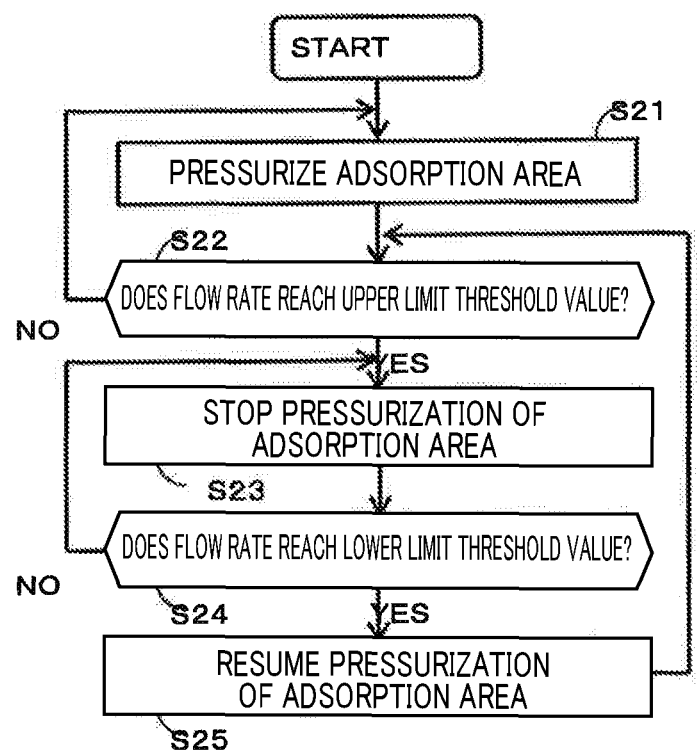
FIG. 35 is a flowchart showing an operation of the top ring 1 during release.
Figure 36:
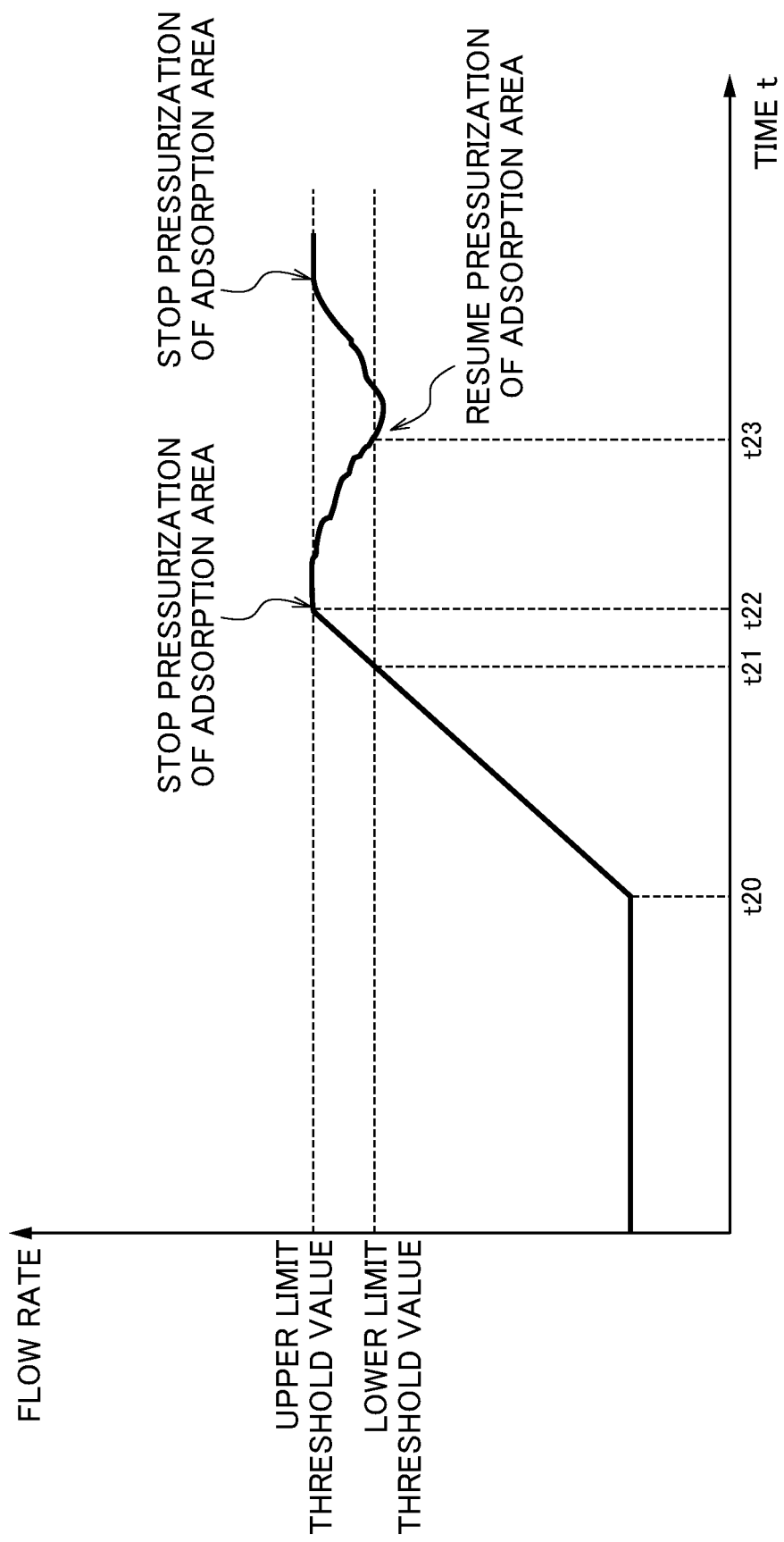
FIG. 36 is a diagram schematically showing a flow volume measured by the flow meter FS during release.

FIG. 35 is a flowchart showing an operation of the top ring 1 during the release. FIG. 36 is a diagram schematically showing a flow volume measured by the flow meter FS during the release. The controller 71 controls the pressure of the area 133 so that the flow volume is within a predetermined range between an upper limit threshold value and a lower limit threshold value by operating as described below. As shown in FIG. 32, the fact that the flow volume is within a predetermined range corresponds to the fact that the swell of the membrane 13 is appropriate. In other words, a range of the flow volume where the swell of the membrane 13 is appropriate is set as the predetermined range.

First, the controller 71 starts pressurization of the adsorption area 133 (step S21 in FIG. 35 and time point t20 in FIG. 36). Accordingly, the flow volume increases. However, the controller 71 continues the pressurization of the adsorption area 133 until the flow volume reaches the upper limit threshold value (NO in step S22, and S21). The pressurization is performed by continuously or intermittently supplying air to the area 133. During this period, the membrane 13 gradually swells, and accordingly the flow volume increases (see FIG. 36). After a time point t21 at which the flow volume reaches the lower limit threshold value (that is, the swell of the membrane 13 becomes appropriate), it is possible to jet fluid from the release nozzles 802 into between the substrate W and the membrane 13.

When the flow volume reaches the upper limit threshold value (time point t22 and YES in step S22 in FIG. 35), the controller 71 determines that the swell of the membrane 13 is sufficient and stops the pressurization of the adsorption area 133 (step S23). Specifically, the controller 71 may stop air supply to the adsorption area 133, may close the valve V3, or may open the area 133 to the atmosphere. Alternatively, the controller 71 may depressurize the adsorption area 133.

When the pressurization of the adsorption area 133 is stopped, the swell of the membrane 13 decreases, and accordingly the flow volume may decrease. Therefore, although the controller 71 stops the pressurization of the adsorption area 133 until the flow volume reaches the lower limit threshold value (NO in step S24, and S23), when the flow volume reaches the lower limit threshold value (YES in step S24 and time point t23 in FIG. 36), the controller 71 determines that the swell of the membrane 13 is insufficient and resumes the pressurization of the adsorption area 133 (step S25).

By repeating the above operation, the flow volume is within a predetermined range, so that the swell of the membrane 13 becomes appropriate and it is possible to continue jetting fluid into between the substrate W and the membrane 13 as shown in FIG. 32.

The release operation shown in FIG. 35 may be continued for a predetermined time or the release operation may be ended when a release detection sensor (not shown in the drawings) detects that the substrate W is released. The release detection sensor can be formed by, for example, a light emitting portion and a light receiving portion which are fixed to the retainer ring station 800.

As another method of estimating the swell of the membrane 13, it can be considered that the swell of the membrane 13 is estimated from an integrated amount of air supplied to the adsorption area 133. However, the air not only flows into the adsorption area 133, but also flows into the halfway flow path 143, a pipe of a rotary joint (not shown in the drawings), and the like. Therefore, it is difficult to accurately estimate the swell of the membrane 13 from the integrated amount of air.

On the other hand, in the present embodiment, the flow volume of the determination area 131, that is, the volume of air flowing per unit time, is used. The flow volume corresponds to the size of the gap g between the membrane 13 and the top ring body 11, and the gap g corresponds to the swell of the membrane 13. Therefore, it is possible to accurately detect the swell of the membrane 13, so that it is possible to accurately adjust the pressure of the adsorption area 133 so as to maintain an appropriate swell.

In FIGS. 28A to 33, an example in which the release nozzles 802 are attached to the retainer ring station 800 is shown. The retainer ring station 800 does not move, so that the release nozzles 802 are also fixed. As another example, when transferring the substrate W by using a so-called pusher instead of the retainer ring station 800, the release nozzles may be attached to the pusher.

Figure 37:
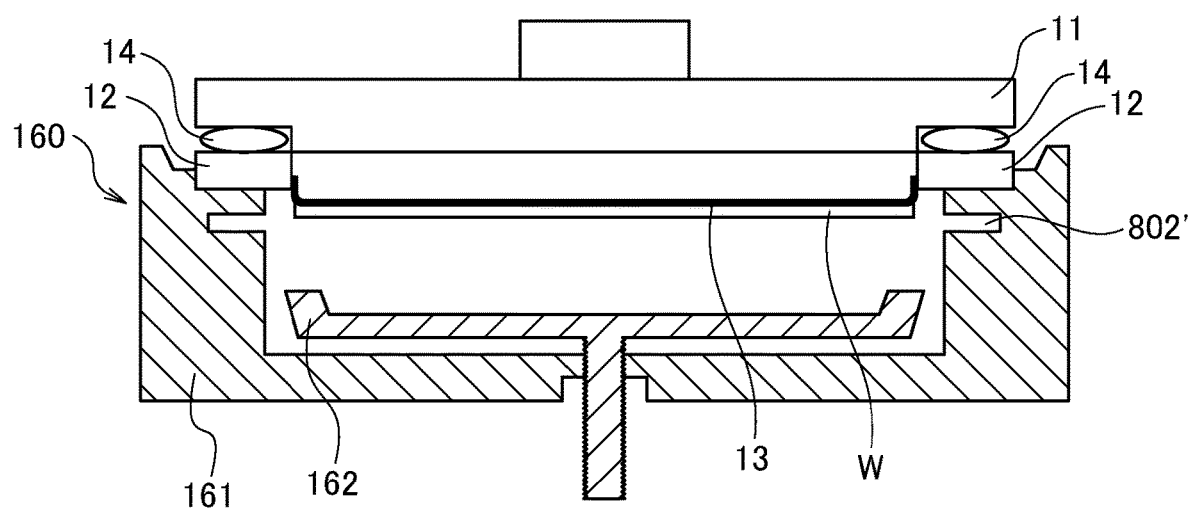
FIG. 37 is a side view schematically showing an operation in which the substrate W is released from the top ring 1 and transferred to a pusher 160.

FIG. 37 is a side view schematically showing an operation in which the substrate W is released from the top ring 1 and transferred to a pusher 160. The pusher 160 includes a top ring guide 161, a pusher stage 162, and release nozzles 802' formed inside the top ring guide 161. When releasing the substrate W, the pusher 160 moves up and approaches the top ring 1. The other operations are the same as those in a case in which the retainer ring station 800 is used. When the pusher 160 is used, the release nozzles 802' move along with the pusher 160.

Also in the fifth embodiment, a pressure gage may be installed in the flow path 141 or the flow path 150 and a pressure corresponding to the flow volume of the determination area 131 may be measured. In this case, the "flow volume" in FIG. 36 may be replaced with the "pressure".

(Sixth Embodiment)

A sixth embodiment described below relates to a desired shape of the membrane 13.

Figure 38:
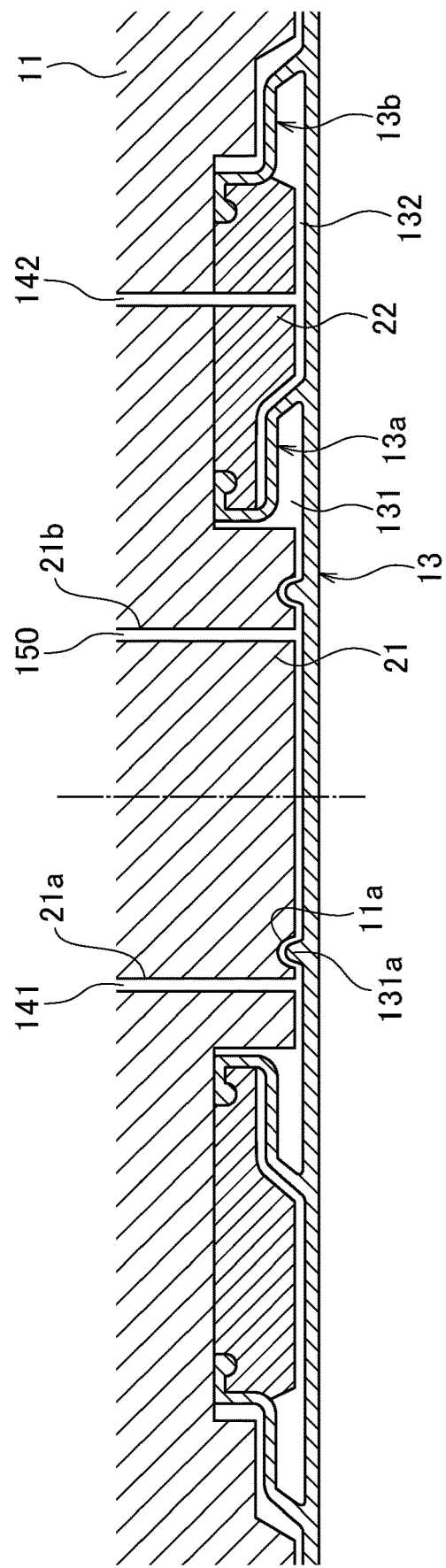
FIG. 38 is a cross-sectional view of the top ring body 11 and the membrane 13 near an area 131.
Figure 39:
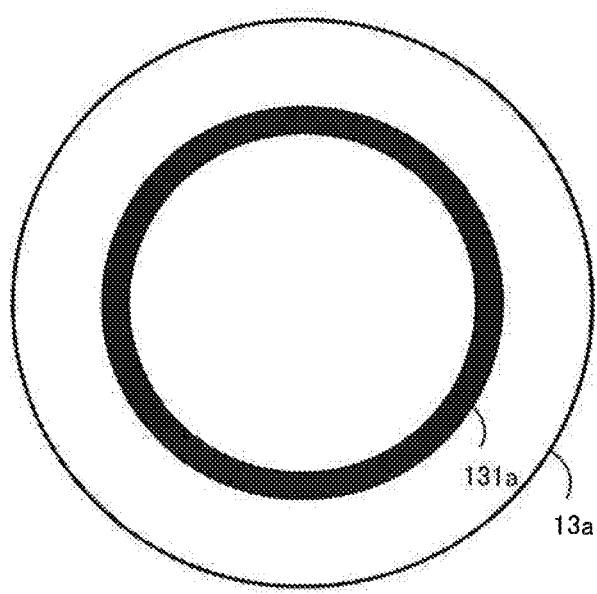
FIG. 39 is a view of the membrane 13 near an area 131 as seen from above.
Figure 40:
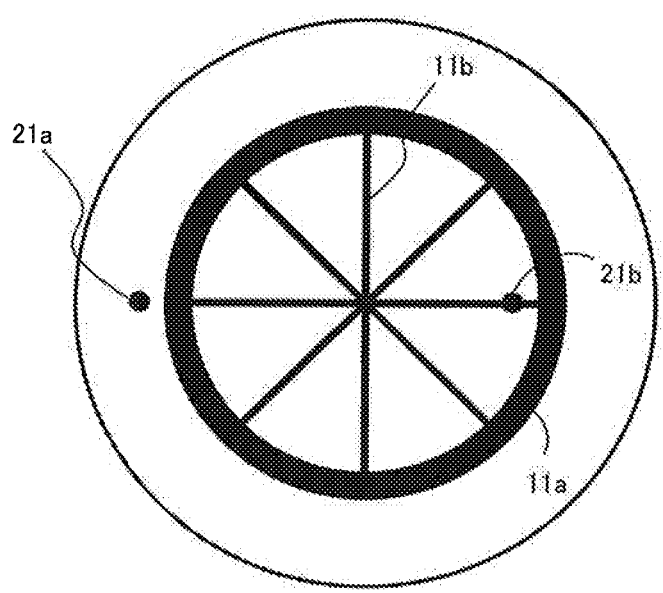
FIG. 40 is a view of the top ring body 11 near an area 131 as seen from below.

FIG. 38 is a cross-sectional view of the top ring body 11 and the membrane 13 near the area 131. The dashed-dotted line in FIG. 38 indicates the center of the top ring body 11 and the membrane 13. FIG. 39 is a view of the membrane 13 near the area 131 as seen from above (from the top ring body 11). FIG. 40 is a view of the top ring body 11 near an area 131 as seen from below (from the membrane 13).

As shown in FIGS. 38 and 39, a ring-shaped convex portion 131a facing the top ring body 11 is formed in a portion corresponding to the area 131 on the upper surface of the membrane 13.

Further, as shown in FIGS. 38 and 40, a ring-shaped concave portion 11a is formed in a portion corresponding to the area 131 in the top ring body 11. A hole 21a (first hole) of the top ring body 11, which communicates with the flow path 141, is located outside the concave portion 11a. A hole 21b (second hole) of the top ring body 11, which communicates with the flow path 150, is located inside the concave portion 11a.

The convex portion 131a of the membrane 13 is located at a position facing the concave portion 11a of the top ring body 11. The convex portion 131a and the concave portion 11a can be engaged with each other.

When the top ring 1 does not hold the substrate, there is a gap between the convex portion 131a of the membrane 13 and the concave portion 11a of the top ring body 11. On the other hand, when the top ring 1 adsorbs and holds the substrate, the gap disappears or at least decreases. That is to say, the convex portion 131a and the concave portion 11a can be called a seal portion that seals the area 131.

As shown in FIG. 40, the top ring body 11 is provided with a plurality of grooves 11b extending radially. Thereby, the pressure propagates easily in the area 131, so that it is possible to equalize the pressure. In FIG. 40, the grooves 11b are provided inside the concave portion 11a. However, the grooves 11b may be provided outside the concave portion 11a. Or by providing the grooves 11b in other areas such as the area 132, the pressure easily propagates in the entire top ring.

The depth of the concave portion 11a is set to equal to or deeper than that of the grooves 11b and the height of the convex portion 131a is set so that the convex portion 131a can come into contact with the concave portion 11a, so that even when the grooves 11b and the concave portion 11a interfere with each other, sealing is possible by the concave portion 11a and the convex portion 131a.

Figure 41:
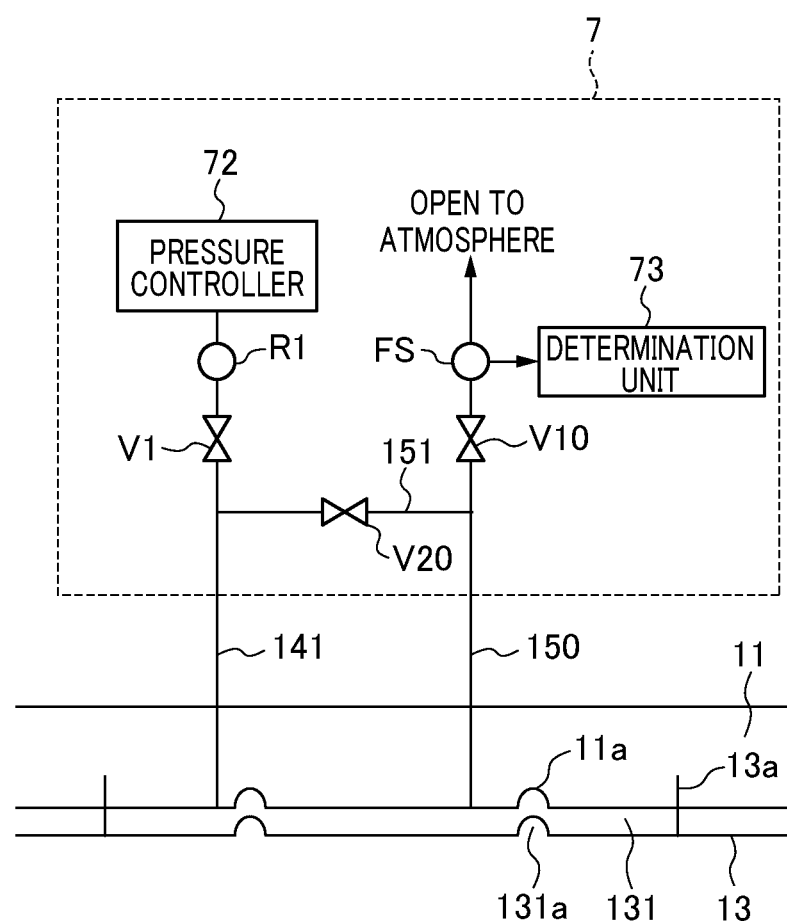
FIG. 41 is a diagram showing a configuration example of a pressure control apparatus 7 in a case in which substrate adsorption determination is performed by using the flow meter FS.

FIG. 41 is a diagram showing a configuration example of the pressure control apparatus 7 in a case in which the substrate adsorption determination is performed by using the flow meter FS as described in the third embodiment. In the same manner as in FIG. 14A, the flow paths 141 and 150 are connected to the top ring body 11 through, for example, a rotary joint (not shown in the drawings). Different from FIG. 14A, the pressure control apparatus 7 includes a bypass line (a bypass flow path) 151 and a valve 20. The bypass line 151 bypasses the flow path 141 and flow path 150. The valve V20 is provided on the bypass line 151. The pressure control apparatus 7 can control the pressure of (for example, pressurize) the area 131 from the flow path 150 through the hole 21b by opening the valve V20.

In the adsorption determination in the third embodiment described above, the determination area 131 is pressurized through the flow path 141 and is opened to the atmosphere through the flow path 150. Further, the determination area 131 is pressurized during the polishing. These pressurizations will be described.

Figure 42:
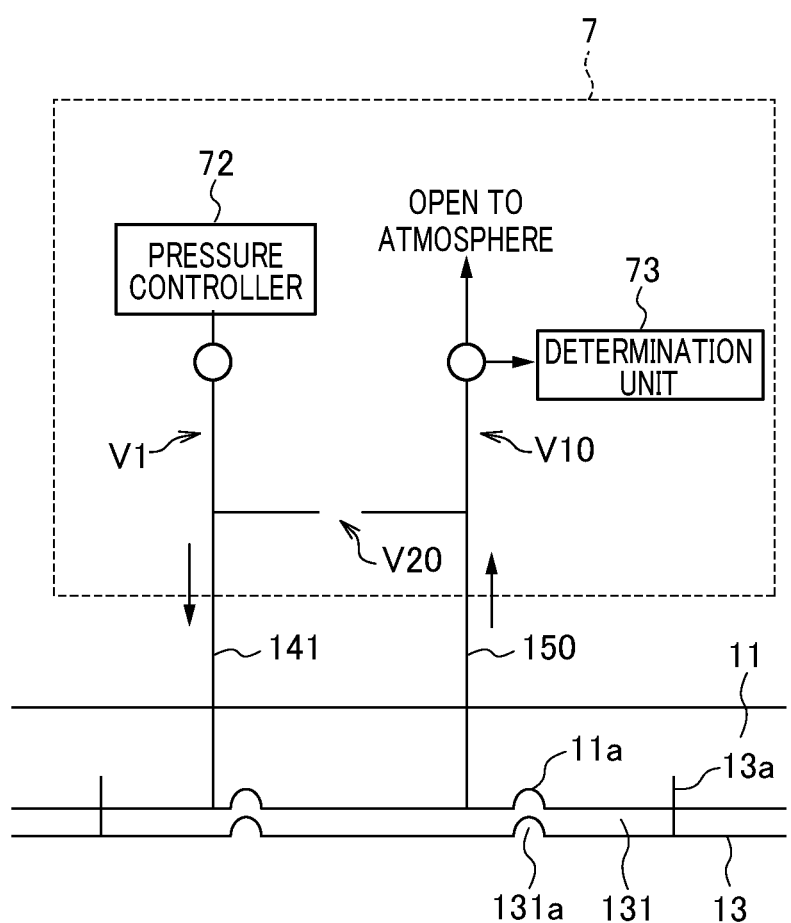
FIG. 42 is a diagram for explaining pressurization during the adsorption determination.

FIG. 42 is a diagram for explaining the pressurization during the adsorption determination. As shown in FIG. 42, the valves V1 and V10 are opened and the valve V20 is closed. Thereby, in the same manner as in the third embodiment, it is possible to pressurize the determination area 131 through the flow path 141 and open the determination area 131 to the atmosphere through the flow path 150.

Figure 43:
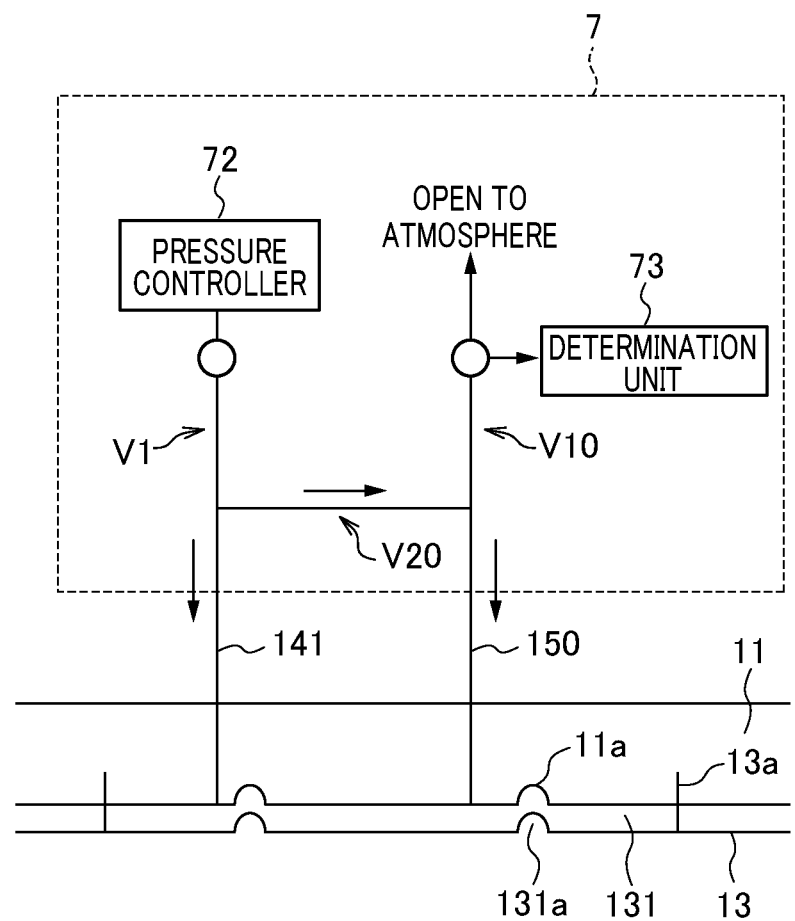
FIG. 43 is a diagram for explaining pressurization while polishing a substrate.

FIG. 43 is a diagram for explaining the pressurization while polishing the substrate. As shown in FIG. 43, the valves V1 and V20 are opened and the valve V10 is closed. Thereby, the area 131 is pressurized from both the flow paths 141 and 150 at the same time. Specifically, it is possible to pressurize the outside of the ring-shaped portion sealed by the concave portion 11a and the convex portion 131a from the flow path 141. Further, it is possible to pressurize the inside of the ring-shaped portion sealed by the concave portion 11a and the convex portion 131a from the flow path 150. In particular, the grooves 11b are provided as shown in FIG. 40, so that the pressure is propagated to the entire inside of the sealed ring-shaped portion.

Further, a pressurized pressure during the adsorption determination is applied from the outside of the sealed ring-shaped portion and the inside of the sealed ring-shaped portion is opened to the atmosphere. Therefore, a central portion of the substrate W is not pressurized, so that the substrate W is prevented from being deformed and stress is small.

The top ring body 11 and the membrane 13 as described above are used, so that it is possible to more accurately perform the adsorption determination described in the third embodiment.

Figure 44:
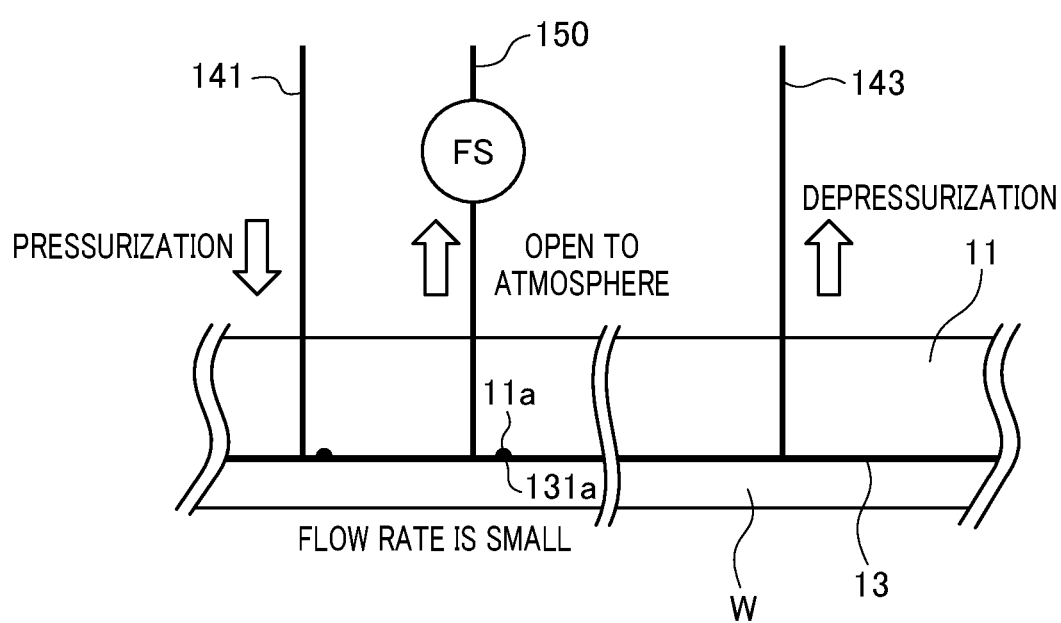
FIG. 44 is a diagram schematically showing cross sections of the substrate W, the membrane 13, and the top ring body 11 when adsorption succeeds.

FIG. 44 is a diagram schematically showing cross sections of the substrate W, the membrane 13, and the top ring body 11 when the adsorption succeeds. FIG. 44 corresponds to FIG. 20. As known from FIG. 44, when the substrate adsorption succeeds, the convex portion 131a of the membrane 13 engages with the concave portion 11a of the top ring body 11 and the gap between them almost disappears. As a result, the flow volume measured by the flow meter FS becomes very small and the accuracy of the determination improves.

As described above, in the sixth embodiment, the convex portion 131a is provided to the membrane 13 and the concave portion 11a is provided to the top ring body 11. Therefore, the convex portion 131a and the concave portion 11a form a seal portion and the membrane 13 is closely attached to the top ring body 11 when the substrate is adsorbed. Therefore, a difference between the flow volume when the substrate adsorption succeeds and the flow volume when the substrate adsorption fails is large, so that the accuracy of the substrate adsorption determination improves.

It is desirable to be able to realize a state that is completely sealed by the convex portion 131a and the concave portion 11a. However, a substantially sealed state may be formed by a certain portion of the membrane 13 and a certain portion of the top ring body 11.

Figure 45:
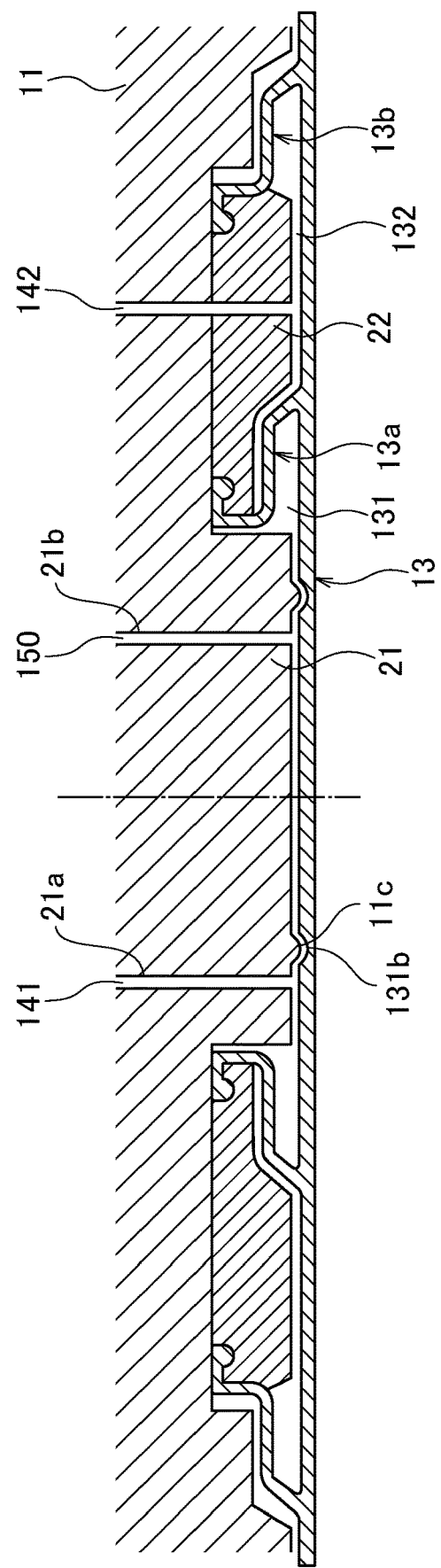
FIG. 45 is a cross-sectional view of the top ring body 11 and the membrane 13 which are a modified example of FIG. 38.

In the present embodiment, the convex portion 131a is provided to the membrane 13 and the concave portion 11a is provided to the top ring body 11. However, as the seal portion, a concave portion 131b may be provided to the membrane 13 and a convex portion 11c may be provided to the top ring body 11 (see FIG. 45). When an area other than the area 131 is used as the determination area, a concave portion and/or a convex portion may be provided to the determination area as a seal portion.

As described in the fourth embodiment, when the substrate adsorption determination is performed by using the pressure gauge PS, the pressure gauge PS may be is installed in the flow path 141 in the same manner as in FIG. 22.

The above embodiments are described in order for a person with an ordinary skill in the art to which the present invention pertains to implement the present invention. Various modified examples of the above embodiments can be naturally made by those skilled in the art and the technical idea of the present invention can be applied to other embodiments. A plurality of embodiments can be arbitrarily combined. Therefore, the present invention is not limited to the described embodiments and should have the greatest range according to the technical ideas defined by claims.

The invention claimed is:

1. A substrate holding apparatus comprising:
   a top ring body;
   an elastic film under the top ring body, a plurality of areas being concentrically formed between a top face of the elastic film and the top ring body;
   a pressure controller configured to vacuum at least one area among the plurality of areas under a state where a top face of a substrate whose bottom face is supported by a support member contacts a bottom face of the elastic film;
   a flow meter configured to measure a flow volume of gas in an area located outside one or more areas to be vacuumed; and
   a determiner configured to determine whether the substrate is adsorbed to the top ring based on the flow volume of the gas.

2. The apparatus according to claim 1, wherein a flow path on which the flow meter is provided is connected to the area located outside the one or more areas to be vacuumed, and the flow path is not branched between said area and the flow meter.

3. The apparatus according to claim 1, wherein no holes are formed on the elastic film at a position where the plurality of areas are formed.

4. A substrate polishing apparatus comprising:
   the substrate holding apparatus according to claim 1;
   a transfer mechanism configured to transfer the substrate to the substrate holding apparatus; and
   a polishing table configured to polish the substrate held by the substrate holding apparatus.

5. A substrate holding apparatus comprising:
   a top ring body;
   an elastic film comprising a first face and a second face opposite the first face, a plurality of areas being formed between the first face and the top ring body, the second face being capable of holding a substrate;
   a first line communicating with a first area among the plurality of areas and capable of pressuring the first area;
   a second line communicating with the first area and capable of exhausting the first area;
   a measurement instrument whose measurement value varies based on a flow volume of the first area;
   a third line communicating with a second area among the plurality of areas and different from the first area, the third line being capable of pressuring or depressurizing the second area; and
   a determiner configured to determine whether the substrate is adsorbed to the second face based on the measurement value when the first area is pressured.

6. The apparatus according to claim 5, wherein the measurement instrument is a flow meter capable of measuring a flow volume of the second line.

7. The apparatus according to claim 5, wherein the measurement instrument is a pressure gauge capable of measuring a pressure of the first line or the second line.

8. The apparatus according to claim 5 further comprising a controller configured to, when the substrate is adsorbed to the second face, depressurize the second area through the third line and pressure the first area through the first line and cause a fluid to flow through the second line;
  wherein the determiner determines whether the substrate is adsorbed to the second face based on the measurement value when the substrate is adsorbed to the second face.

9. The apparatus according to claim 8, wherein the determiner determines whether the substrate is adsorbed to the second face based on the measurement value measured by the measurement instrument after a first time from a start of depressurizing the second area.

10. The apparatus according to claim 5 further comprising a controller configured to control a pressure of the second area through the third line based on the measurement value.

11. The apparatus according to claim 10, wherein the controller controls the pressure of the second area so that the measurement value falls within a first range.

12. The apparatus according to claim 10, wherein the controller, when the substrate held by the second face is released, pressures the first area through the first line and make a fluid into the first area through the second line, and controls the second area through the third line based on the measurement value.

13. The apparatus according to claim 10, wherein the controller controls the pressure of the second area so that a fluid is injected to a first position from a release nozzle.

14. The apparatus according to claim 13, wherein the first position is between the second face and the substrate held by the second face of the elastic film.

15. The apparatus according to claim 5, wherein no holes are formed on the elastic film.

16. The apparatus according to claim 5, wherein the second area is not adjacent to the first area.

17. The apparatus according to claim 5 further comprising a retainer ring at an outer circumference of the elastic film.

18. The apparatus according to claim 17, wherein the retainer ring comprises an inner ring and an outer ring outside the inner ring.

19. A substrate polishing apparatus comprising:
the substrate holding apparatus according to claim 5; and
a polishing table configured to polish the substrate held by the substrate holding apparatus.

20. A substrate holding apparatus comprising:
a top ring body provided with a first hole at an outside of a first portion and a second hole at an inside of the first portion;
an elastic film comprising:
  a first face provided with a second portion capable of being engaged with the first portion, a plurality of areas being formed between the first face and the top ring body; and
  a second face opposite the first face, the second face being capable of holding a substrate;
a first line being capable of pressuring a first area through the first hole positioned at the first area among the plurality of areas;
a second line capable of depressurizing the first area through the second hole positioned at the first area;
a measurement instrument whose measurement value varies based on a flow volume of the first area;
a third line communicating with a second area among the plurality of areas and different from the first area, the third line being capable of pressuring or depressurizing the second area; and
a determiner configured to determine whether the substrate is adsorbed to the second face based on the measurement value when the first area is pressured.

21. The substrate holding apparatus according to claim 20, wherein a radially spreading groove is provided at a portion of the top ring body corresponding to the first area.

22. The substrate holding apparatus according to claim 20 further comprising:
a bypass line configured to connect the first line with the second line; and
a valve provided on the bypass line.

* * * * *